United States Patent
Gao et al.

(10) Patent No.: US 11,691,991 B2
(45) Date of Patent: Jul. 4, 2023

(54) COMPOUND, A DISPLAY PANEL AND A DISPLAY DEVICE

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventors: Wei Gao, Shanghai (CN); Wenpeng Dai, Shanghai (CN); Lei Zhang, Shanghai (CN); Quan Ran, Shanghai (CN); Jinghua Niu, Shanghai (CN); Xia Li, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 286 days.

(21) Appl. No.: 16/922,566

(22) Filed: Jul. 7, 2020

(65) Prior Publication Data
US 2021/0309675 A1    Oct. 7, 2021

(30) Foreign Application Priority Data
Mar. 31, 2020   (CN) .......................... 202010246087.6

(51) Int. Cl.
  C07F 5/02      (2006.01)
  C07F 7/08      (2006.01)
  H01L 51/00     (2006.01)
  H01L 51/50     (2006.01)

(52) U.S. Cl.
  CPC .............. *C07F 5/02* (2013.01); *C07F 7/0816* (2013.01); *H01L 51/006* (2013.01); *H01L 51/0072* (2013.01); *H01L 51/0094* (2013.01); *H01L 51/5012* (2013.01)

(58) Field of Classification Search
  CPC ...... C07F 5/02; C07F 7/0816; H01L 51/0059; H01L 51/006; H01L 51/0069; H01L 51/0071; H01L 51/0094
  See application file for complete search history.

(56) References Cited

FOREIGN PATENT DOCUMENTS

| CN | 107223122 A | * | 9/2017 | ........... C07D 307/94 |
| CN | 107223122 A |   | 9/2017 | |

* cited by examiner

*Primary Examiner* — Vu A Nguyen
(74) *Attorney, Agent, or Firm* — von Briesen & Roper, s.c.

(57) ABSTRACT

The present invention relates to a compound, a display panel and a display device. The compound has a structure represented by Formula I. The compound takes a spiro structure as a non-conjugated connecting unit, and a boron-containing group as an electron-accepting group. A light-emitting compound obtained by taking the group as a building block has a narrower half-peak width and higher color purity. The boron-containing spiro structure is connected with an electron-donating group to obtain a bipolar compound, and as a thermal activation delay fluorescence material, the bipolar compound can be used a light-emitting layer material, particularly a doped material, and can also be used as a fluorescent host material or a phosphorescent host material. The compound provided herein can achieve low drive voltages and high luminescence efficiencies when applied to organic electroluminescent devices.

17 Claims, 2 Drawing Sheets

COMPOUND, A DISPLAY PANEL AND A DISPLAY DEVICE

CROSS-REFERENCE TO RELATED APPLICATIONS

The application claims the benefit of the earlier filing date of Chinese Patent Application No. 202010246087.6, filed on Mar. 31, 2020 to the China National Intellectual Property Administration, the contents of which are incorporated by reference herein in its entirety.

TECHNICAL FIELD

The present invention relates to field of organic electroluminescent technologies and, in particular, relates to a compound, a display panel and a display device.

BACKGROUND

With development of electronic display technology, organic light emitting device (OLED) is widely applied in various display devices, and research and application of light-emitting materials of the OLED are increasing.

Materials used for a light-emitting layer of the OLED mainly include the following four according to light-emitting mechanism:
(1) a fluorescent material; (2) a phosphorescent material; (3) a triplet-triplet annihilation (TTA) material; (4) a thermally activated delayed fluorescence (TADF) material.

For the TADF material, when difference between singlet excited state energy level and triplet excited state energy level is small, reverse intersystem crossing (RISC) occurs inside a molecule. T1 state excitons are up-converted to S1 state by absorbing environmental heat, 75% of triplet state excitons and 25% of singlet state excitons can be simultaneously utilized, and theoretical maximum internal quantum yield can reach 100%. The TADF material is mainly an organic compound, does not need rare metal elements and thus has low production cost. The TADF material can be chemically modified in a variety of ways. However, fewer TADF materials have been discovered.

Therefore, there is a need in the art to develop more kinds of TADF materials with higher performance as light-emitting materials to improve uminescence efficiency and device lifetime of OLED devices.

SUMMARY

To develop more kinds of TADF materials with higher performance as well as devices with higher luminescence efficiency, a first object of the present invention is to provide a compound having a structure represented by Formula I.

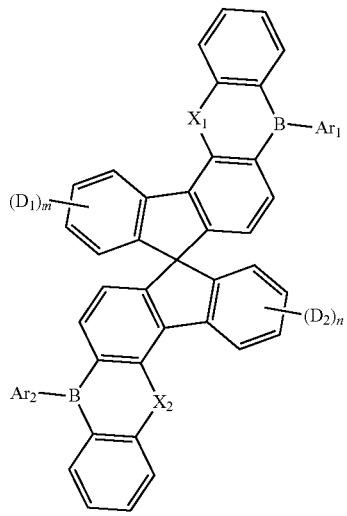

Formula I

In Formula I, m and n are each independently an integer selected from 1 to 4.

In Formula I, $D_1$ and $D_2$ are each independently selected from any one of a substituted or unsubstituted C12-C40 carbazole group, a substituted or unsubstituted C12-C40 acridine group, a substituted or unsubstituted C12-C40 arylamine group, a substituted or unsubstituted fluorenyl, or a substituted or unsubstituted spirofluorenyl.

In Formula I, $Ar_1$ and $Ar_2$ are each independently selected from a C1-C20 alkyl, a C1-C20 alkoxy, or a substituted or unsubstituted C6-C40 aryl.

In Formula I, $X_1$ and $X_2$ are each independently selected from any one of an oxygen atom, a sulfur atom,

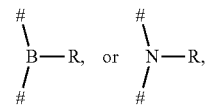

where # represents a linking bond.

R is selected from a C1-C20 alkyl, a C1-C20 alkoxy, or a substituted or unsubstituted C6-C40 aryl.

In $D_1$, $D_2$, $Ar_1$, $Ar_2$ and R, substituent is selected from any one or a combination of at least two of a cyano, a halogen, a phenoxy, a C1-C20 alkyl, a C1-C20 alkoxy, a C6-C40 aryl, a C4-C40 heteroaryl, or a C6-C40 arylamine group.

A second object of the present invention is to provide a display panel. The display device includes an organic light emitting diode (OLED) device. The OLED device includes an anode, a cathode and an organic thin film layer disposed between the anode and the cathode. The organic thin film layer includes a light-emitting layer.

The light-emitting layer includes the compound described in the first object.

A third object of the present invention is to provide a display device. The display device includes the display panel described in the second object.

Compared with the related art, the present invention has beneficial effects described below.

(1) The compound provided by the present invention takes a spiro structure as a connecting unit and a boron-containing group as an electron-accepting group A. A light-emitting compound obtained by taking the group as a building block can have a narrower half-peak width and higher color purity, which is suitable to be used as doped material in a light-emitting layer.

(2) The boron-containing group, as an electron-accepting group, is connected to an electron-donating group, so that an intramolecular charge transfer effect is easily formed to form a bipolar compound, and the bipolar compound has balanced carrier transport properties, and is suitable to be used as a bipolar host material, particularly a phosphorescent host material.

(3) The spiro structure takes a sp3 hybridized carbon atom as center to form a space orthorhombic structure, which has a larger steric hindrance effect and thus can reduce intermolecular aggregation, and an amorphous material is easier to obtain; the obtained amorphous material is suitable to be used as a doped host material of a light-emitting layer, which prevents luminescent quenching caused by intermolecular aggregation, and prolongs service life of a device.

(4) In the design of organic light-emitting materials, long conjugated chains and good rigid conjugated planes can effectively enhance light-emitting performance of molecules. Therefore, an organic light emitting molecule having a rigid conjugated plane is formed by using a rigid conjugated plane as a skeleton and linking a proper electron donor with an electron acceptor through a conjugated bridge. The spiro aromatic compound has a large conjugated system and good rigid coplanarity, which improves electron conjugation effect and molecular coplanarity and is favorable for improving fluorescence efficiency, and thus is suitable to be used as a light-emitting material.

(5) The boron-containing spiro compound is a π-conjugation interrupted molecular building block which takes a sp3 hybridized carbon atom as center and has a space orthorhombic configuration. The boron-containing spiro compound has a π-conjugation interrupted spiro conjugation effect, which is beneficial to improve the triplet state energy level of the compound.

(6) The spiro compound has good chemical stability, electrochemical stability and photochemical stability, and simultaneously has high glass-transition temperature and high thermal stability.

(7) Since difference between the singlet state energy level and the triplet state energy level of the compound provided by the present invention is less than 0.3 eV, conversion from triplet state excitons to singlet state excitons can be efficiently achieved through reverse intersystem crossing, utilization efficiency of excitons is improved, and thus the compound can be used as a thermal activation delay fluorescent material.

(8) When the compound of the present invention is applied to a organic electroluminescent device, display performance of the device can be improved, drive voltage is reduced, luminescence efficiency of the device is improved, and service life of the device is prolonged.

DETAILED DESCRIPTION

Figure 1:
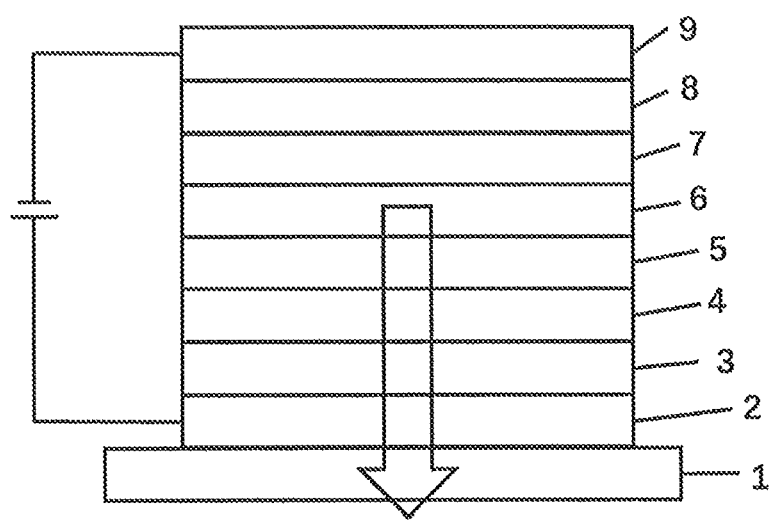
FIG. 1 is a schematic diagram of an OLED device according to a specific embodiment of the present invention; wherein 1-substrate, 2-Indium Tin Oxide (ITO) anode, 3-hole injection layer, 4-first hole transport layer, 5-second hole transport layer, 6-light-emitting layer, 7-first electron transport layer, 8-second electron transport layer, and 9-cathode.

A first object of the present invention is to provide a compound. The compound has a structure represented by Formula I.

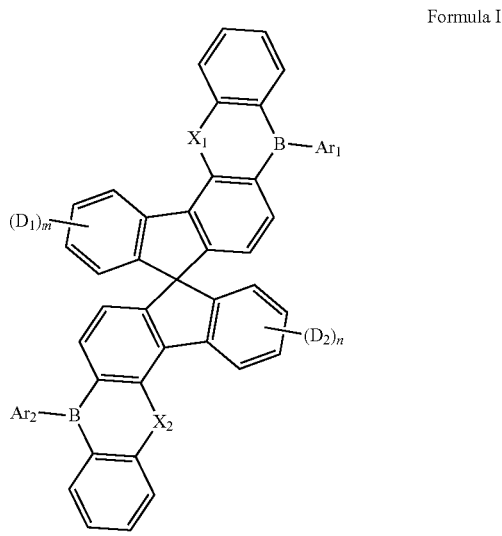

Formula I

In Formula I, m and n are each independently an integer selected from 1 to 4, such as 1, 2, 3, etc.

In Formula I, $D_1$ and $D_2$ are each independently selected from any one of a substituted or unsubstituted C12-C40 carbazole group, a substituted or unsubstituted C12-C40 acridine group, a substituted or unsubstituted C12-C40 arylamine group, a substituted or unsubstituted fluorenyl, or a substituted or unsubstituted spirofluorenyl.

In Formula I, $Ar_1$ and $Ar_2$ are each independently selected from a C1-C20 alkyl, a C1-C20 alkoxy, or a substituted or unsubstituted C6-C40 aryl.

In Formula I, $X_1$ and $X_2$ are each independently selected from any one of an oxygen atom, a sulfur atom,

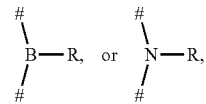

wherein #represents a linking bond.

R is selected from a C1-C20 alkyl, a C1-C20 alkoxy, or a substituted or unsubstituted C6-C40 aryl.

In $D_1$, $D_2$, $Ar_1$, $Ar_2$ and R, substituent is each independently selected from any one or a combination of at least two of a cyano, a halogen, a phenoxy, a C1-C20 alkyl, a C1-C20 alkoxy, a C6-C40 aryl, a C4-C40 heteroaryl, or a C6-C40 arylamine group.

In the present invention, "substituted or unsubstituted" means that the group may be substituted with other substituents, or may not be substituted with other substituents. For example, a carbazole group in the "substituted or unsubstituted C12-C40 carbazolyl group" may or may not have a substituent. When there is a substituent in the above "substituted or unsubstituted" group, the selection range of the substituent is as described in the preceding paragraph, and when the expression of "substituted or unsubstituted" is involved in the present invention, all substituents have the same selection range as described above, which will not be repeated herein.

In the present invention, the carbazole group refers to a group containing either a carbazole structure or a carbazole structure in which the carbon atom is replaced by a heteroatom, such as

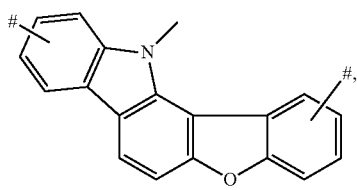

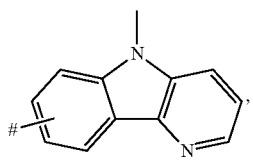

etc. Similar to the carbazole group, the acridine group refers to a group containing either an acridine structure or an acridine structure in which the carbon atom is replaced by a heteroatom, such as

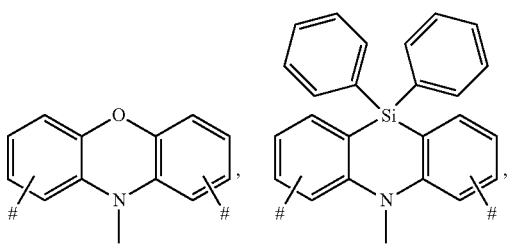

etc. The heteroatom includes a nitrogen atom, an oxygen atom, a sulphur atom, a silicon atom, etc.

In the present invention, $D_1$ and $D_2$ represent two independent groups. Although they have the same selection range, the both can select the same group or different groups in the above range. In addition, the number of each of $D_1$ and $D_2$ on mother nucleus may be 1 to 4. When at least two $D_1$ or at least two $D_2$ are substituted, the at least two $D_1$ may be the same or different, and similarly, the at least two $D_2$ may be the same or different.

The number of carbons of the C12-C40 carbazole group can be 14, 16, 18, 20, 22, 24, 26, 28, 30, 32, 34, 36, 38, etc.

The number of carbons of the C12-C40 acridine group can be 14, 16, 18, 20, 22, 24, 26, 28, 30, 32, 34, 36, 38, etc.

The number of carbons of the C12-C40 arylamine group can be 14, 16, 18, 20, 22, 24, 26, 28, 30, 32, 34, 36, 38, etc.

The number of carbons of the C1-C20 alkyl can be 2, 3, 4, 5, 6, 7, 8, 9, 10, 11, 12, 13, 14, 15, 16, 17, 18, 19, etc.

The number of carbons of the C1-C20 alkoxy can be 2, 3, 4, 5, 6, 7, 8, 9, 10, 11, 12, 13, 14, 15, 16, 17, 18, 19, etc.

The number of carbons of the C6-C40 aryl can be 8, 10, 12, 14, 16, 18, 20, 22, 24, 26, 28, 30, 32, 34, 36, 38, etc.

The number of carbons of the C4-C40 heteroaryl can be 6, 8, 10, 12, 14, 16, 18, 20, 22, 24, 26, 28, 30, 32, 34, 36, 38, etc.

The number of carbons of the C6-C40 aryl can be 8, 10, 12, 14, 16, 18, 20, 22, 24, 26, 28, 30, 32, 34, 36, 38, etc.

The compound provided by the present invention takes a spiro structure as an electron-donating group and a boron-containing group as an electron-accepting group. A light-emitting compound obtained by taking the group as a building block can have a narrower half-peak width and higher color purity. The spiro structure is connected with the electron-donating group, an intramolecular charge transfer effect is easily formed to form a bipolar compound, and the bipolar compound has balanced carrier transport properties, and is suitable to be used as a bipolar host material, particularly a phosphorescent host material.

The spiro structure takes a sp3 hybridized carbon atom as center to form a space orthorhombic structure, which has a larger steric hindrance effect and thus can reduce intermolecular aggregation, and an amorphous material is easier to obtain; the obtained amorphous material is suitable to be used as a doped host material of the light-emitting layer, which prevents luminescent quenching caused by intermolecular aggregation, and prolongs service life of a device.

The spiro aromatic compound has a large conjugated system and good rigid coplanarity, which improves electron conjugation effect and molecular coplanarity and is favorable for improving fluorescence efficiency, and thus is suitable to be used as a light-emitting material.

The boron-containing spiro compound is a π-conjugation interrupted molecular building block which takes a sp3 hybridized carbon atom as center and has a space orthorhombic configuration. The boron-containing spiro compound has a π-conjugation interrupted spiro conjugation effect, which is beneficial to improve the triplet state energy level of the compound.

The spiro compound has good chemical stability, electrochemical stability and photochemical stability, and simultaneously has high glass-transition temperature and high thermal stability.

The spiro structure can orthogonally connect the electron-donating group and the electron-accepting group to the π-conjugated system, reducing spatial overlap of HOMO and LUMO. Therefore, ΔEST can be minimized such that the compound has TADF properties. The spiro chemical structure can hinder close packing of molecules in a solid film, improving film-forming property and form stability of the compound.

In an embodiment, the compound has a structure represented by Formula II.

Formula II

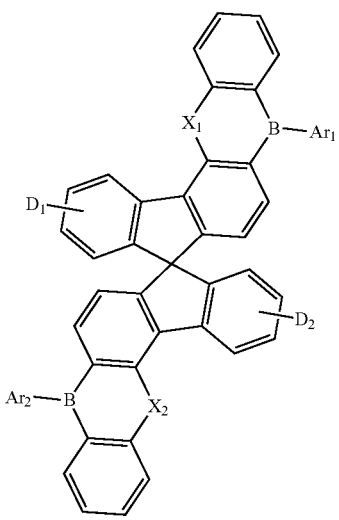

$D_1$, $D_2$, $Ar_1$, $Ar_2$, $X_1$ and $X_2$ each has the same meaning as in Formula I.

In the present invention, the structure represented by Formula II is preferred, that is, the spirofluorene mother nucleus is substituted with only one $D_1$ and one $D_2$. Therefore, the compound with the structure is simple to synthesize, has smaller molecular weight and better thermal stability, and is more beneficial to process and prepare a high-resolution light-emitting device using an evaporation method, and can achieve high luminescence efficiency and long device service life.

In an embodiment, the compound has a structure represented by Formula III.

Formula III

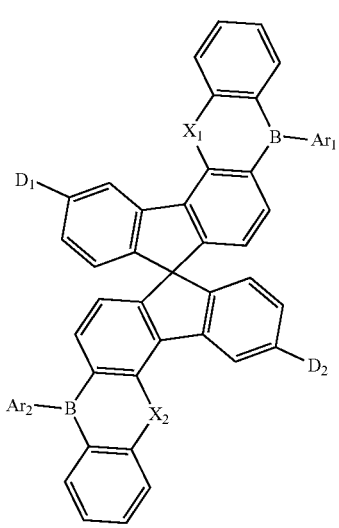

$D_1$, $D_2$, $Ar_1$, $Ar_2$, $X_1$ and $X_2$ each has the same meaning as in Formula I.

In the present invention, the structure represented by Formula III is further preferred, so that the spirofluorene mother nucleus is substituted with $D_1$ and $D_2$ at a specific site. The compound substituted at such site is easy to synthesize, the steric hindrance between groups in a molecule is relatively smaller, chemical bond of the molecule is more stable, and light-emitting performance and service life of a device can be further improved.

In an embodiment, the substituted or unsubstituted C12-C40 carbazole group includes any one of the following groups.

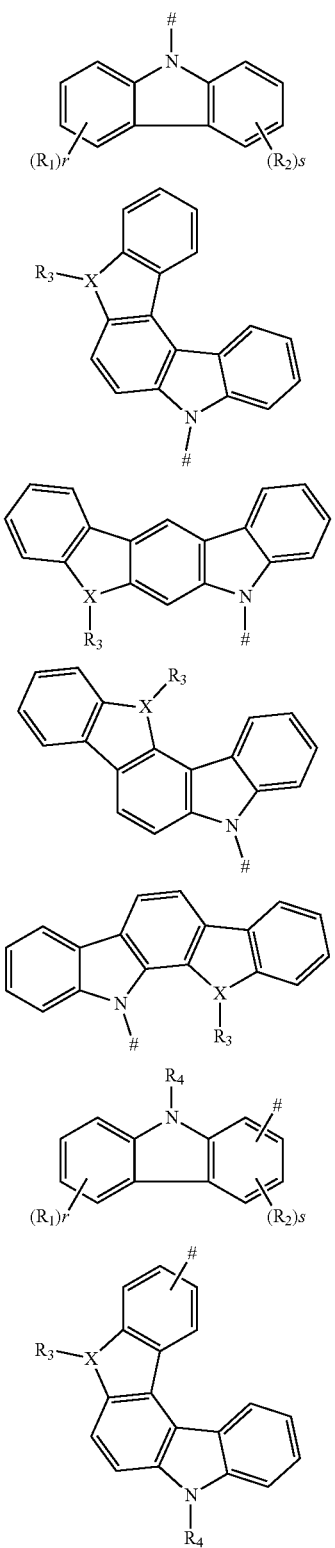

-continued

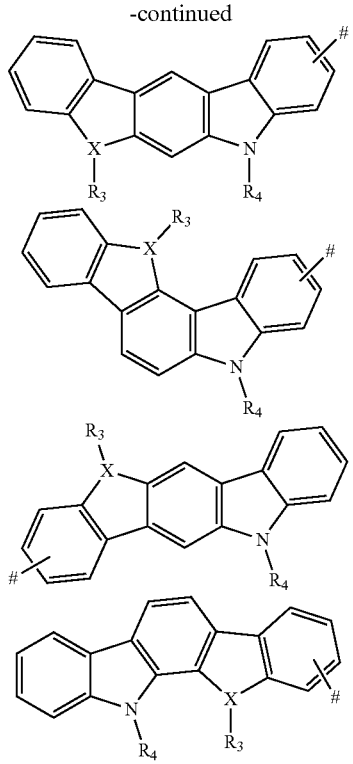

X is selected from a carbon atom, a nitrogen atom, an oxygen atom, a sulfur atom or a silicon atom; r and s are each independently selected from 0, 1, 2 or 3; when X is an oxygen atom or a sulfur atom, $R_3$ does not exist.

$R_1$, $R_2$, $R_3$ and $R_4$ are each independently selected from any one of a hydrogen atom, a C1-C20 alkyl, a C1-C20 alkoxy or any one of groups represented be the following chemical formula.

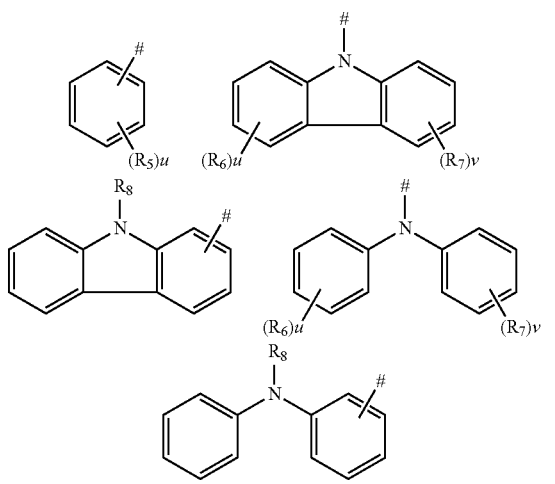

$R_5$, $R_6$, $R_7$ and $R_8$ are each independently selected from any one of a hydrogen atom, a C1-C20 alkyl, a C1-C20 alkoxy or a phenyl.

u and v are each independently selected from 0, 1, 2 or 3.

represents a linking bond.

In the present invention, the carbazole group with the above specific structure is preferred, because this kind of carbazole has a special rigid planar structure, a larger conjugated system and good intramolecular electron transfer capability, and can obviously improve luminescence efficiency. The carbazole group has a high triplet state energy level and multiple modifiable sites, has carbon atoms and nitrogen atoms which are easy to be chemically modified, and can be connected with other building units without changing main skeleton structure of a molecule. Meanwhile, the carbazole group has an excellent electron-donating ability and excellent hole transport property; its raw materials are cheap, and the cost is low; and has good thermal stability and chemical stability.

In an embodiment, the substituted or unsubstituted C12-C40 carbazole group comprises any one of the following substituted or unsubstituted groups.

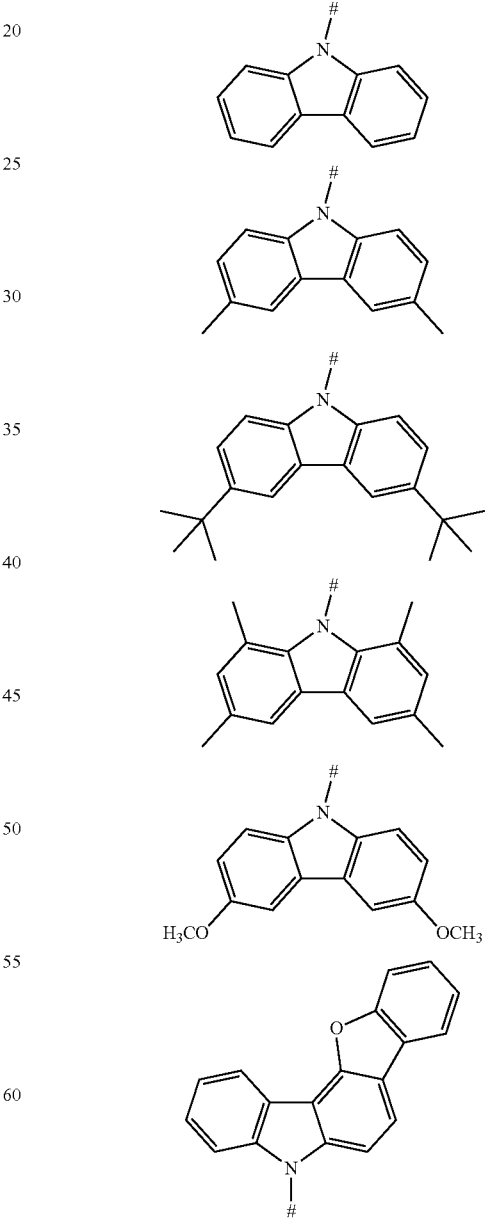

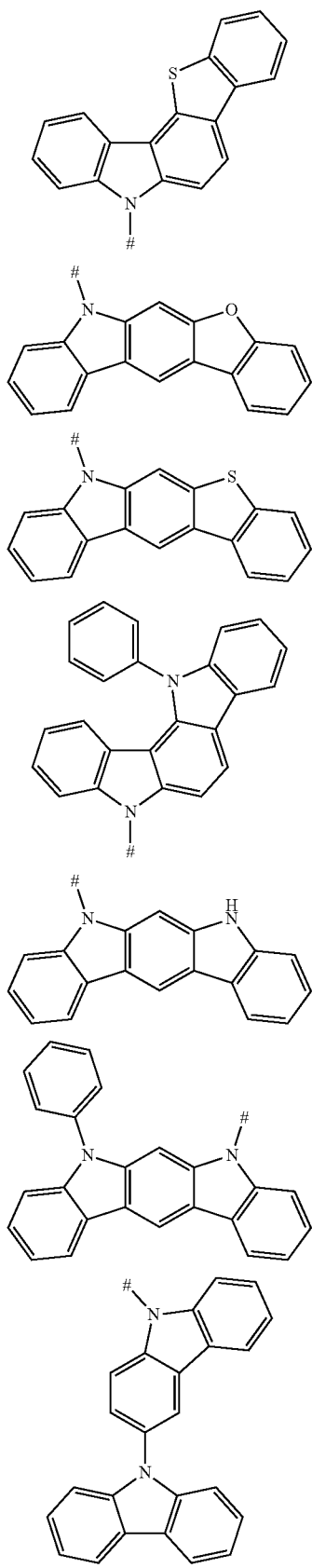
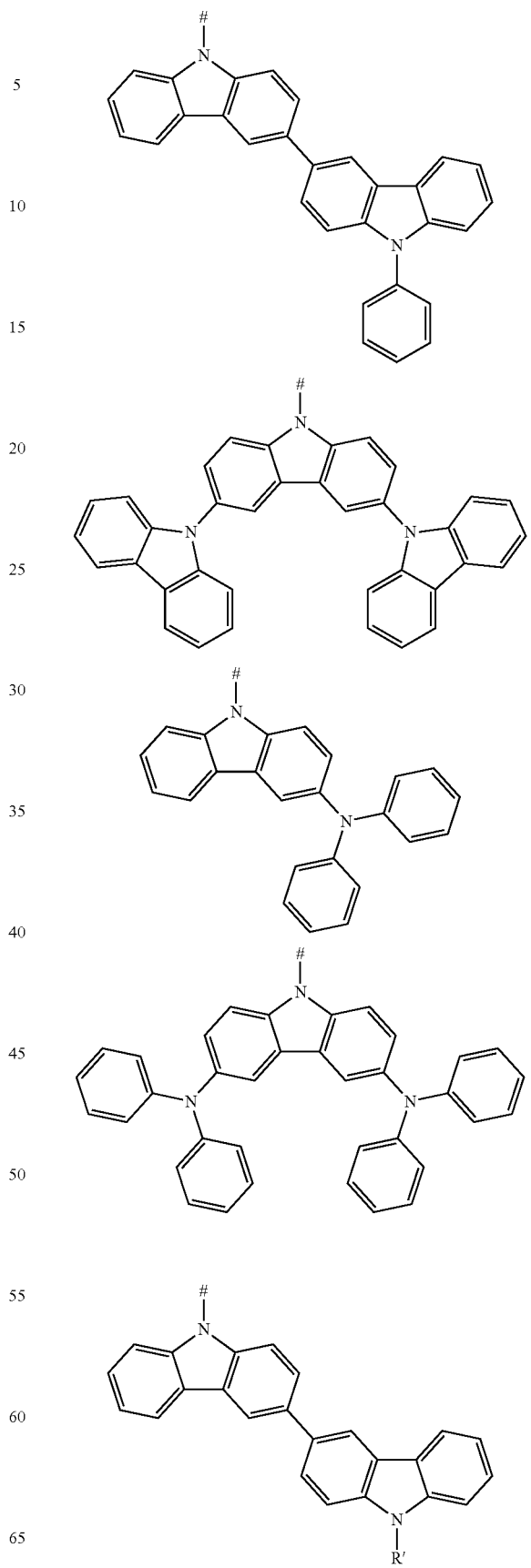

-continued

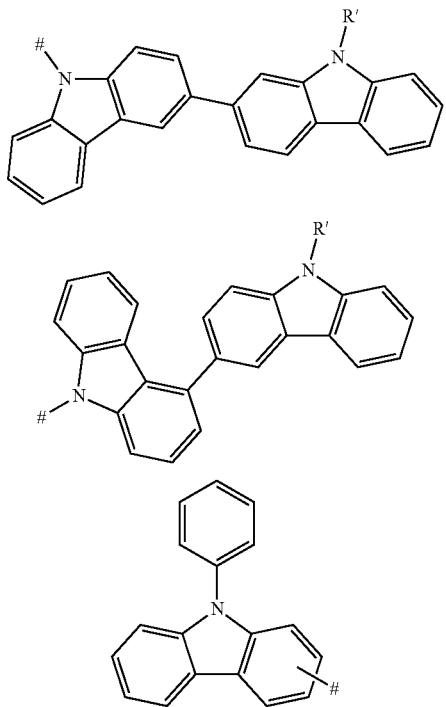

R' is selected from any one of a hydrogen atom, a substituted or unsubstituted C1-C20 alkyl, a substituted or unsubstituted C1-C20 alkoxy, a substituted or unsubstituted C6-C30 aryl, or a substituted or unsubstituted C3-C30 heteroaryl.

represents a linking bond.

In the present invention, the carbazole group with the above specific structure is further preferred, because the above structure is simple to synthesize, has low cost and high chemical stability, and can enable a device to have excellent performance.

In an embodiment, the substituted or unsubstituted C12-C40 acridine group includes any one of the following groups.

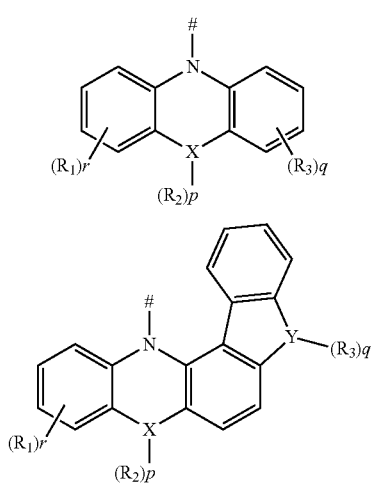

-continued

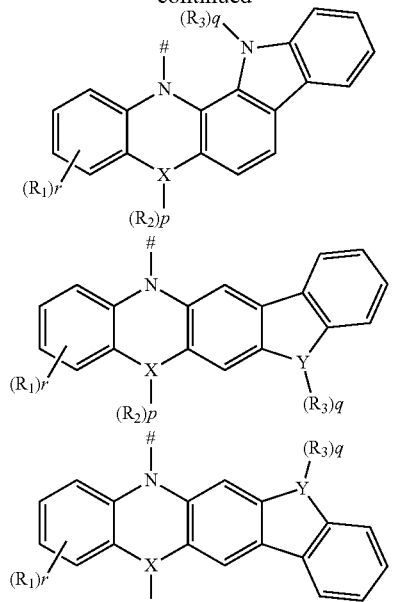

X and Y are each independently selected from a carbon atom, a nitrogen atom, an oxygen atom, a sulfur atom or a silicon atom; r, p and q are each independently selected from 0, 1, 2 or 3; when X is an oxygen atom or a sulfur atom, p is 0; and when Y is an oxygen atom or a sulfur atom, q is 0.

$R_1$, $R_2$ and $R_3$ are each independently selected from any one of a hydrogen atom, a C1-C20 alkyl, a C1-C20 alkoxy or any one of groups represented be the following chemical formula.

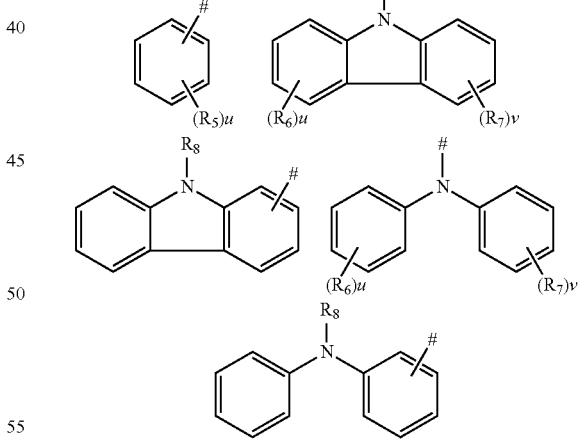

$R_5$, $R_6$, $R_7$ and $R_8$ are each independently selected from any one of a hydrogen atom, a C1-C20 alkyl, a C1-C20 alkoxy or a phenyl.

u and v are each independently selected from 0, 1, 2 or 3.

represents a linking bond.

In the present invention, the acridine group with the above specific structure is preferred. These groups have the following advantages: (1) a very strong electron-donating ability and excellent hole injection and hole transport ability; (2) a high triplet state energy level; (3) a rigid molecular structure, which can effectively reduce non-radiative decay of excited state; (4) the rigid molecular structure reduces free rotational vibration in a molecule, is favorable for improving monochromaticity of a material and reduces the full width at half maximum (FWHM) of the material; (5) the spiro structure is connected with an electron-accepting unit to form a bipolar compound, so that the HOMO and the LUMO can be better separated; (6) the acridine group has multiple modifiable sites, and mutual aggregation among molecules can be inhibited by introducing a substituent.

In an embodiment, the substituted or unsubstituted C12-C40 acridine group includes any one of the following substituted or unsubstituted groups.

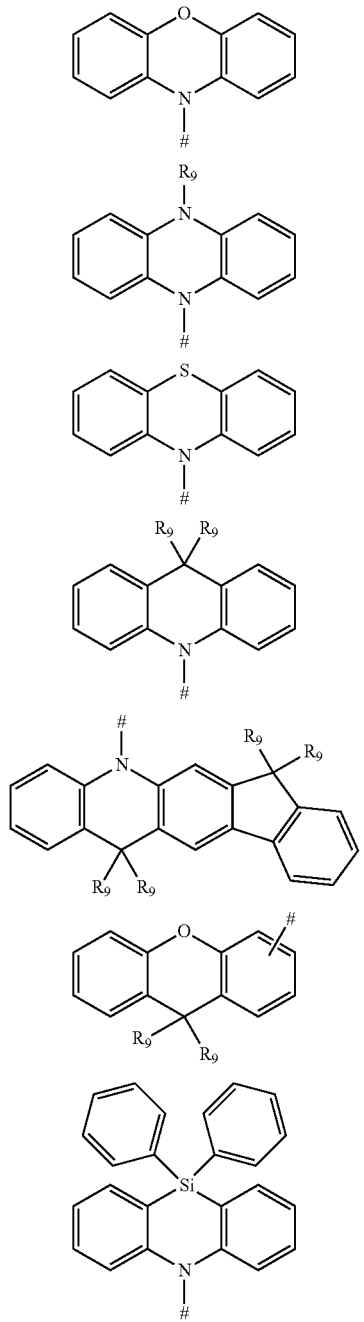

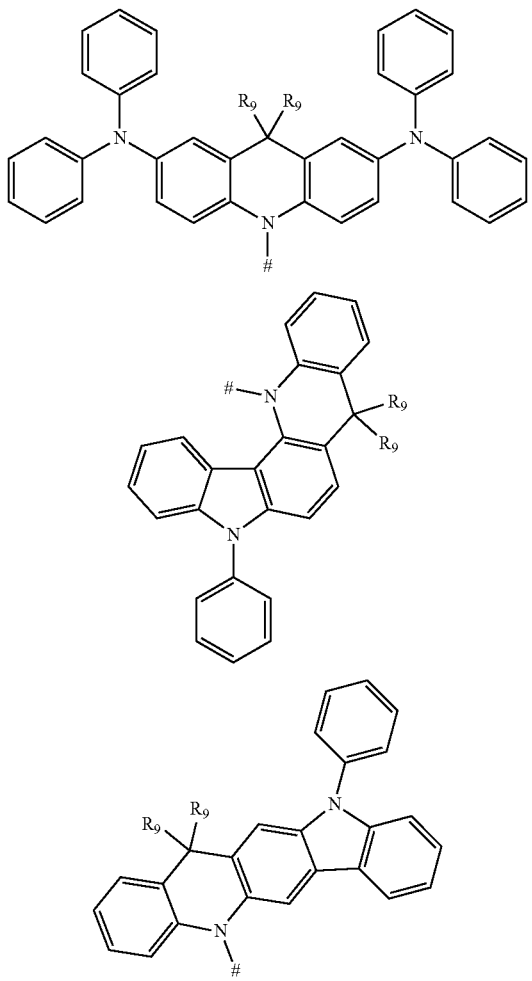

$R_9$ is independently selected from any one of a hydrogen atom, a C1-C20 alkyl, a C1-C20 alkoxy or a phenyl.

represents a linking bond.

In the present invention, the acridine group with the above specific structure is further preferred, because the above group is simple to synthesize, has low cost and high chemical stability, and can bring excellent display performance to an organic electroluminescent device.

In an embodiment, the substituted or unsubstituted C12-C40 arylamine group includes the following group.

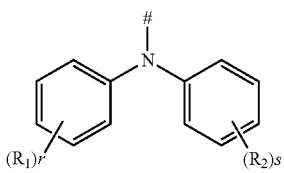

r and s are each independently selected from 0, 1, 2 or 3.

$R_1$ and $R_2$ are each independently selected from any one of a hydrogen atom, a C1-C20 alkyl, a C1-C20 alkoxy or any one of groups represented be the following chemical formula.

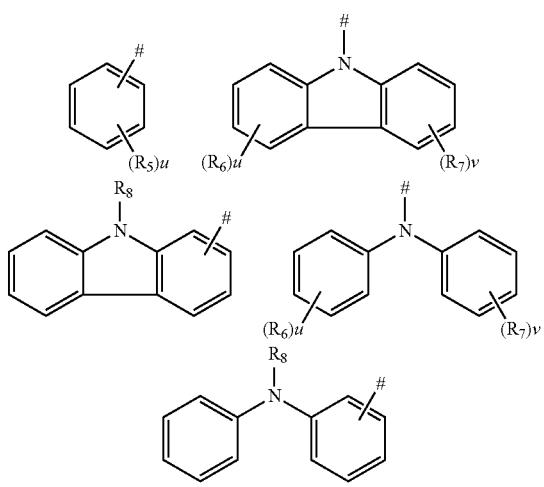

$R_5$, $R_6$, $R_7$ and $R_8$ are each independently selected from any one of a hydrogen atom, a C1-C20 alkyl, a C1-C20 alkoxy or a phenyl.

u and v are each independently selected from 0, 1, 2 or 3.

represents a linking bond.

In the present invention, the arylamine group with the above specific structure is preferred. Such groups have the following advantages: (1) such groups are easy to chemically be modified, and a bipolar host material or a light-emitting material with stronger fluorescence property is easy to obtain after such groups are combined with an electron acceptor; (2) better electron-donating property, lower ionization potential and higher hole mobility; (3) good thermal stability, chemical stability and photochemical stability; (4) better solubility and amorphous film forming property; and (5) wide raw material source and low cost.

In an embodiment, the substituted or unsubstituted C6-C40 arylamine group includes any one of the following substituted or unsubstituted groups.

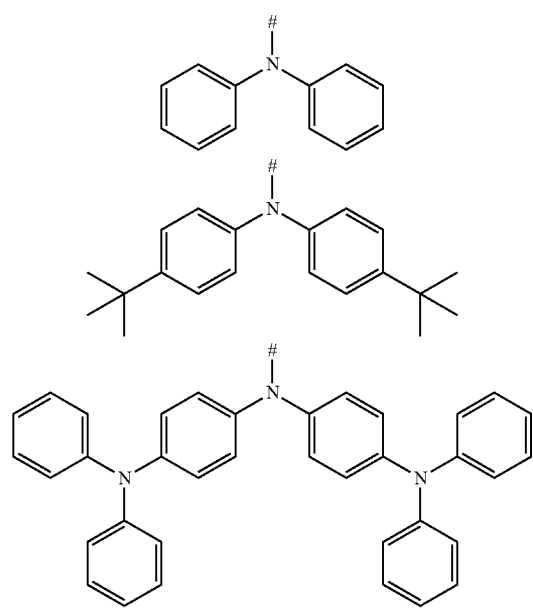

-continued

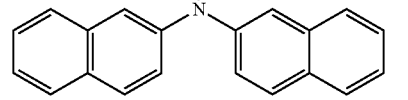

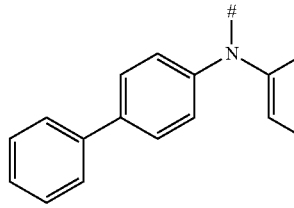

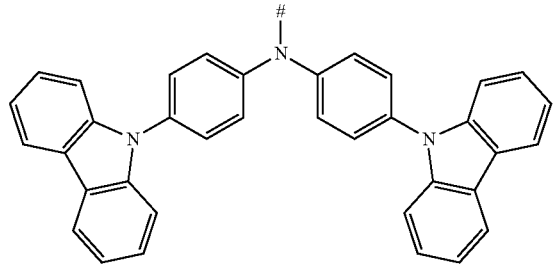

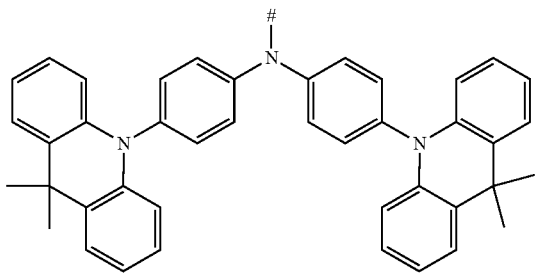

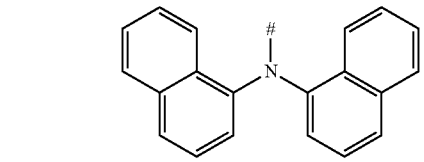

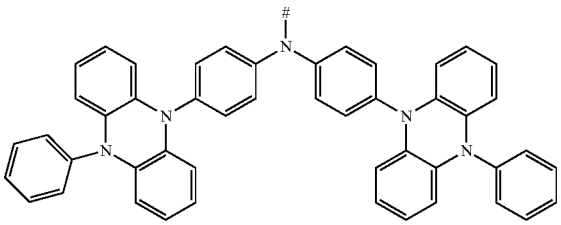

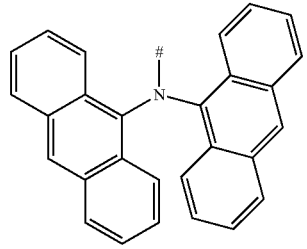

-continued

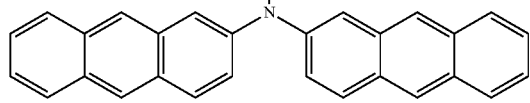

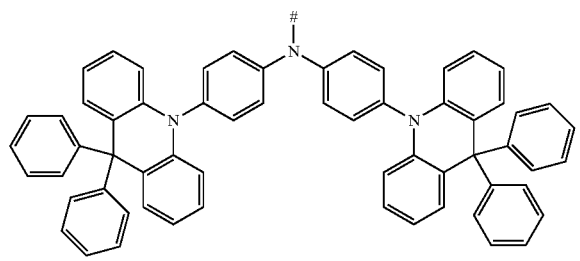

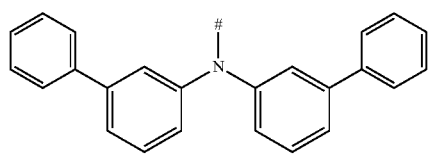

-continued

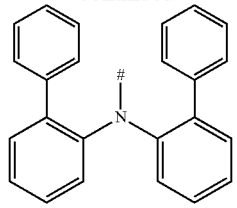

represents a linking bond.

In the present invention, the arylamine group with the above specific structure is further preferred, because the above group is simple to synthesize, has low cost and high chemical stability, and can bring excellent device performance to an organic electroluminescent device.

In an embodiment, $Ar_1$ and $Ar_2$ are each independently selected from any one of a C1-C12 alkyl, a C1-C12 alkoxy, a phenyl, a biphenyl, a naphthyl, an anthracenyl, a phenylene or a pyrenyl.

In an embodiment, R is selected from any one of a C1-C12 alkyl, a C1-C12 alkoxy, a phenyl, a biphenyl, a naphthyl, an anthracenyl, a phenylene or a pyrenyl.

In an embodiment, the compound has any one of the following structures represented by P001 to P096.

P001

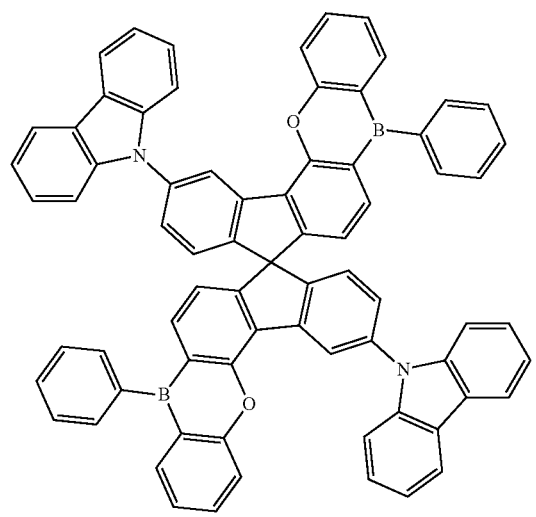

P002

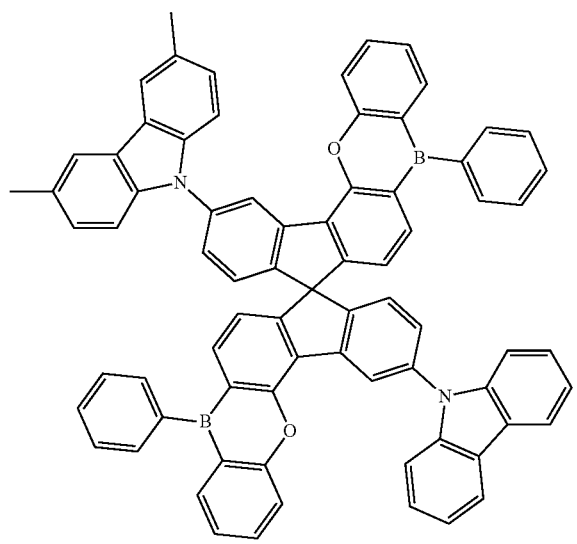

P003
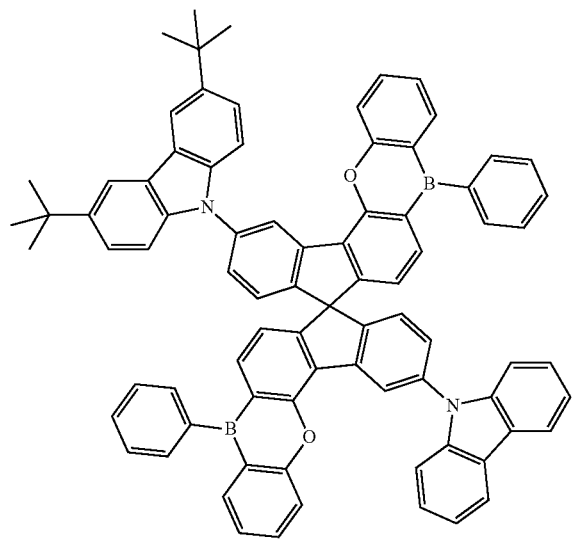
P004
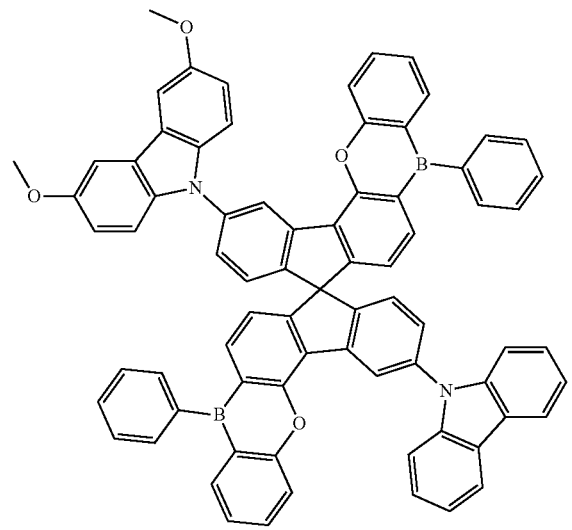
P005
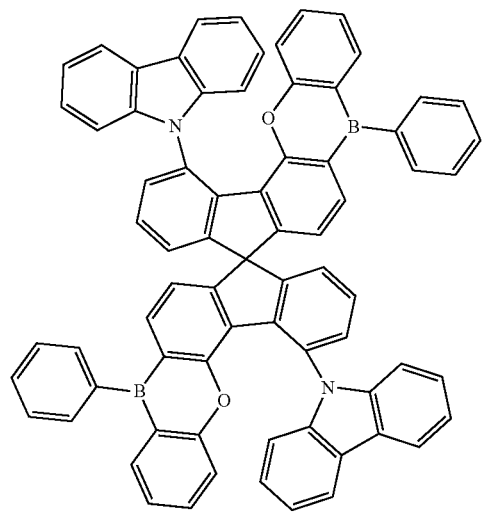
P006
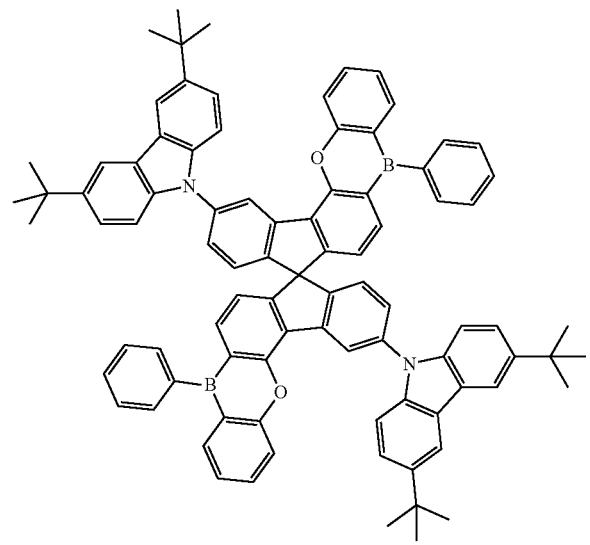

P007
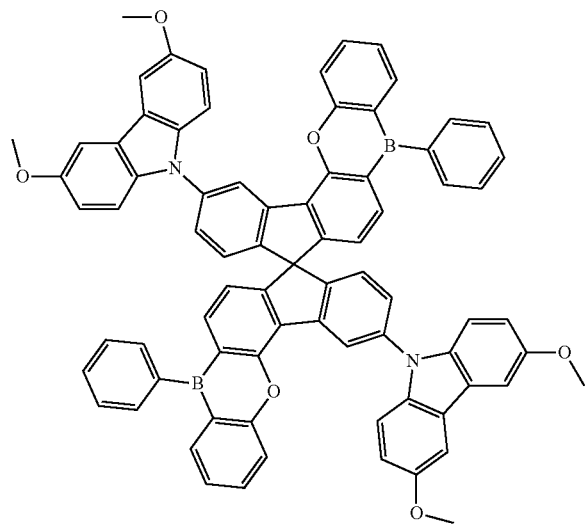
P008
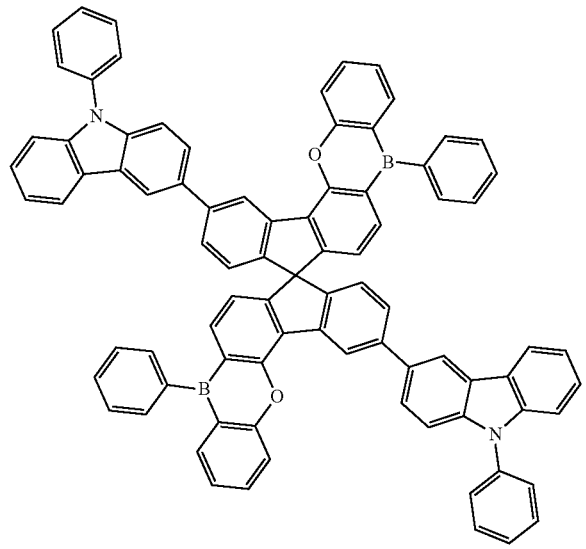
P009
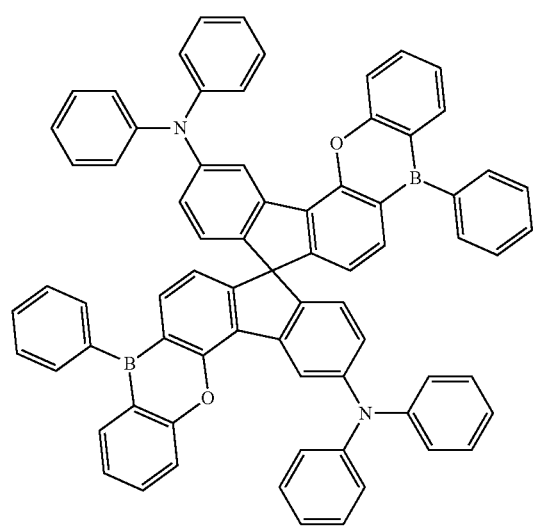
P010
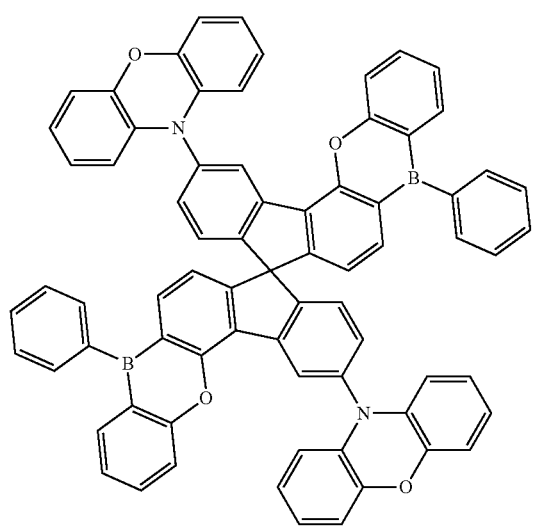

-continued
P011
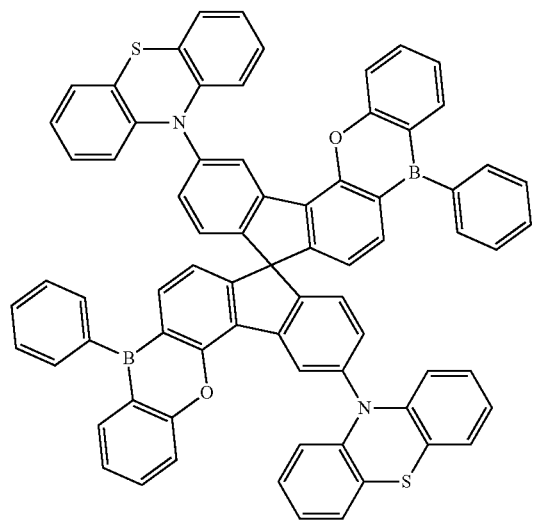
P012
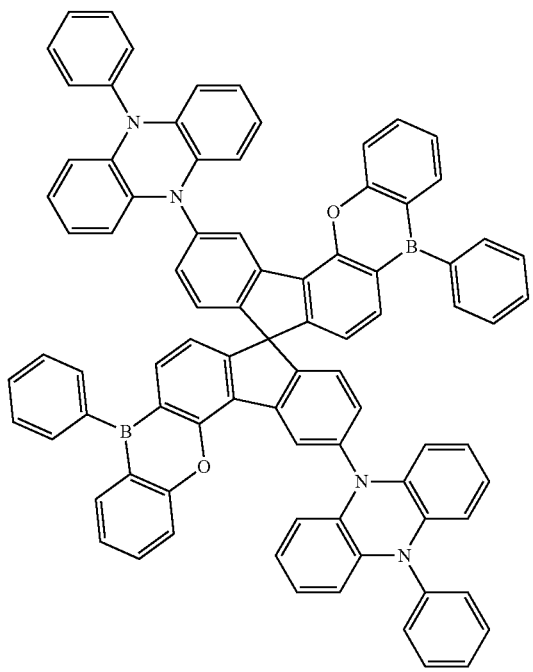
P013
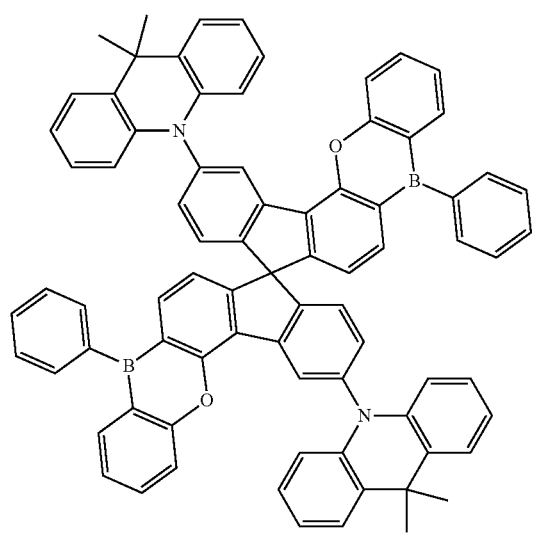
P014
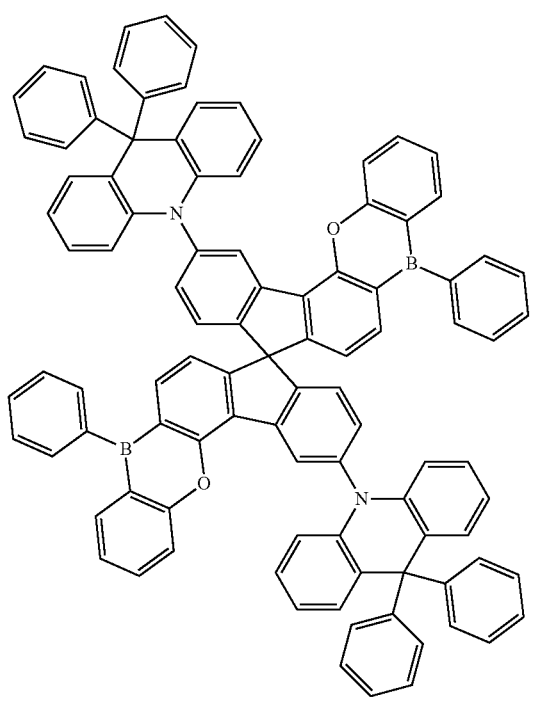

-continued
P015
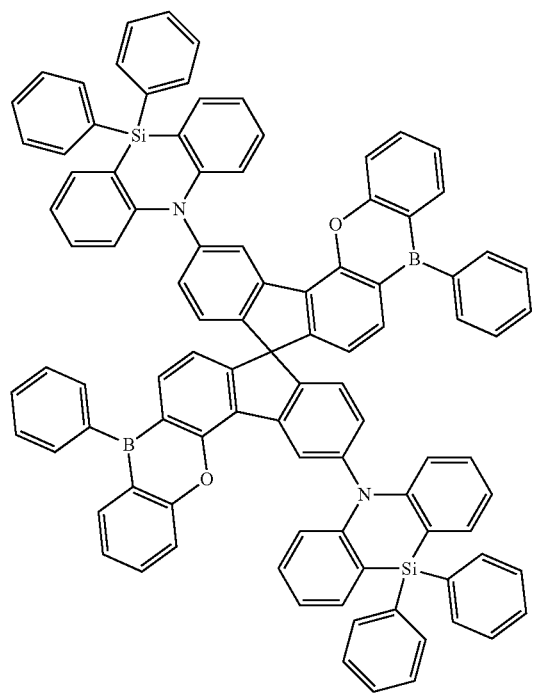
P016
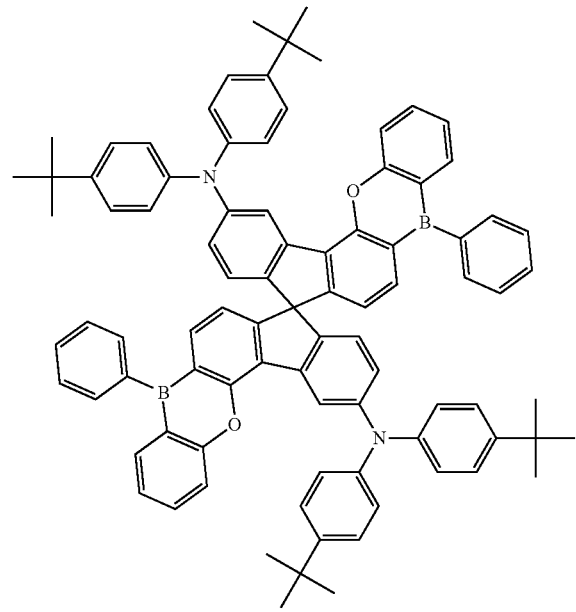
P017
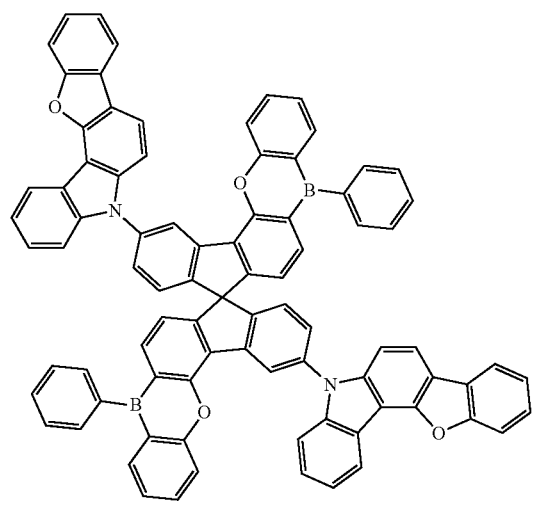
P018
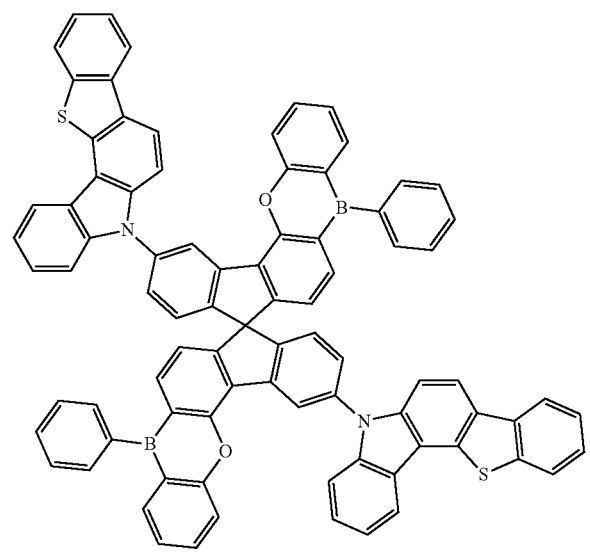

-continued
P019
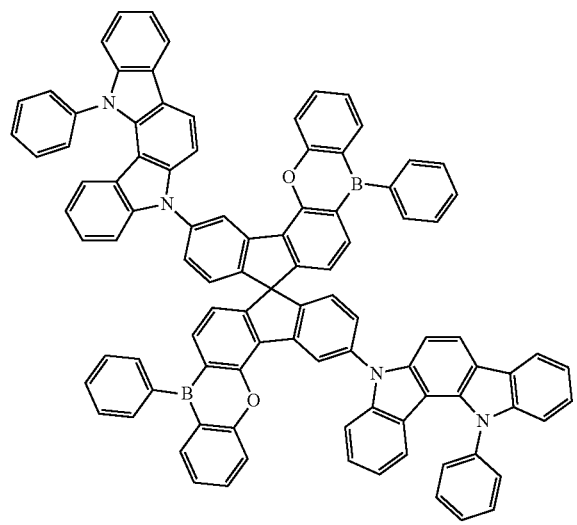
P020
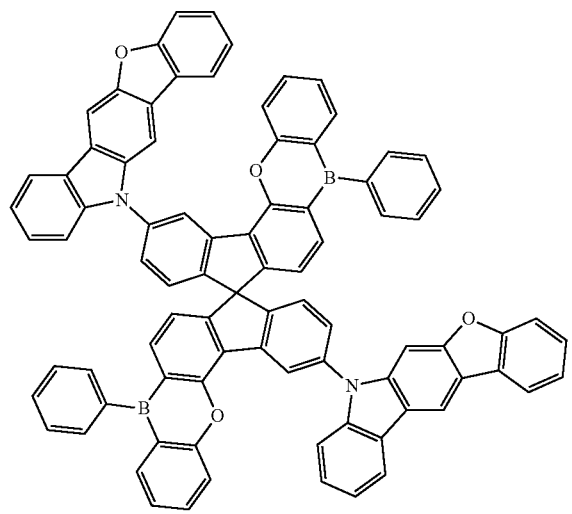
P021
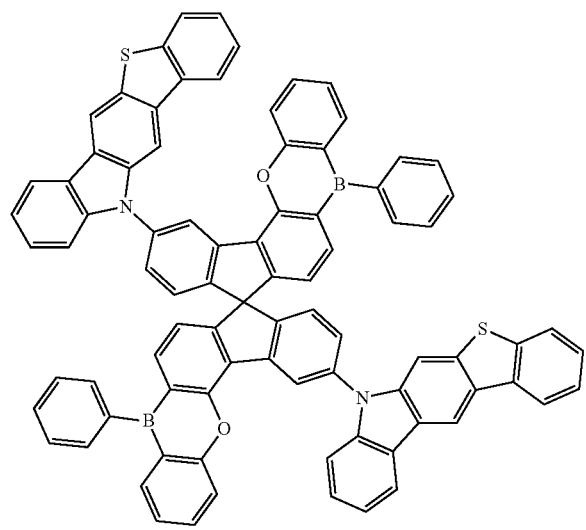
P022
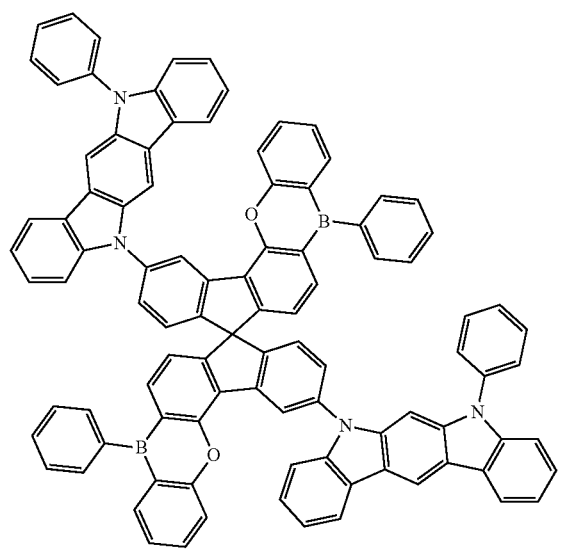

-continued
P023
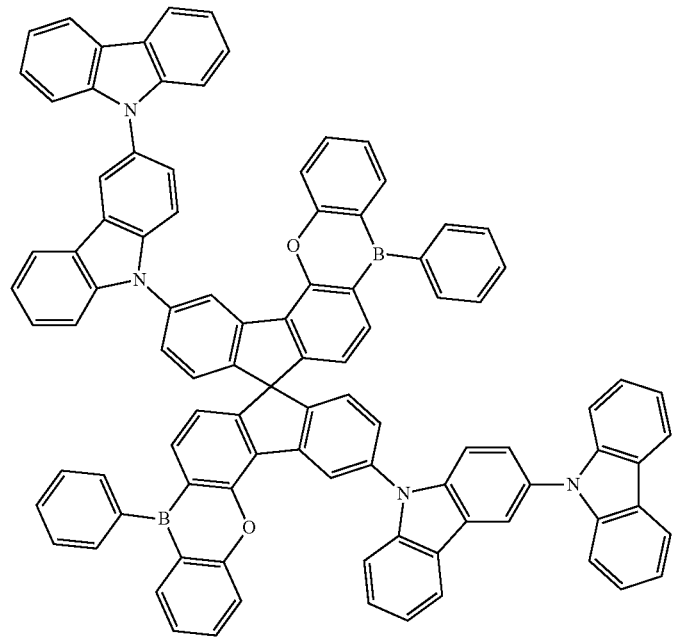
P024
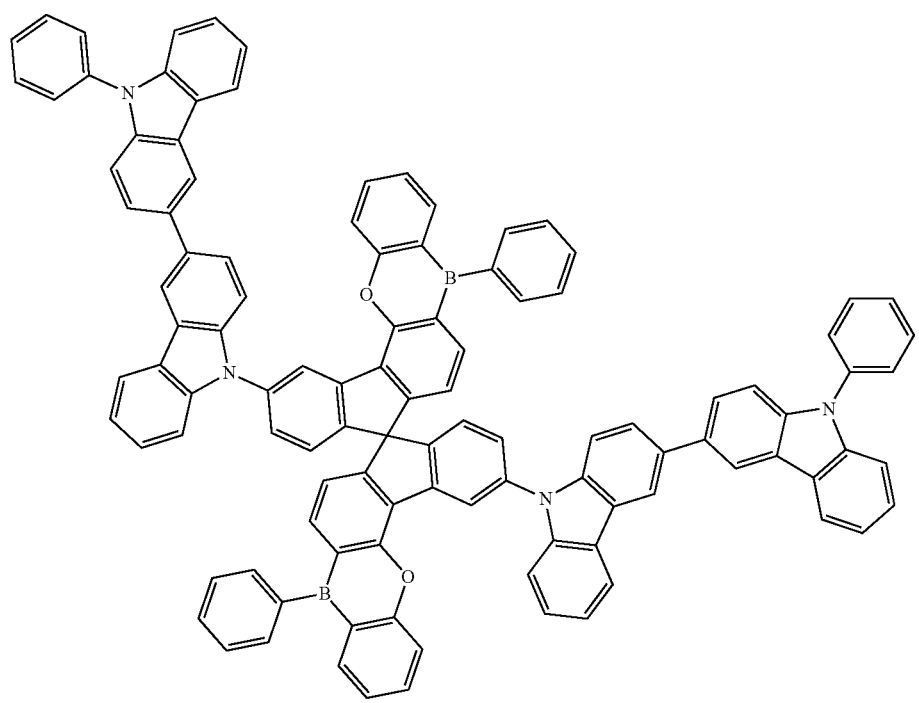

-continued
P025
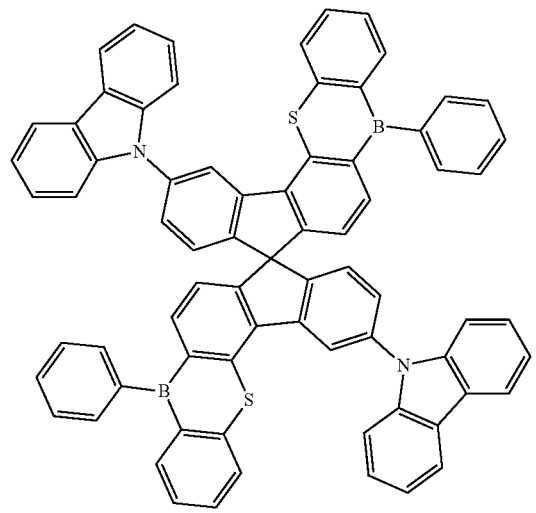
P026
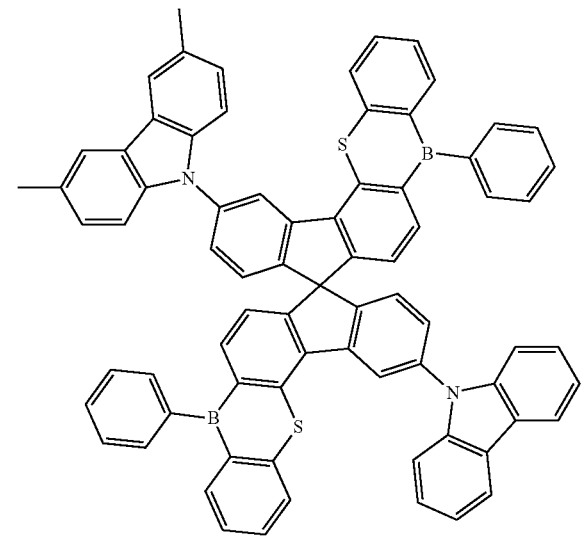
P027
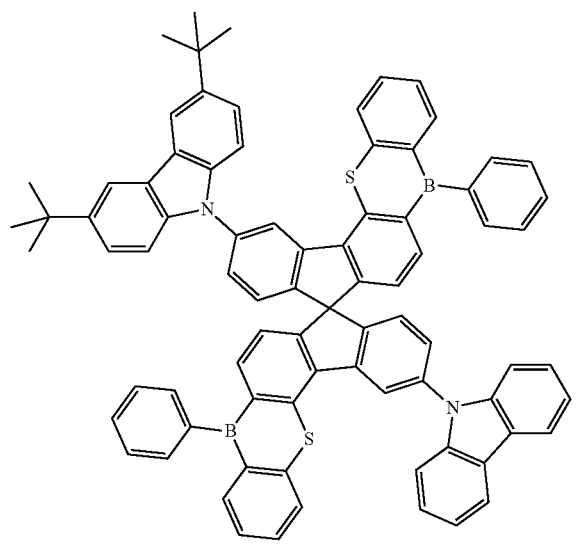
P028
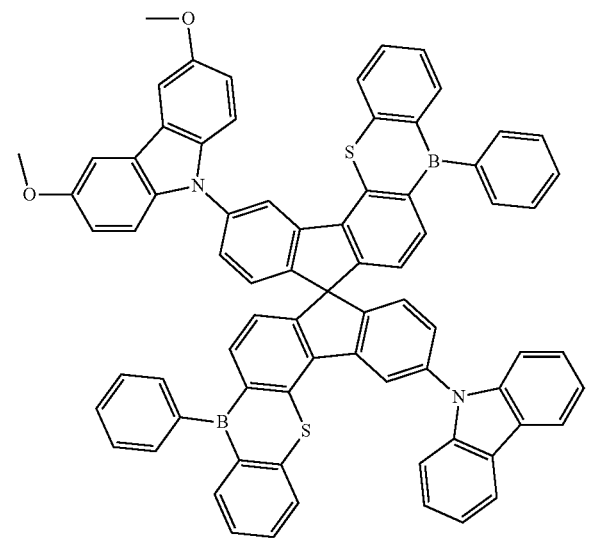
P029
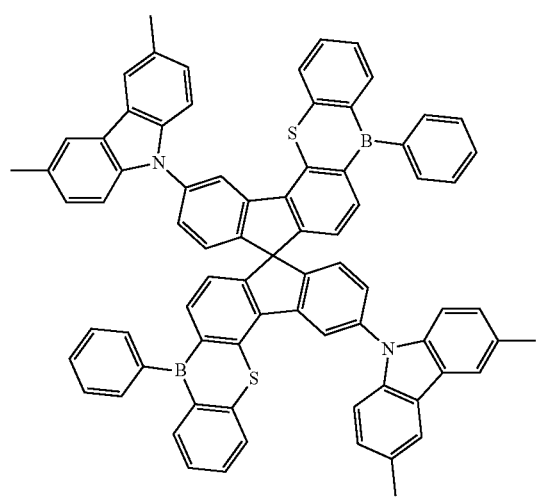
P030
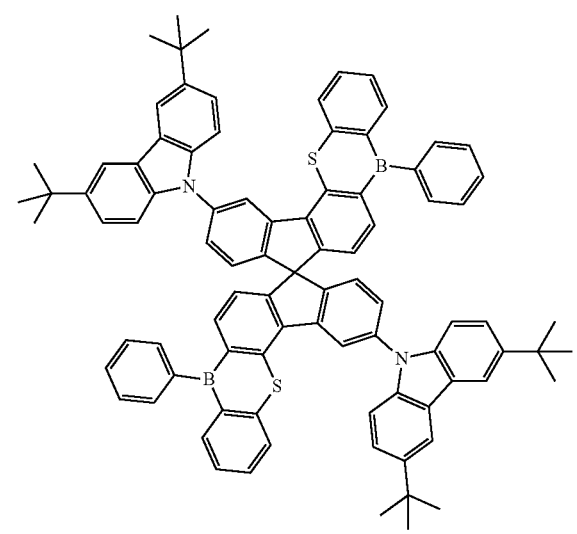

-continued
P031
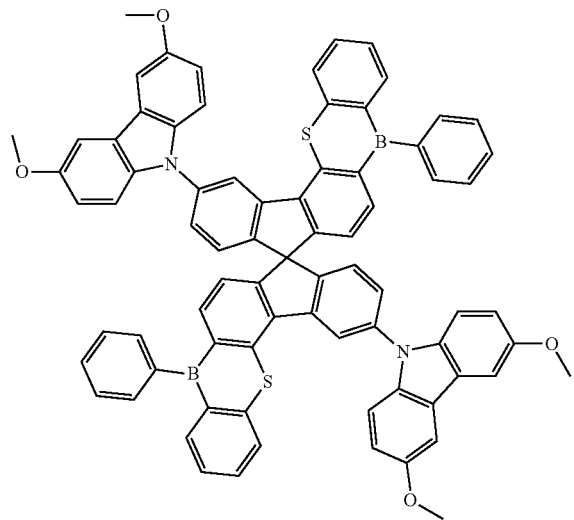
P032
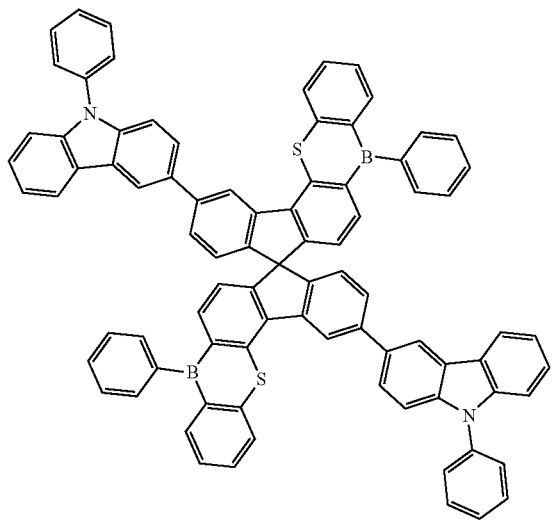
P33
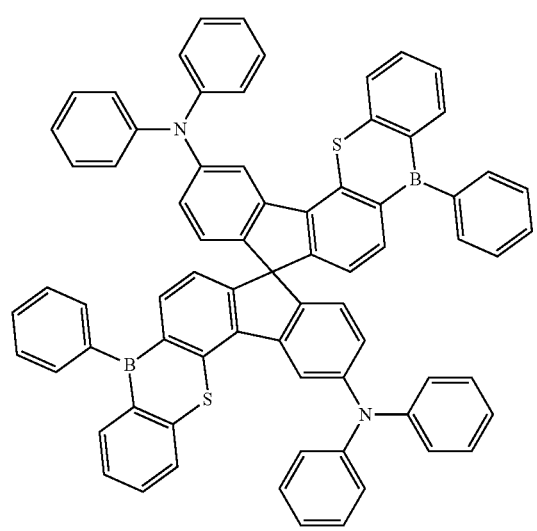
P34
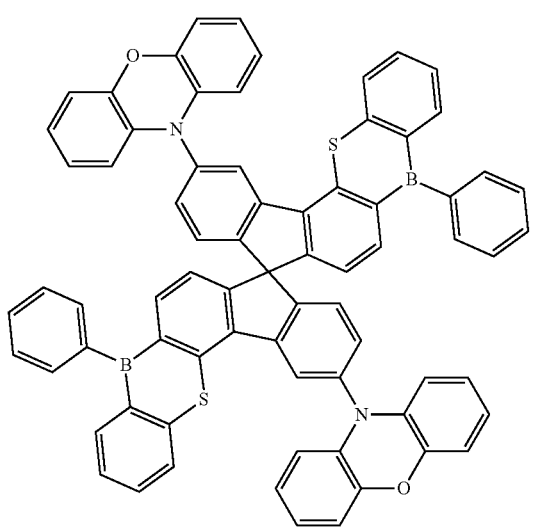

-continued
P35
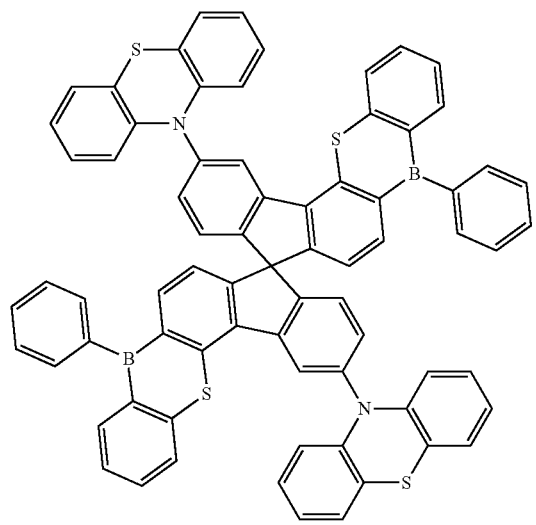
P36
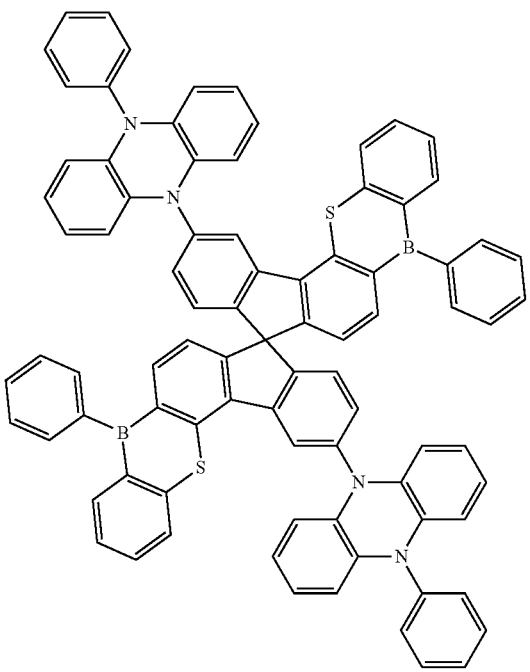
P037
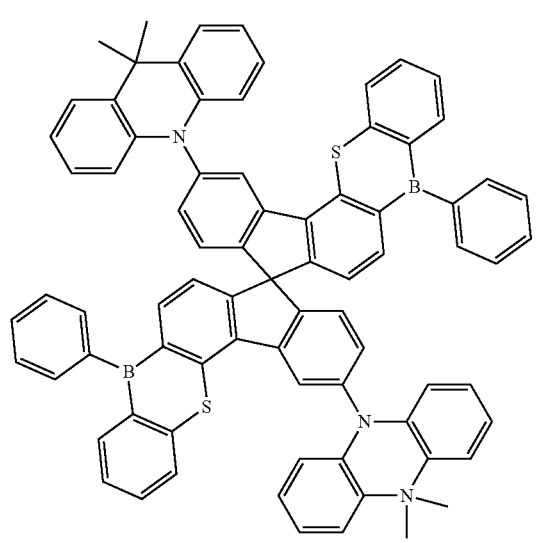
P038
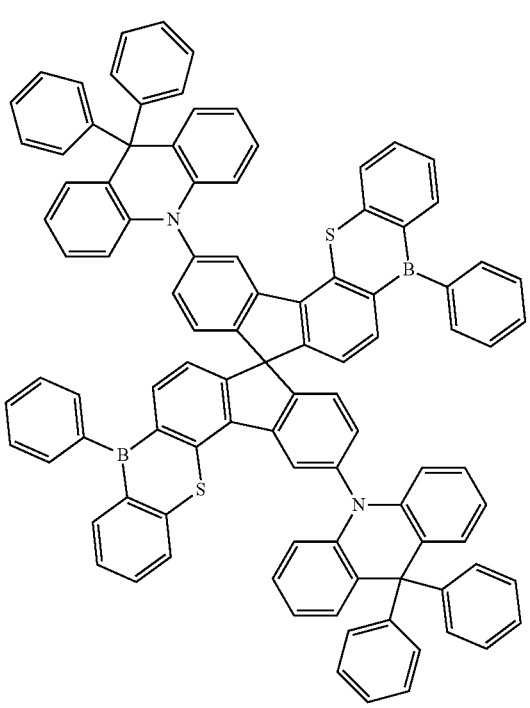

-continued
P039
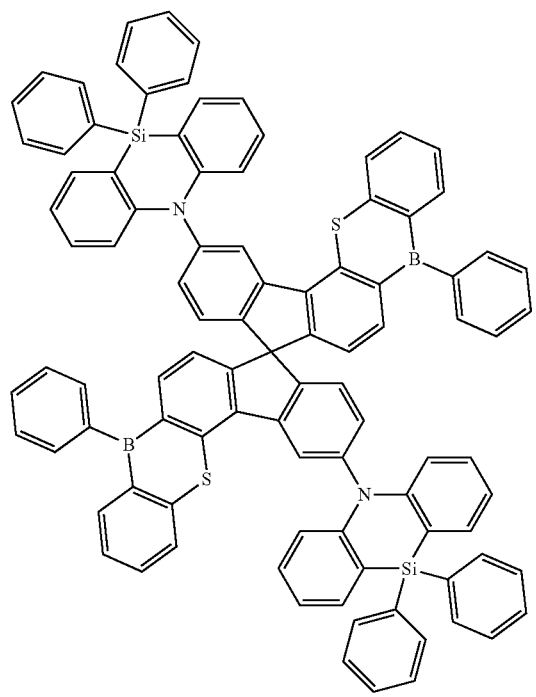
P040
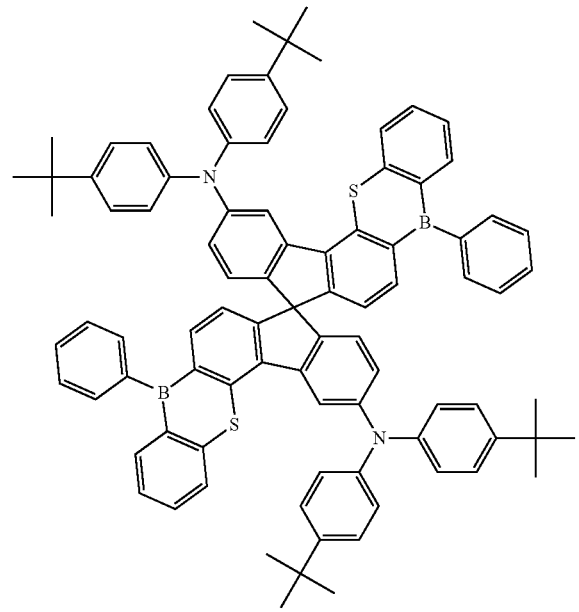
P041
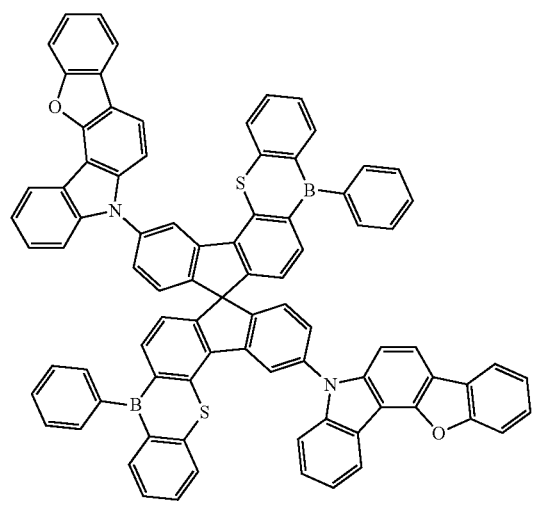
P042
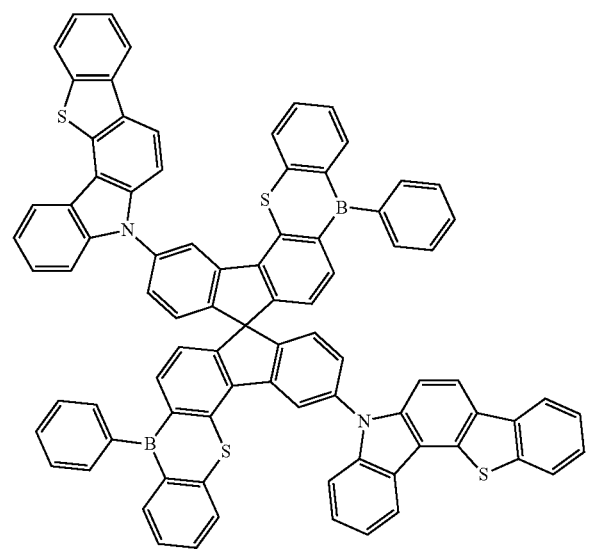

-continued
P043
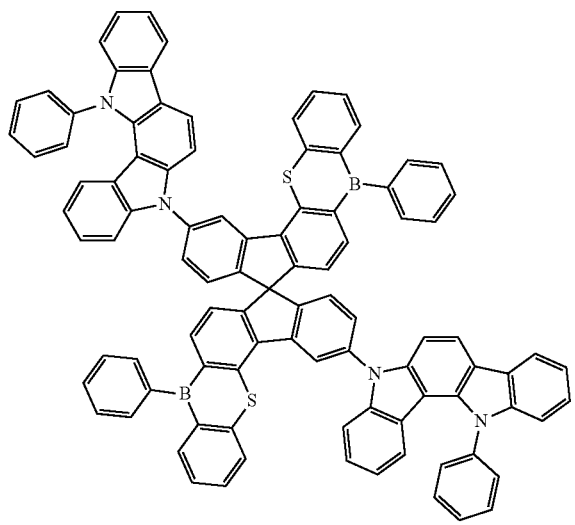
P044
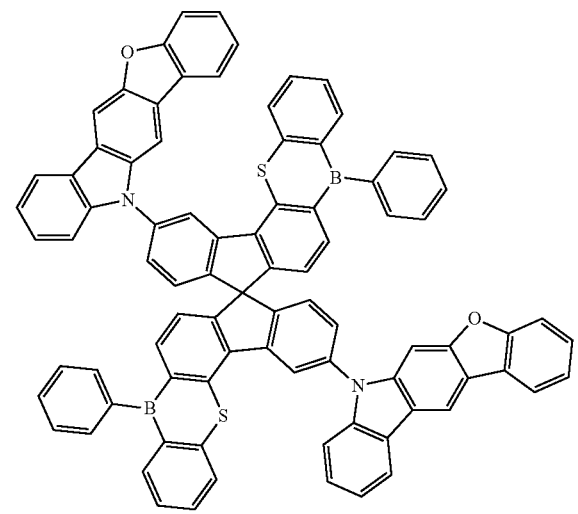
P045
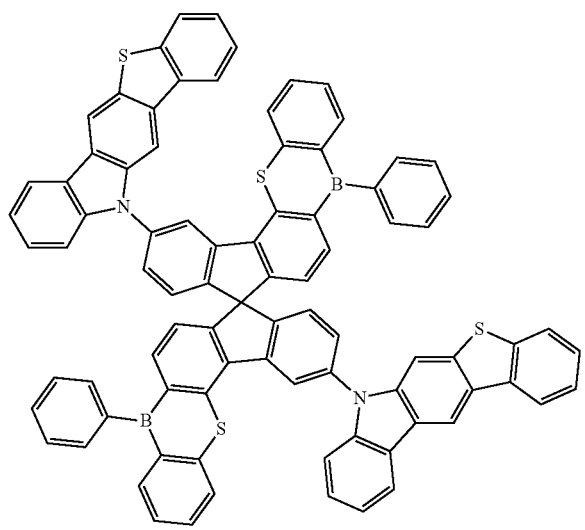
P046
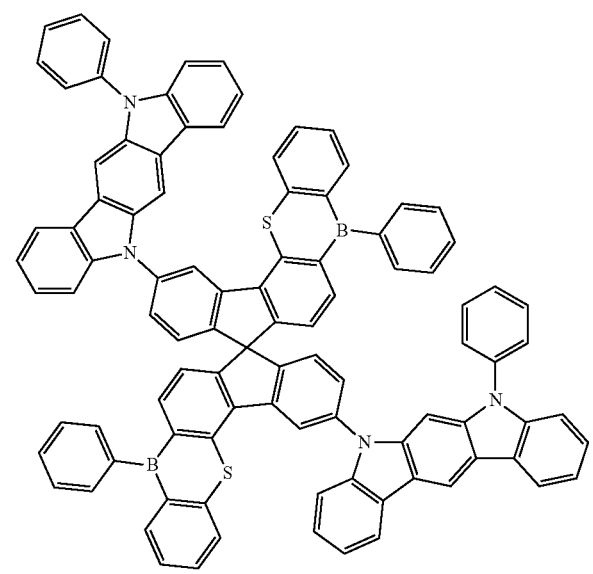

-continued
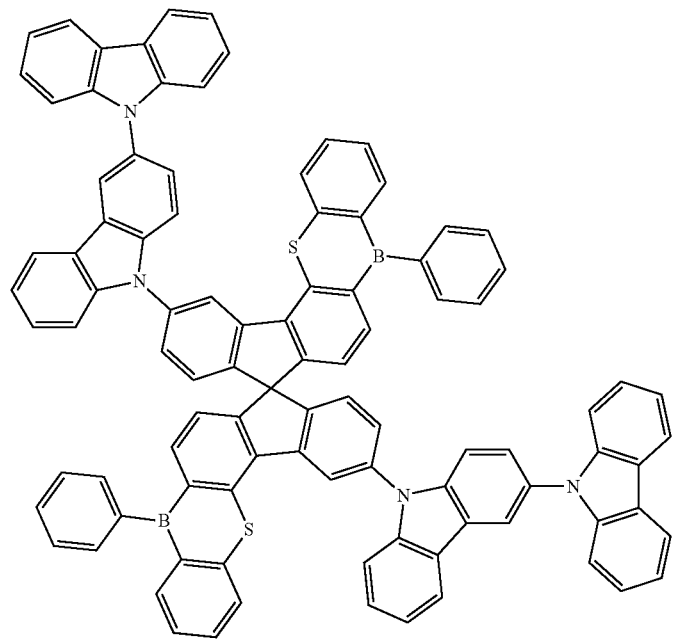
P047
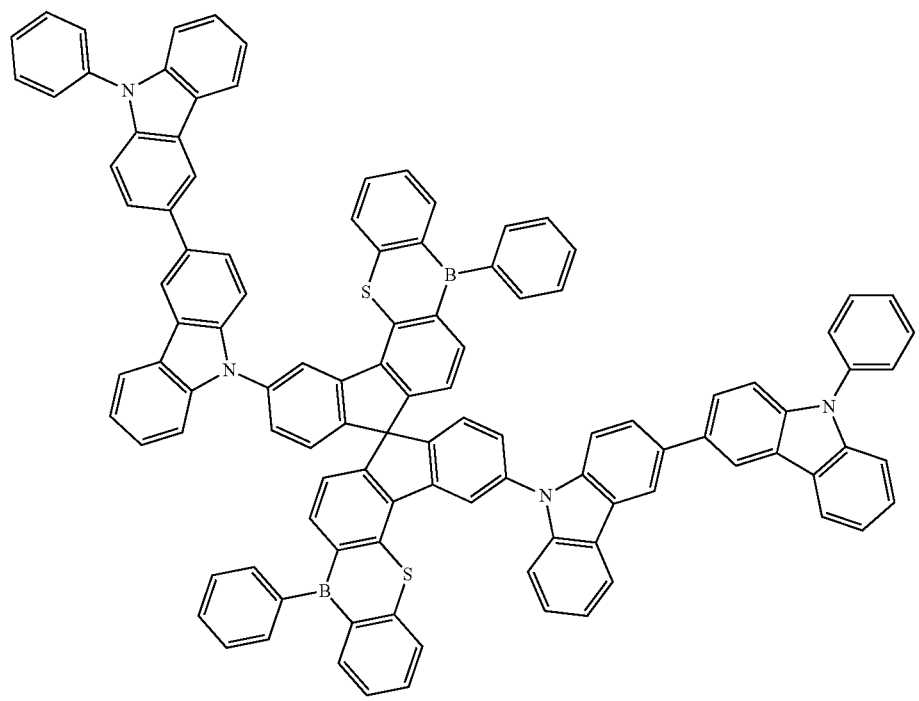
P048

-continued
P049
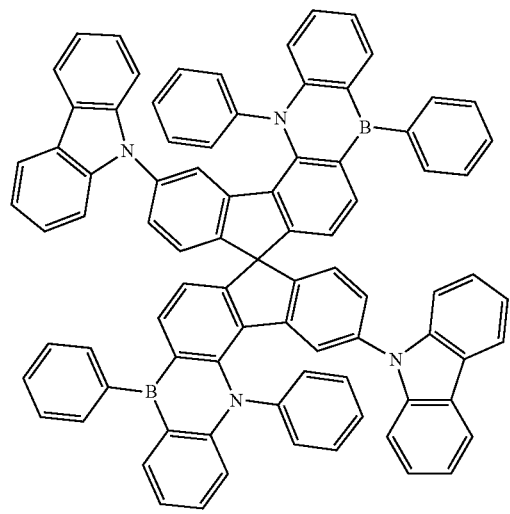
P050
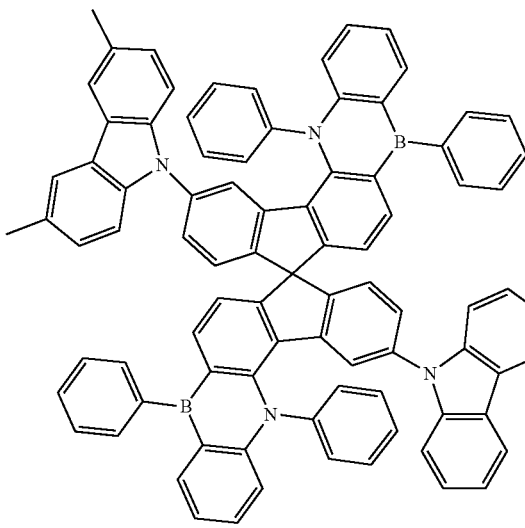
P052
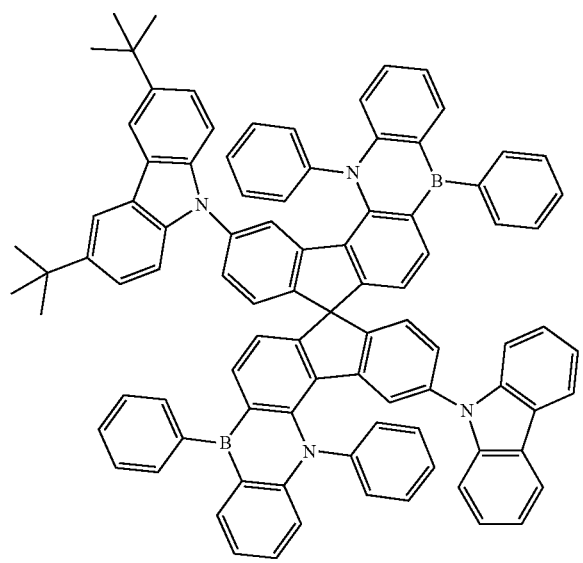
P051
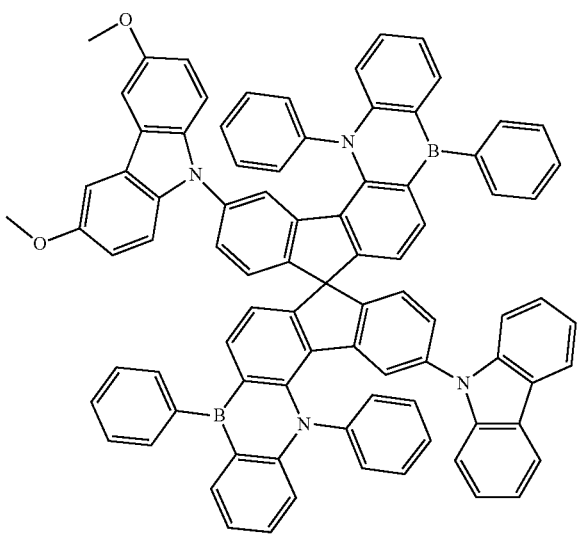
P053
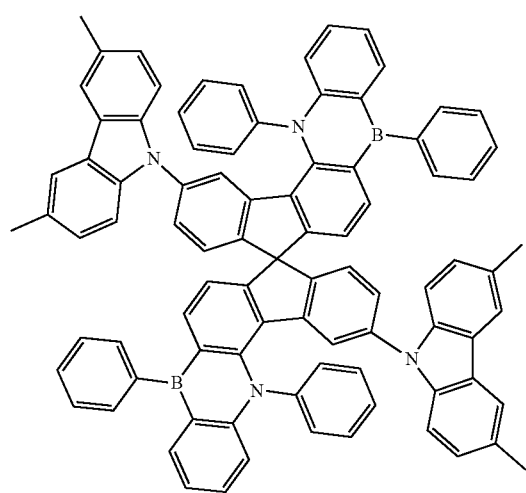
P054
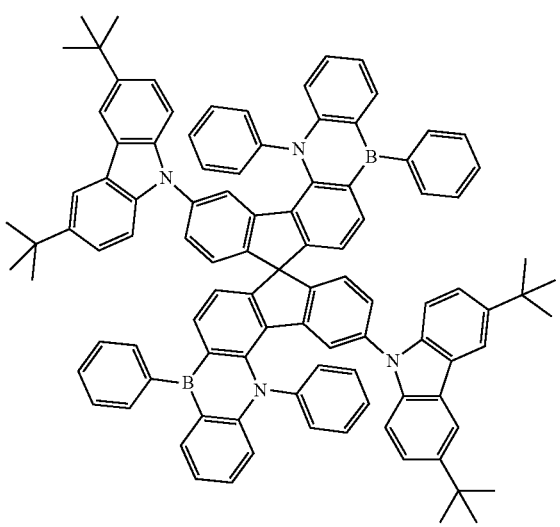

-continued
P055
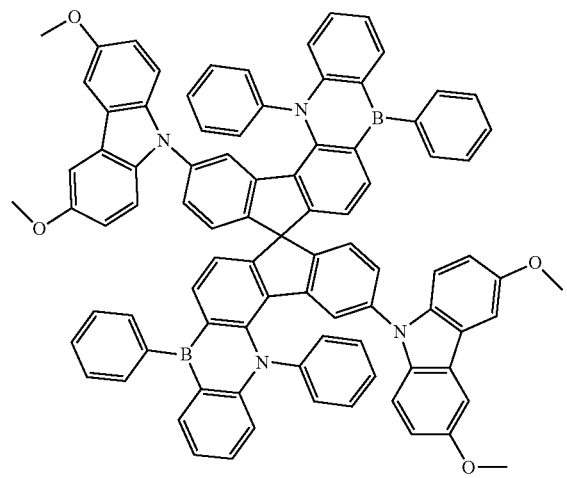
P056
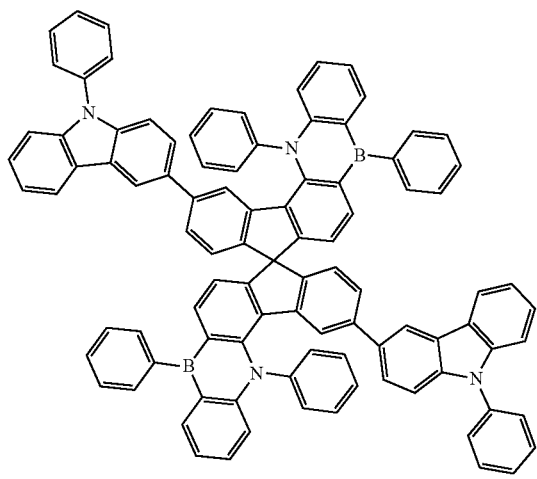
P057
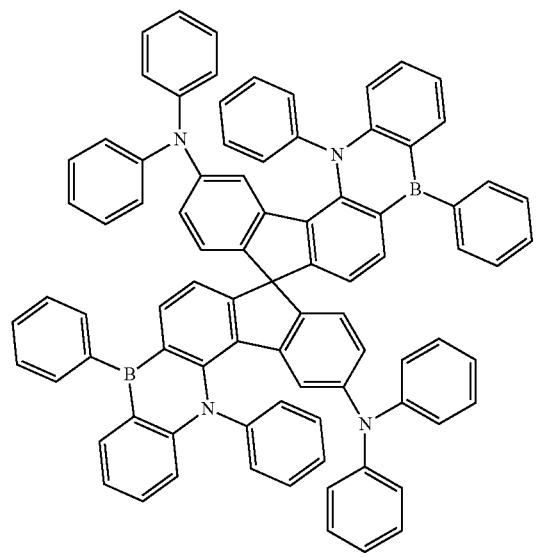
P058
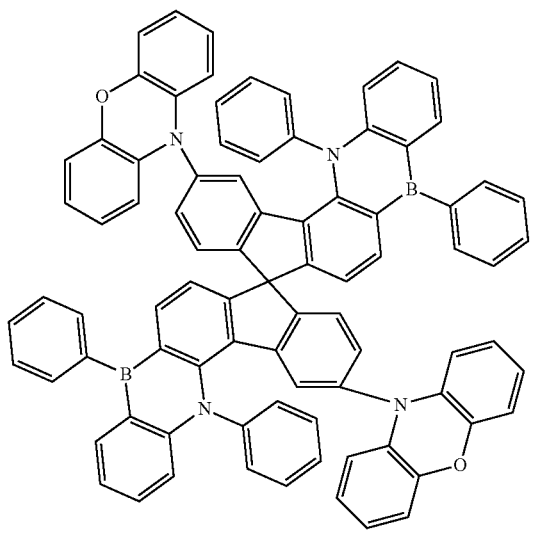
P059
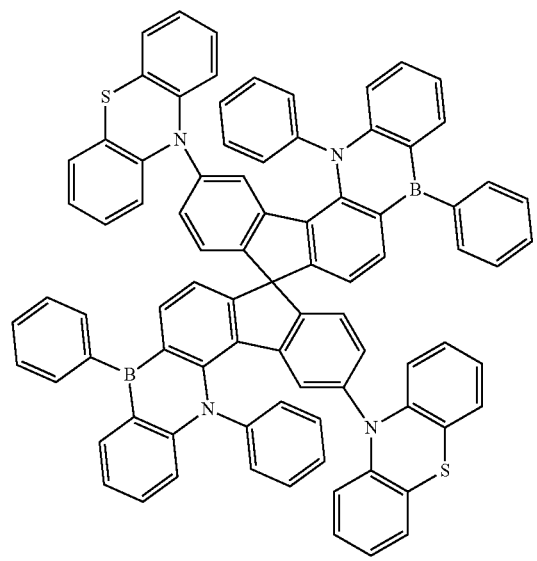
P060
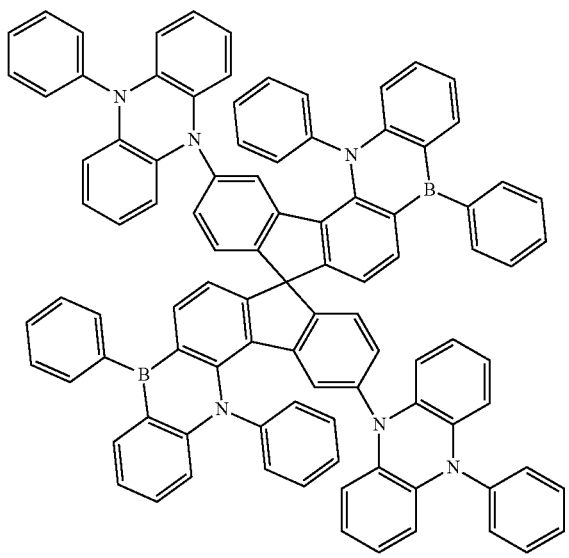

-continued
P062
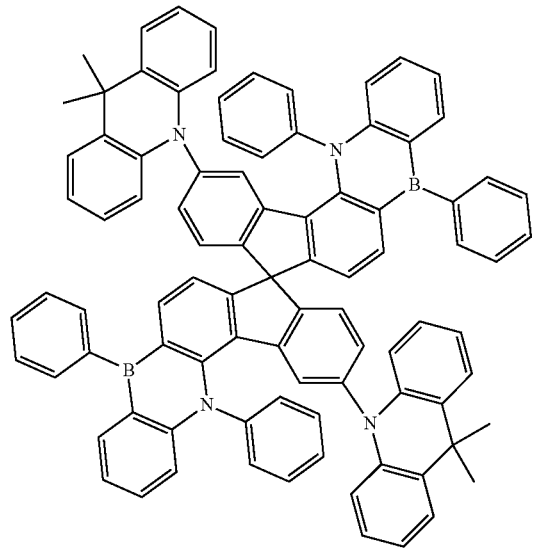
P063
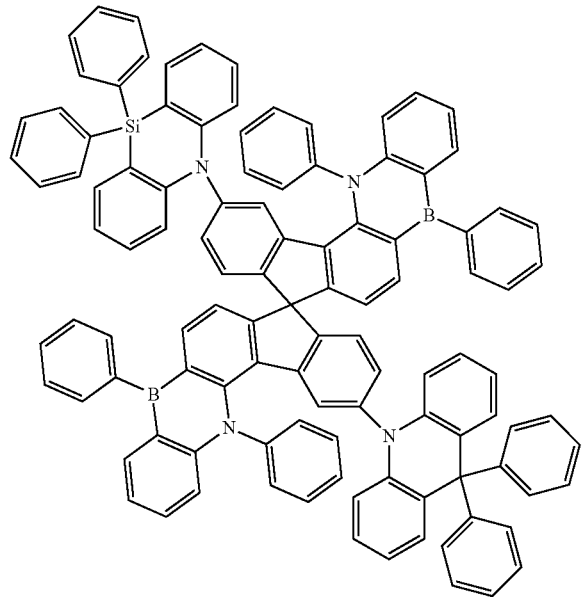
P064
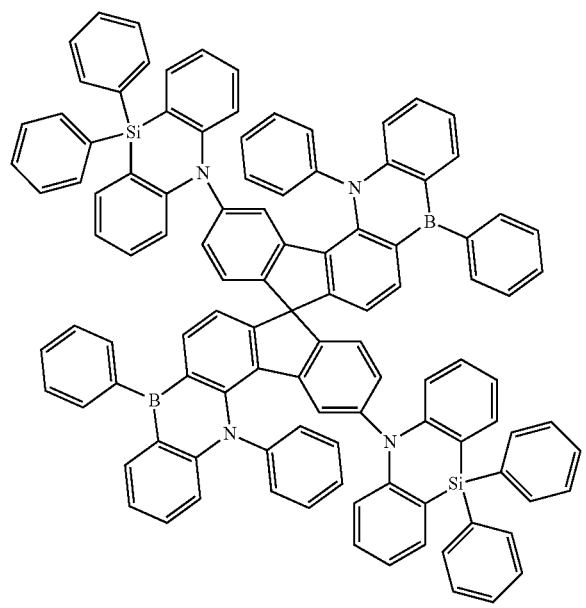
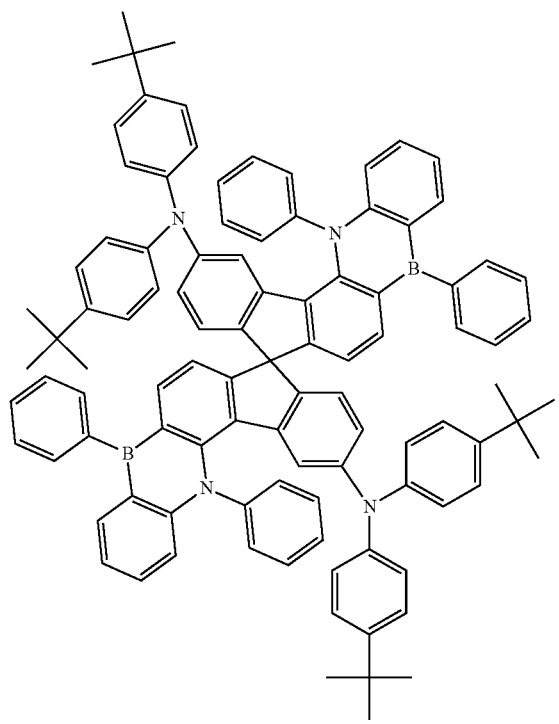

-continued
P065
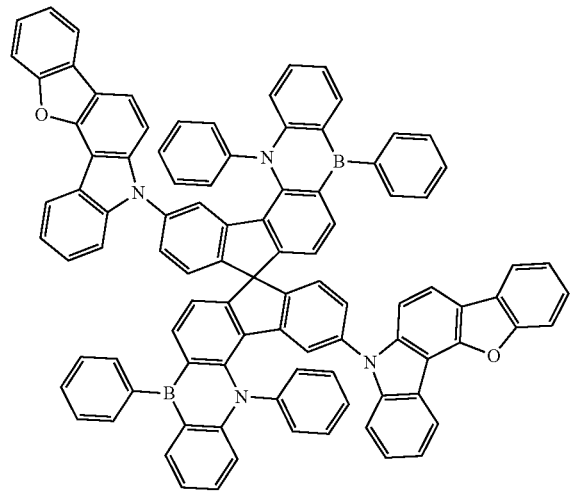
P066
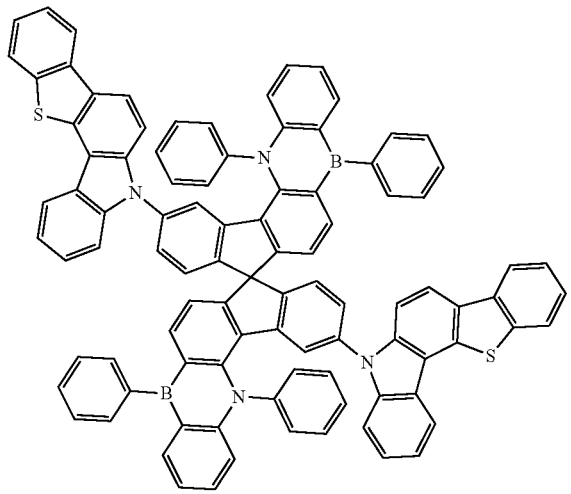
P067
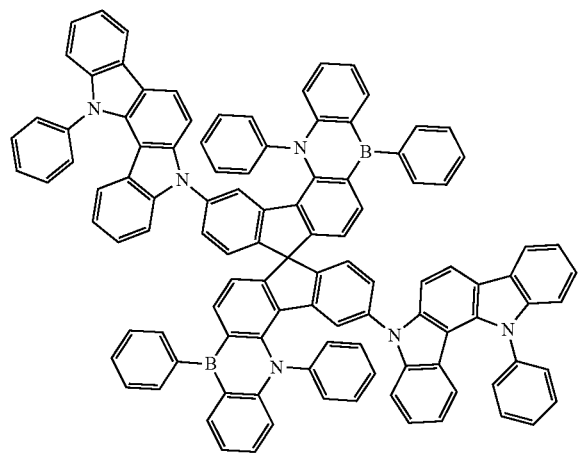
P068
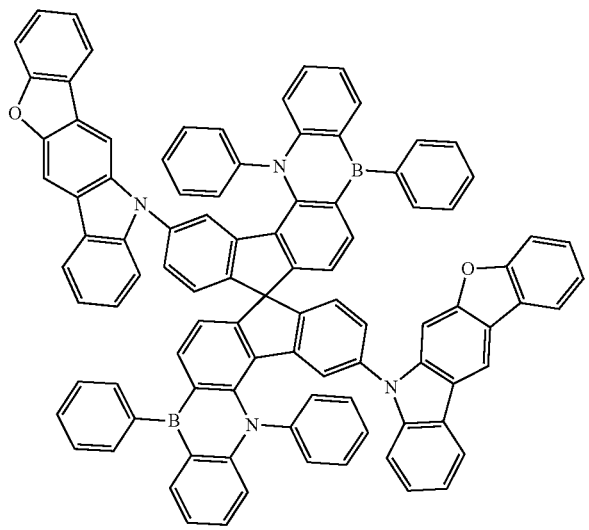
P069
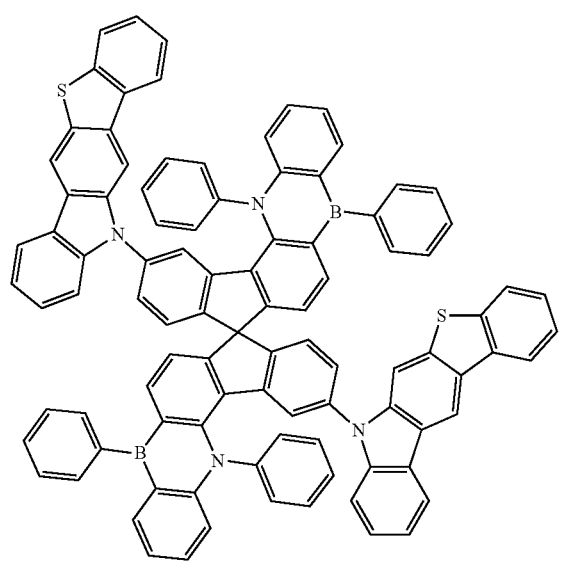
P070
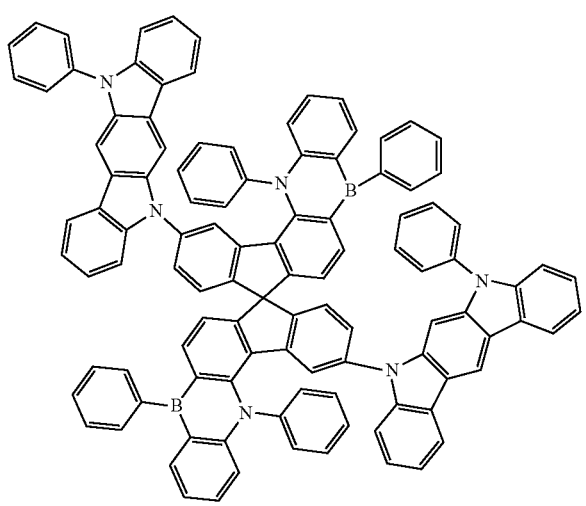

P071
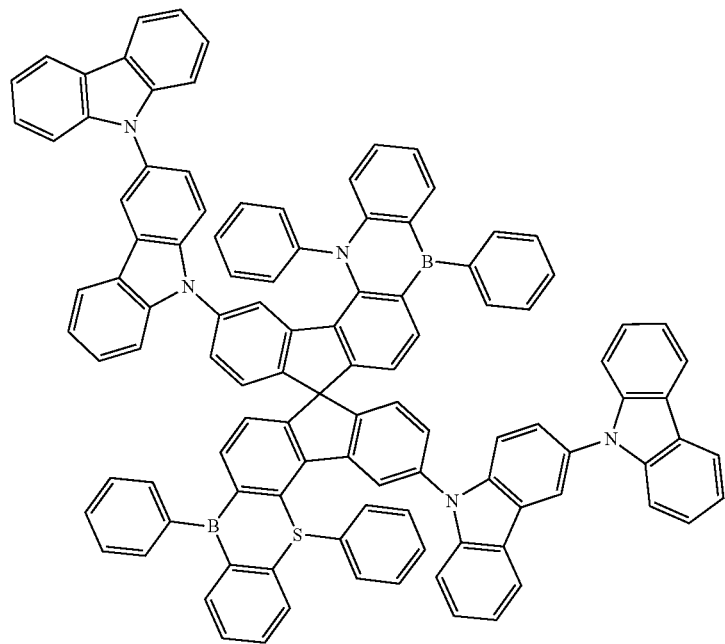
P072
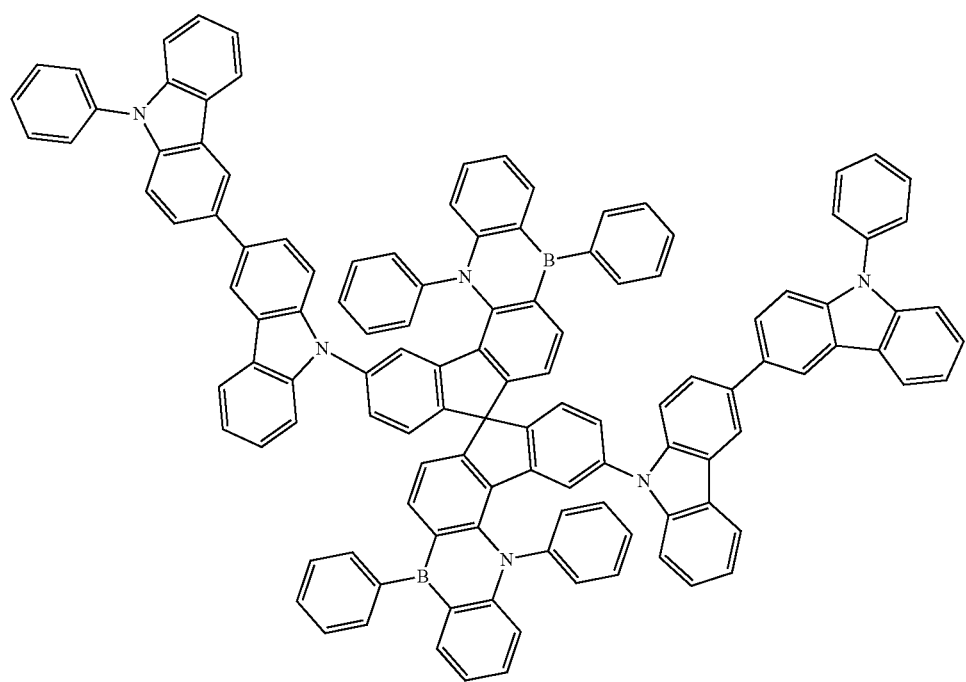

P073 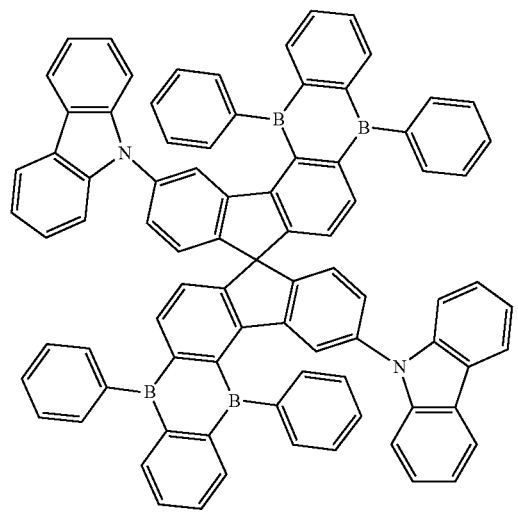
P074 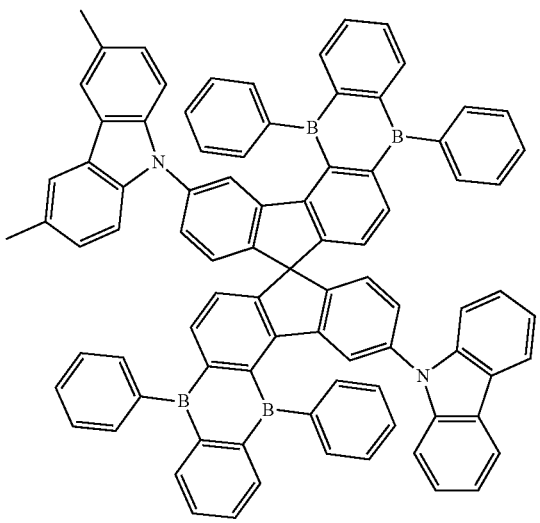
P075 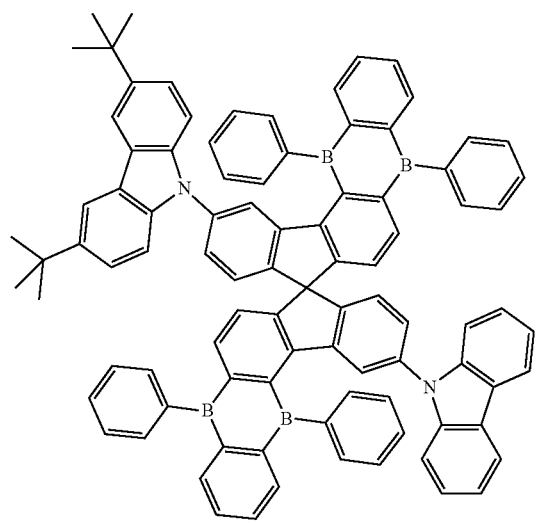
P076 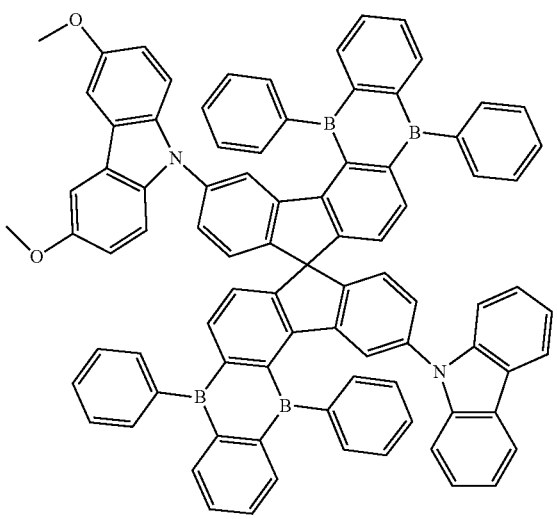
P077 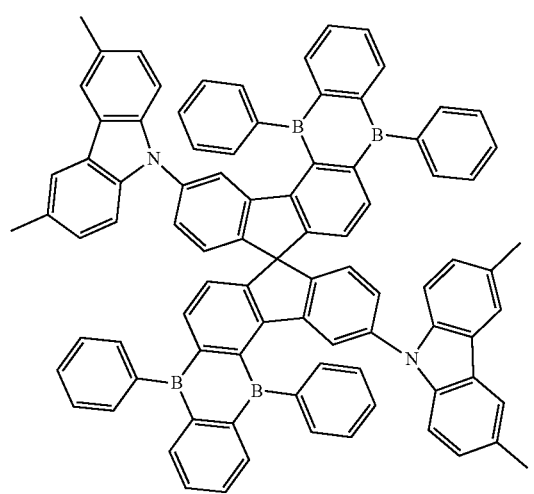
P078 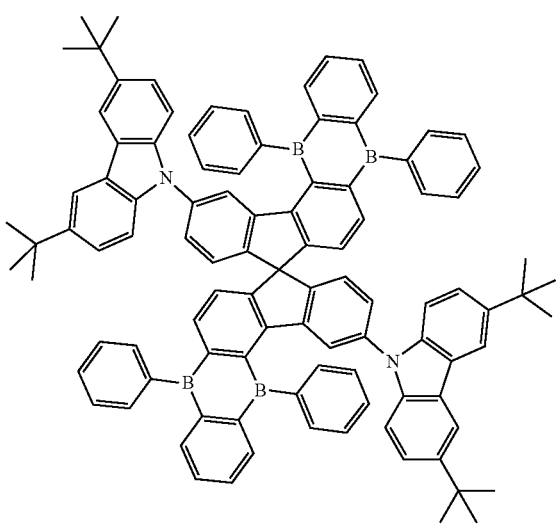

-continued
P079
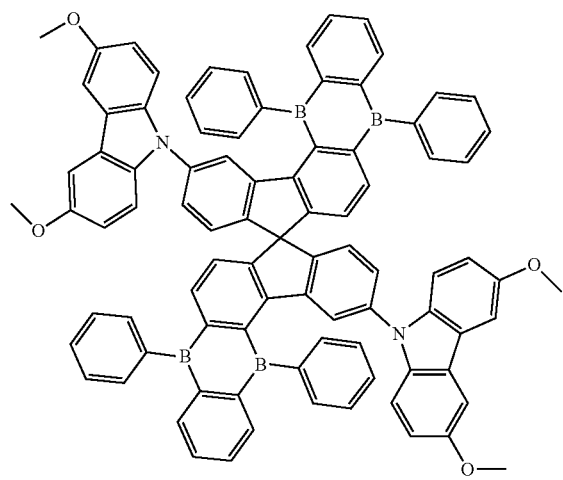
P080
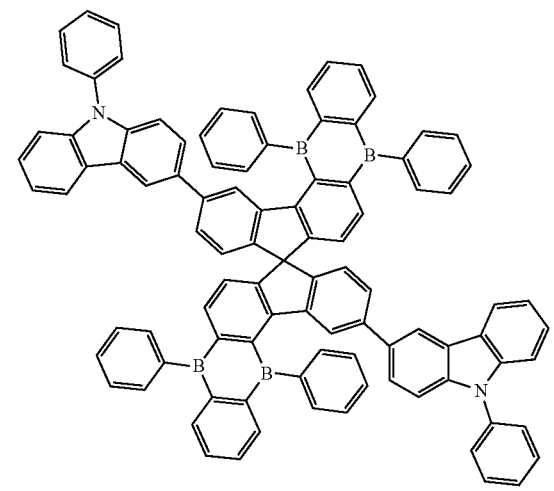
P081
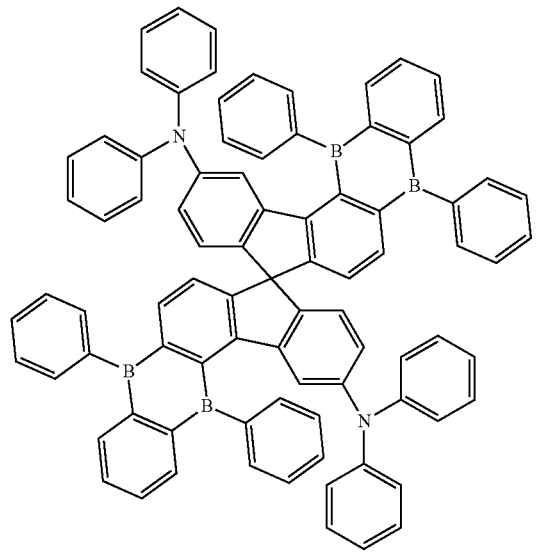
P082
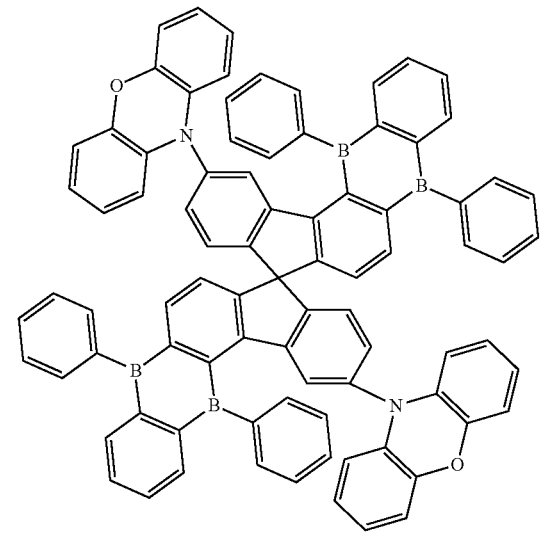
P083
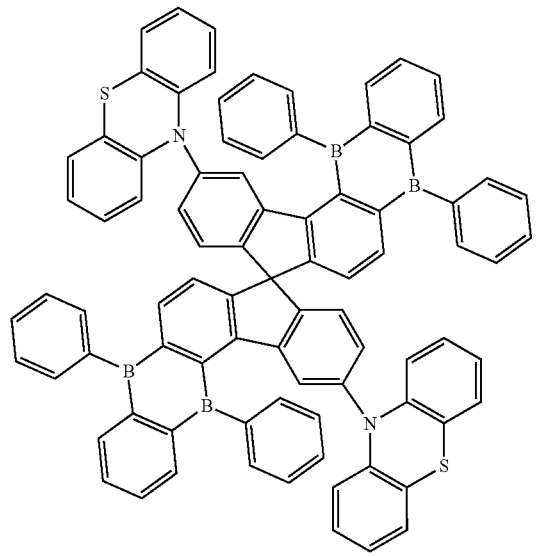
P084
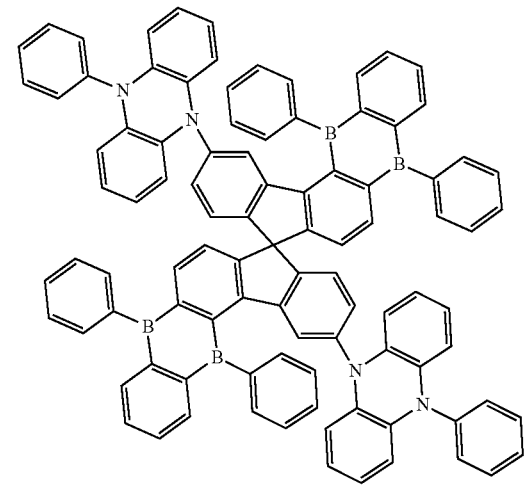

-continued
P085
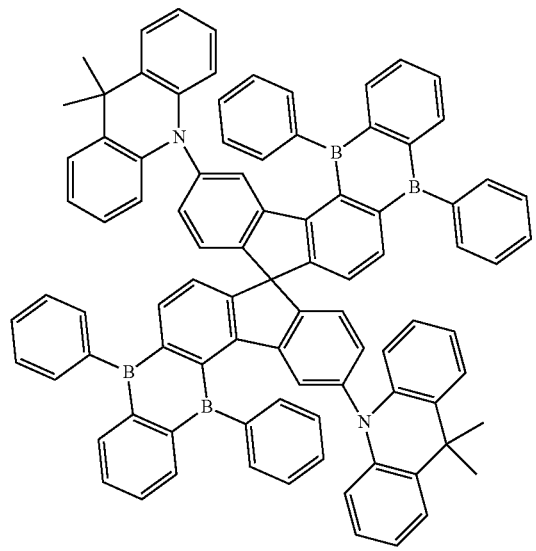
P086
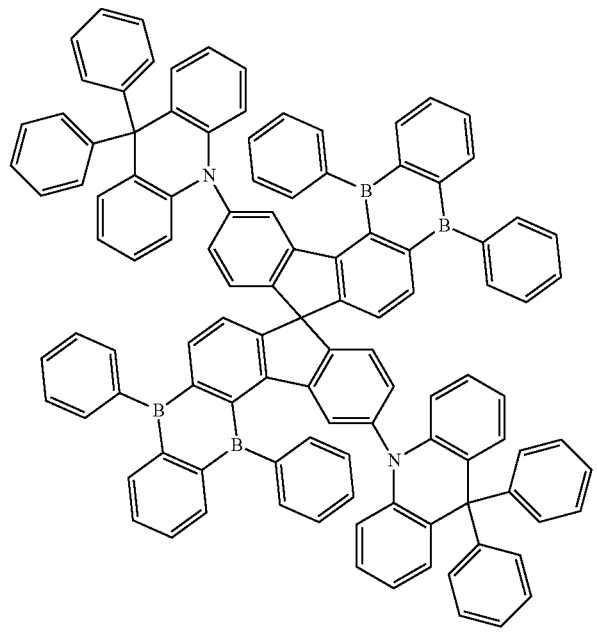
P087
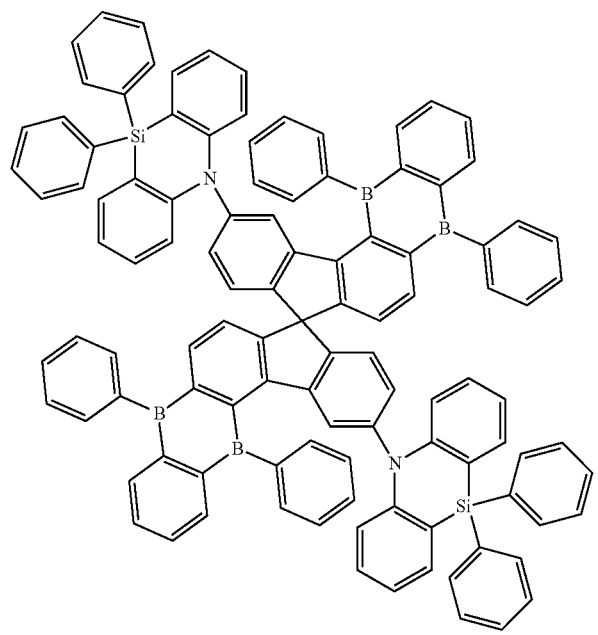
P088
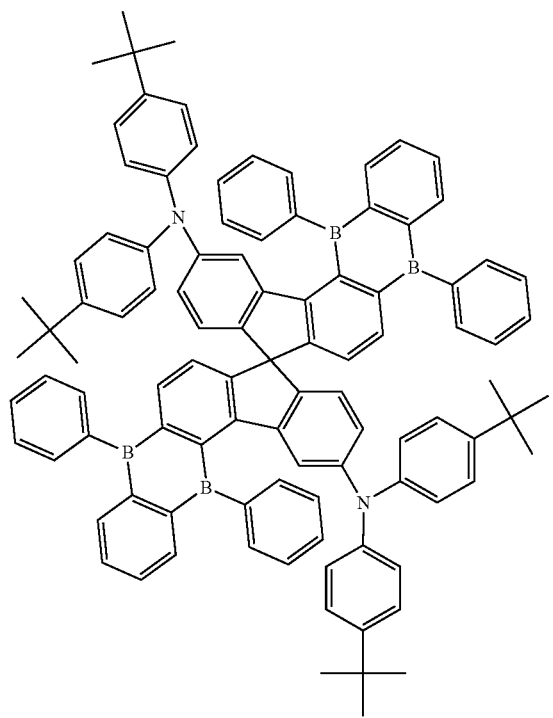

-continued
P089
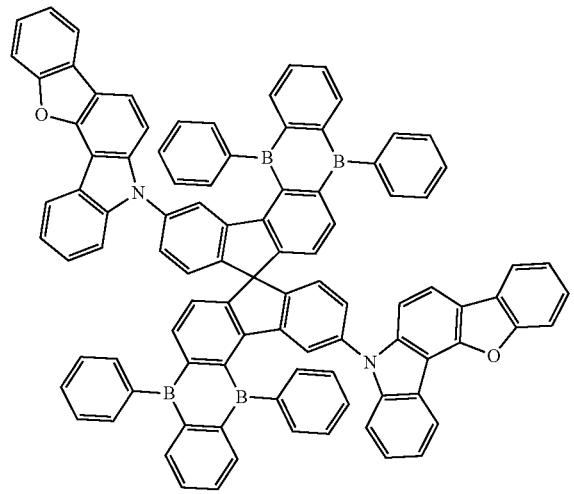
P090
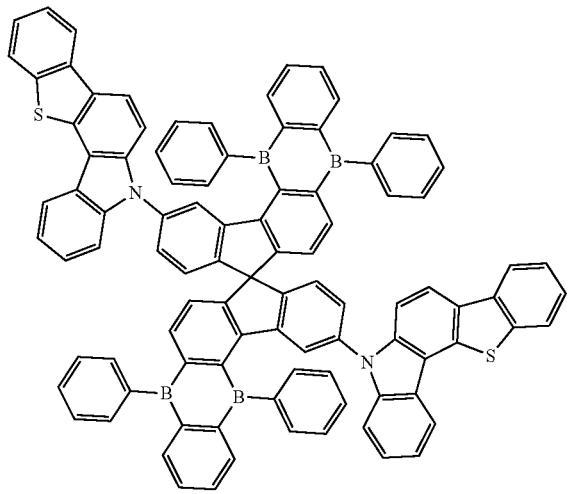
P091
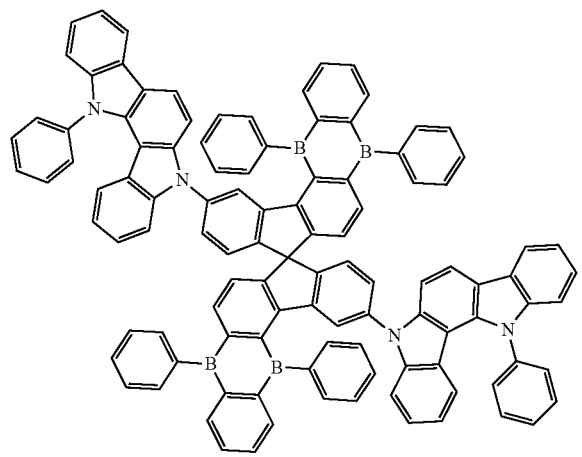
P092
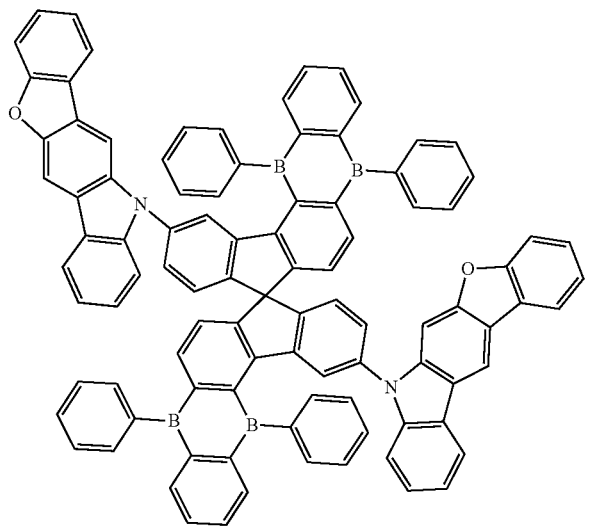
P093
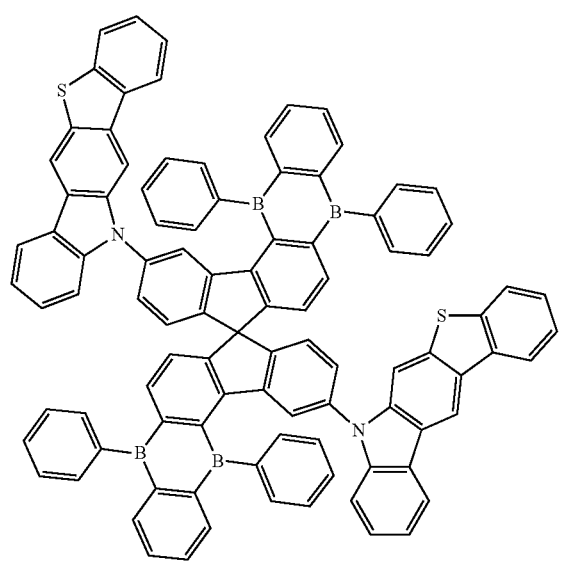
P094
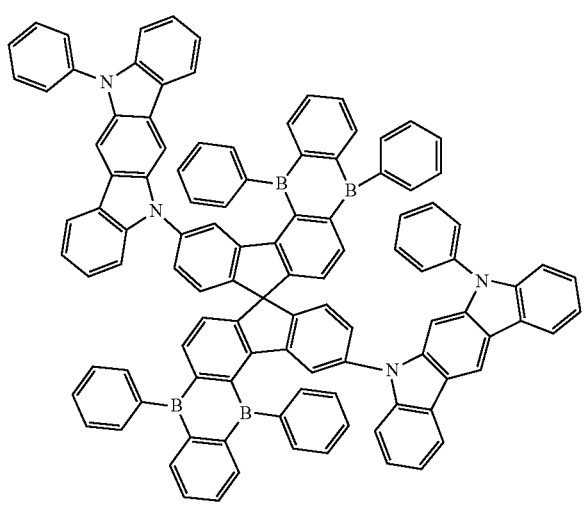

P095

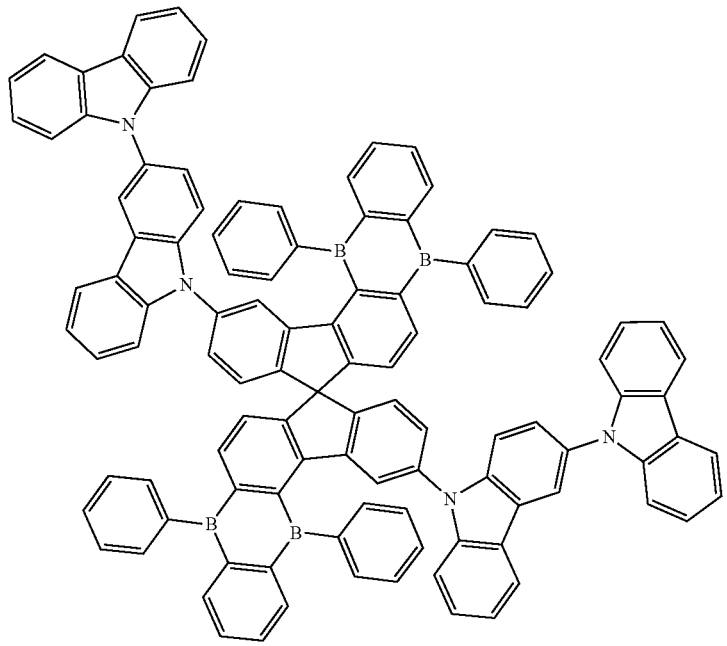

P096

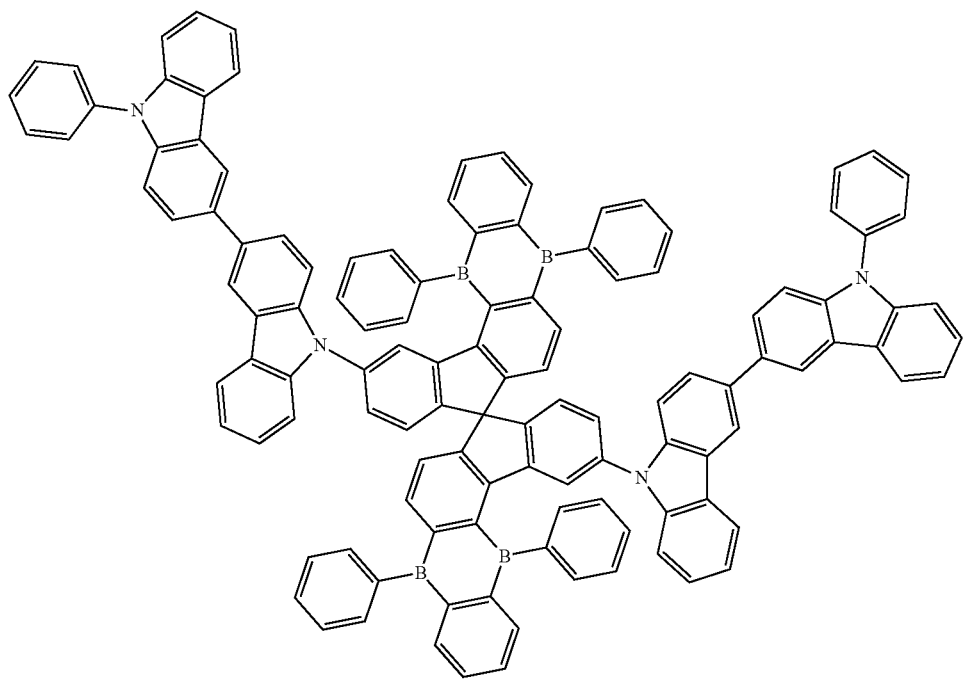

In a specific embodiment, difference between the singlet state energy level and triple state energy level of the compound is $\Delta E_{st}$, which is equal to $E_{S1}-E_{T1}$ and less than or equal to 0.30 eV, such as 0.2 eV, 0.21 eV, 0.22 eV, 0.23 eV, 0.24 eV, 0.25 eV, 0.26 eV, 0.27 eV, 0.28 eV, 0.29 eV, etc.

In a specific embodiment, the present invention provides an organic electroluminescent device, i.e., OLED device. The OLED device includes an anode, a cathode and an organic thin film layer disposed between the anode and the cathode. The organic thin film layer includes a light-emitting layer, and the light-emitting layer includes at least one compound represented by Formula I.

A second object of the present invention is to provide a display panel. The display device includes an OLED device. The OLED device includes an anode, a cathode and an organic thin film layer disposed between the anode and the cathode. The organic thin film layer includes a light-emitting layer.

The light-emitting layer includes the compound described in the first object.

The compound of Formula I provided by the present invention is applied to the OLED device of the display panel, and as the light-emitting layer material, can enable the device have high luminescence efficiency, low drive voltage and long device service life.

In an embodiment, the compound described in the first object of the present invention is used as any one of a host material, a doped material or a co-doped material of the light-emitting layer.

In an embodiment, the organic thin film layer includes any one or a combination of at least two of a hole transport layer (HTL), a hole injection layer (HIL), an electron blocking layer (EBL), a hole blocking layer (HBL), an electron transport layer (ETL) or an electron injection layer (EIL).

In an embodiment, the anode material can be selected from metals such as copper, gold, silver, iron, chromium, nickel, manganese, palladium, platinum, and alloys thereof. The anode material can also be selected from metal oxides such as indium oxide, zinc oxide, indium tin oxide (ITO), indium zinc oxide (IZO), etc. The anode material can also be selected from conductive polymers such as polyaniline, polypyrrole, poly (3-methylthiophene), etc. In addition, other than those listed above, the anode material may also be selected from materials facilitating hole injection and combinations thereof, including known materials suitable for the anode.

In an embodiment, the cathode material can be selected from metals such as aluminum, magnesium, silver, indium, tin, titanium and alloys thereof. The cathode material can also be selected from multi-layer metal materials such as LiF/Al, $LiO_2$/Al, $BaF_2$/Al, etc. Other than those listed above, the cathode material may also be selected from materials facilitating electron injection and combinations thereof, including known materials suitable for the cathode.

In an embodiment, the light-emitting layer includes a host material and a guest material. The host material is selected from any one or more of 2,8-bis(diphenylphosphinyl)dibenzothiophene, 4,4'-bis(9-carbazole)biphenyl, 3,3-bis(N-carbazolyl)-1,1'-biphenyl, 2,8-bis(diphenylphosphine)dibenzofuran, bis(4-(9H-carbazolyl-9-yl)phenyl)diphenylsilane, 9-(4-tert-butylphenyl)-3,6-bis(triphenyisilyl)-9H-carbazole, bis(2-diphenylphosphine oxide)diphenylether, 1,3-bis[3,5-bis(pyridin-3-yl)phenyl]benzene, 4,6-bis(3,5-di(3-pyridine)yl-phenyl)-2-methylpyrimidine, 9-(3-(9H-carbazolyl-9-yl)phenyl)-9H-carbazole-3-cyan, 9-phenyl-9-[4-(triphenylsilyl)phenyl]-9H-fluorene, 1,3,5-tri(1-phenyl-1H-benzimidazole-2-yl)benzene, diphenyl[4-(triphenylsilyl)phenyl]oxyphosphine, 4',4',4''-tri(carbazole-9-yl)triphenylamine, 2,6-dicarbazole-1,5-pyridine, polyvinylcarbazole and polyfluorene. The guest material can be selected from any one or more of a fluorescent material, a phosphorescent material, a thermally activated delayed fluorescence material and an aggregation-induced emission material.

In an embodiment, the hole injection material, the hole transport material and the electron blocking material may be selected from a materials such as 2,2'-dimethyl-N,N'-di-1-naphthyl-N,N'-diphenyl[1,1'-biphenyl]-4,4'-diamine (α-NPD), 4',4',4''-tris(carbazole-9-yl)triphenylamine (TCTA), 1,3-dicarbazole-9-ylbenzene (mCP), 4,4'-bis(9-carbazole)biphenyl (CBP), 3,3'-bis(N-carbazolyl)-1,1'-biphenyl (mCBP), 2,3,6,7,10,11-hexacyano-1,4,5,8,9,12-hexaazatriphenylene (HATCN), 4,4'-cyclohexylbis[N,N-bis(4-methylphenyl)aniline (TAPC), N,N'-diphenyl-N,N'-(1-naphthyl)-1,1'-biphenyl-4,4'-diamine ((α-NPB), N,N-bis (naphthalene-2-yl)-N,N'-bis(phenyl)biphenyl-4,4'-diamine (NPB), poly(3,4-ethylenedioxythiophene)-polystyrenesulfonic acid (PEDOT:PSS), polyvinylcarbazole (PVK), 9-phenyl-3,9-bicarbazole (CCP), and molybdenum trioxide ($MoO_3$), but are not limited thereto.

In an embodiment, the hole blocking material, the electron transport material and the electron injection material may be selected from a materials such as 2,8-bis(diphenylphosphinyl)dibenzothiophene (PPT), $TSPO_1$, 1,3,5-tris(1-phenyl-1H-benzimidazole-2-yl)benzene (TPBi), 2,8-bis(diphenylphosphine) dibenzofuran (PPF), bis(2-diphenylphosphine oxide)diphenyl ether (DPEPO), lithium fluoride (LiF), 4,6-bis(3,5-bis(3-pyridine)ylphenyl)-2-methylpyrimidine (B3PYMPM), 4,7-diphenyl-1,10-phenanthroline (Bphen), 1,3,5-tris[(3-pyridyl)-3-phenyl]benzene (TmPyBP), tris[2,4,6-trimethyl-3-(3-pyridyl)phenyl]borane (3TPYMB), 1,3-bis(3,5-bipyridin-3-ylphenyl) benzene (B3PYPB), 1,3-bis[3,5-bis(pyridin-3-yl)phenyl]benzene (BMPYPHB), 2,4,6-tris(biphenyl-3-yl)-1,3,5-triazine (T2T), diphenylbis[4-(pyridin-3-yl)phenyl] silane (DPPS), cesium carbonate ($Cs_2O_3$), bis(2-methyl-8-hydroxyquinoline-N1,O8)-(1,1'-biphenyl-4-hydroxy)aluminum (BALq), 8-hydroxyquinoline-lithium (Liq), and tris(8-hydroxyquinoline)aluminum ($Alq_3$), but are not limited thereto.

In the embodiments of the present invention, the organic electroluminescent device may be prepared by the following method: forming an anode on a transparent or opaque smooth substrate, forming an organic thin film layer on the anode, and forming a cathode on the organic thin film layer. The organic thin film layer can be formed by a known film formation method such as evaporation, sputtering, spin coating, dipping, and ion plating.

A third object of the present invention is to provide a display device. The display device includes the display panel described in the second object.

The synthesis method of the compound represented by Formula I provided by the present invention is as follows: (1) preparing a boron-containing spiro intermediate; (2) preparing an intermediate with a boron-containing spiro ring having a halogen active reaction group as a core structure through a halogenation reaction; (3) and reacting with an electron-donating unit through a suzuki coupling reaction or buchward coupling reaction or stille coupling reaction to give the compound represented by Formula I.

The present invention provides several exemplary methods for preparing the compound. In the following preparation examples, synthetic methods for intermediates and compounds of the present invention are exemplarily described.

Preparation example 1
Synthesis of Compound P001:
Synthesis of intermediate X3:

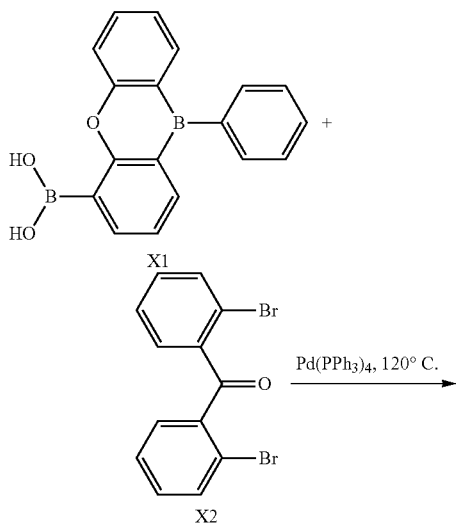

-continued

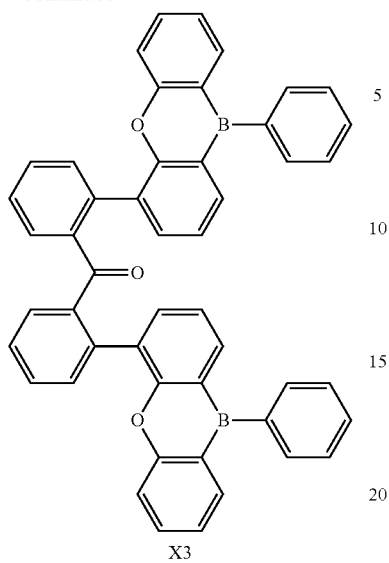

X3

-continued

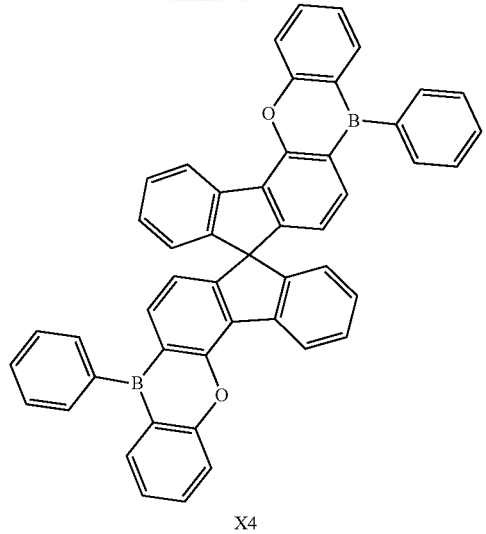

X4

Under nitrogen atmosphere, X1 (21 mmol), X2 (10 mmol) and Pd(PPh$_3$)$_4$ (0.5 mmol) were added to 250 mL of anhydrous toluene, deoxygenated for 10 minutes, and then heated to 120° C. for 24 hours. After the reaction is finished, the above mixture was cooled to room temperature and filtered with suction by using a pad of Celite. The filtrate was collected and added with Dichloromethane (DCM) and H$_2$O for extraction. The collected organic phase was dried over anhydrous Na$_2$SO$_4$. The filtrate was collected by suction filtration, and the solvent was removed by rotation. The crude product was recrystallized to give the intermediate product X3 (8.5 mmol, 85%). The intermediate product X3 was confirmed by mass spectrum verification, and put into the next step.

Intermediate X3: LC-MS: m/z: calculation value: C$_{49}$H$_{32}$B$_2$O$_3$: 690.4, actual measured value: 689.9.

Synthesis of intermediate X4:

The intermediate X3 (10 mmol) was added to 40 mL of methanesulfonic acid, heated at 120° C. and reacted overnight. After the reaction was finished, the above mixture was cooled to room temperature. The cooled solution was added to water. DCM was added for extraction. The organic phase was collected and dried over anhydrous Na$_2$SO$_4$. The filtrate was collected by suction filtration, the solvent was removed by rotation, and column chromatography purification was performed to give the intermediate X4 (7.8 mmol, 78%).

Intermediate X4: LC-MS: m/z: calculation value: C$_{49}$H$_{30}$B$_2$O$_2$: 672.4, actual measured value: 671.6.

Intermediate X$_4$: $^1$H NMR (400 MHz, CDCl$_3$): δ=8.02 (d, 2H), 7.67-7.59 (m, 14H), 7.46-7.30 (m, 10H), 7.25 (d, 2H), 7.20-7.17 (m, 2H).

Synthesis of intermediate X5:

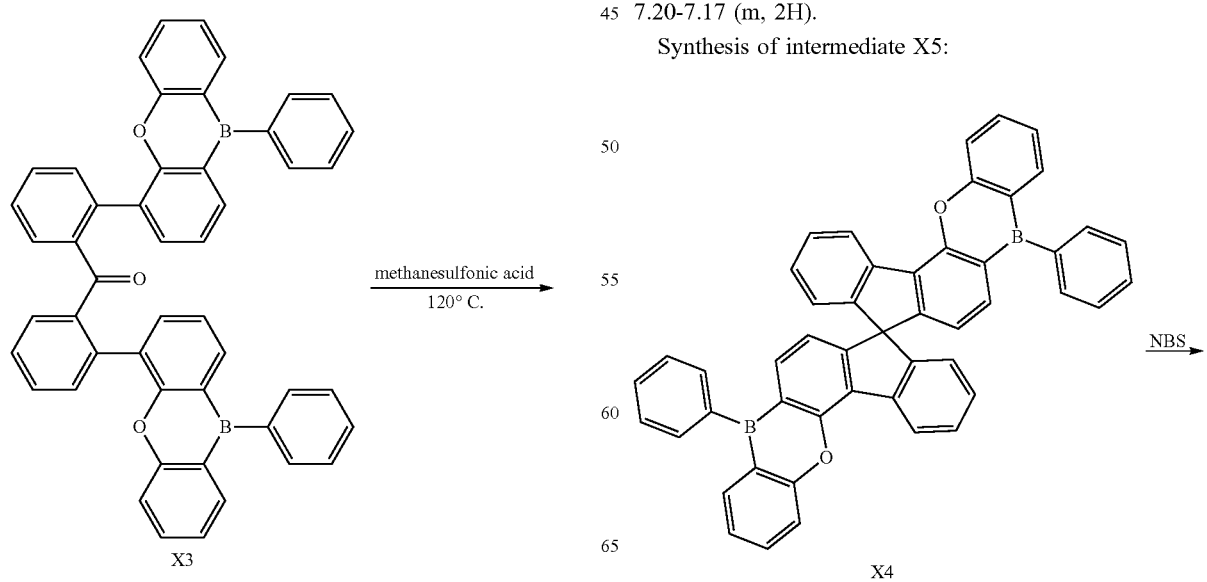

-continued

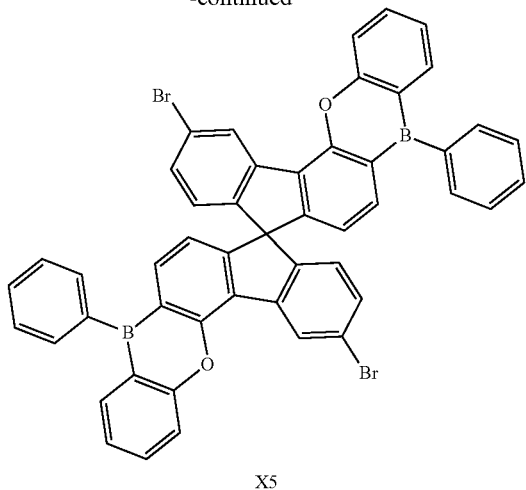

X5

100 mL of chloroform solvent was added to a 250 mL reaction flask, and the intermediate X4 (10 mmol) was added. After the intermediate X4 was dissolved, N-bromosuccinimide (NBS) (22 mmol) was added and reacted at room temperature for 6 hours. After the reaction was finished, the above mixture was poured into H$_2$O for extraction. The collected organic phase was dried over anhydrous Na$_2$SO$_4$. The filtrate was collected by suction filtration, the solvent was removed by rotation and column chromatography purification was performed to give the intermediate X5 (7.2 mmol, 72%). The intermediate X5 was dried in a vacuum oven for the next reaction.

Intermediate X5: LC-MS: m/z: calculation value: C$_{49}$H$_{28}$Br$_2$O$_2$: 830.2, actual measured value: 829.7.

$^1$H NMR (400 MHz, CDCl$_3$): δ=8.10 (d, 2H), 7.71-7.63 (m, 8H), 7.60-7.49 (m, 6H), 7.46-7.29 (m, 8H), 7.25-7.13 (m, 4H).

Synthesis of Compound P001:

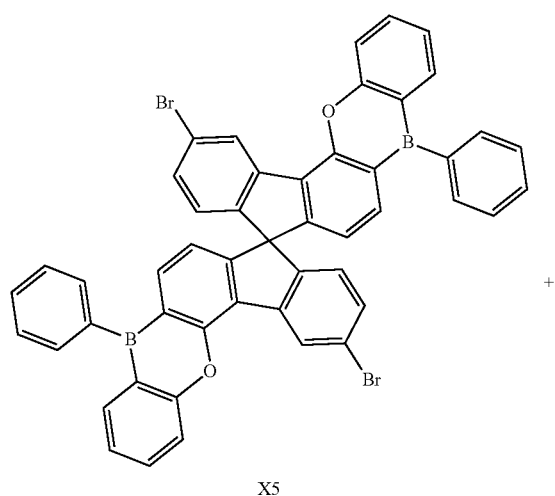

X5

+

-continued

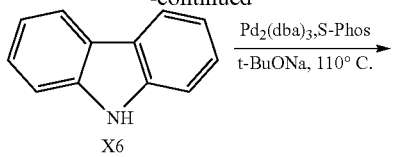

X6

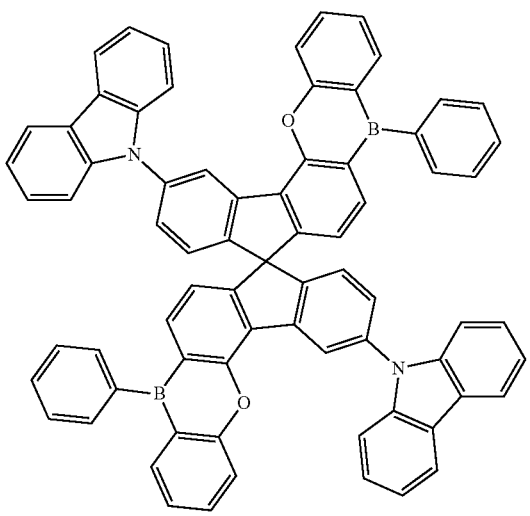

P001

Under nitrogen atmosphere, intermediate reactants X5 (5 mol) and X6 (11 mmol), sodium tert-butoxide (12.5 mmol), Pd$_2$(dba)$_3$ (0.25 mmol), and 2-dicyclohexylphosphino-2',6'-dimethoxybiphenyl (S-Phos, 0.75 mmol) were added to 100 mL of anhydrous toluene solvent in sequence. The above mixture was heated to 110° C. and reacted overnight. After the reaction was finished, the above mixture was cooled to room temperature. DCM and H$_2$O were added for extraction. The collected organic phase was dried over anhydrous Na$_2$SO$_4$. The filtrate was collected by suction filtration, the solvent was removed by rotation and column chromatography purification was performed to give the compound P001 (4.4 mmol, 88%).

LC-MS: m/z: calculation value: C$_{73}$H$_{44}$B$_2$N$_2$O$_2$: 1002.8, actual measured value: 1002.2.

$^1$H NMR (400 MHz, CDCl$_3$) δ=8.24 (d, 2H), 8.11-8.01 (m, 4H), 7.79-7.60 (m, 12H), 7.60-7.47 (m, 12H), 7.42-7.27 (m, 6H), 7.25-7.11 (m, 4H), 7.08-6.88 (m, 4H).

Results of elemental analysis of the compound: calculation value: C$_3$H$_{44}$B$_2$N$_2$O$_2$ (%): C 87.44, H 4.42, N 2.79; actual measured value: C 87.43, H 4.41, N 2.80.

Preparation Example 2

Synthesis of Compound P008

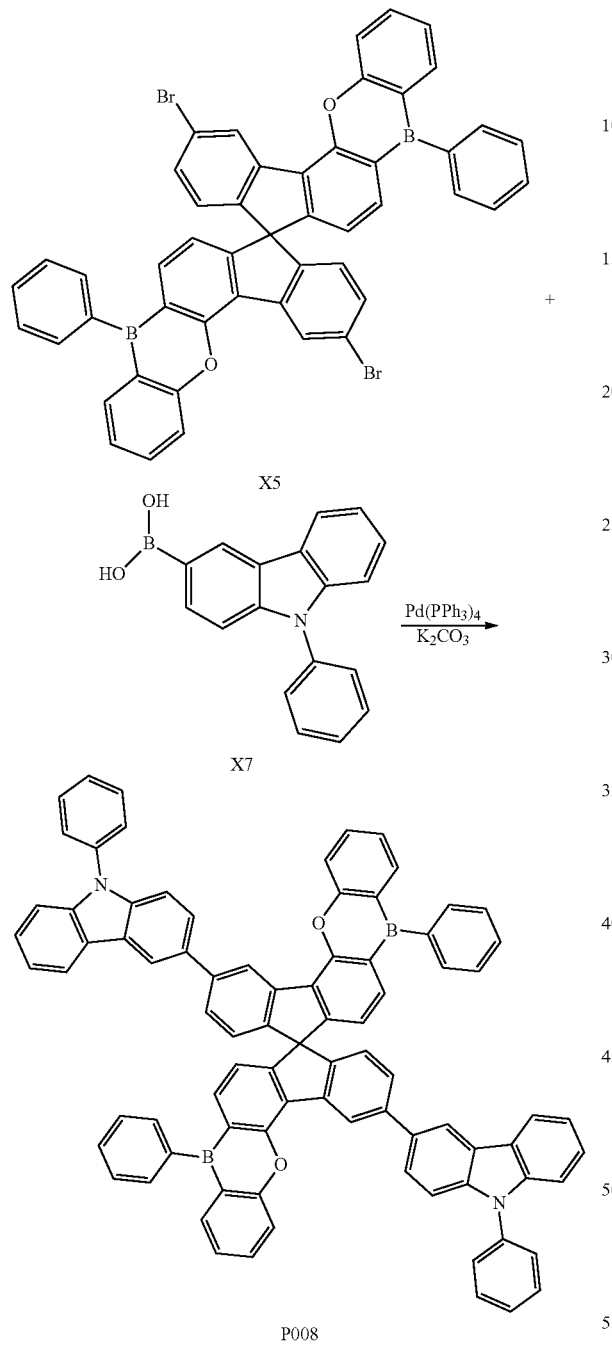

Under nitrogen atmosphere, 100 mL of 1,4-dioxane solvent was added to a 250 mL reaction flask, and K₂CO₃ (12.5 mmol), the intermediate reactants X5 (5 mol) and X7 (11 mmol) and Pd(PPh₃)₄ (0.25 mmol) were added in sequence. The above mixture was heated to 120° C. and reacted overnight. After the reaction was finished, the above mixture was cooled to room temperature. DCM and H₂O were added for extraction. The collected organic phase was dried over anhydrous Na₂SO₄. The filtrate was collected by suction filtration, the solvent was removed by rotation and column chromatography purification was performed to give the compound P008 (4.2 mmol, 84%).

LC-MS: m/z: calculation value: $C_{85}H_{52}B_2N_2O_2$: 1155.0, actual measured value: 1154.5.

¹H NMR (400 MHz, CDCl₃) δ=8.26-8.23 (m, 2H), 8.12-8.04 (m, 4H), 7.79-7.65 (m, 16H), 7.61-7.49 (m, 14H), 7.46-7.29 (m, 8H), 7.25-7.13 (m, 4H), 7.10-6.89 (m, 4H).

Results of elemental analysis of the compound: calculation value: $C_{85}H_{52}B_2N_2O_{22}$(%): C 88.39, H 4.54, N 2.43; actual measured value: C 88.37, H 4.53, N 2.44.

Preparation Example 3

Synthesis of Compound P013

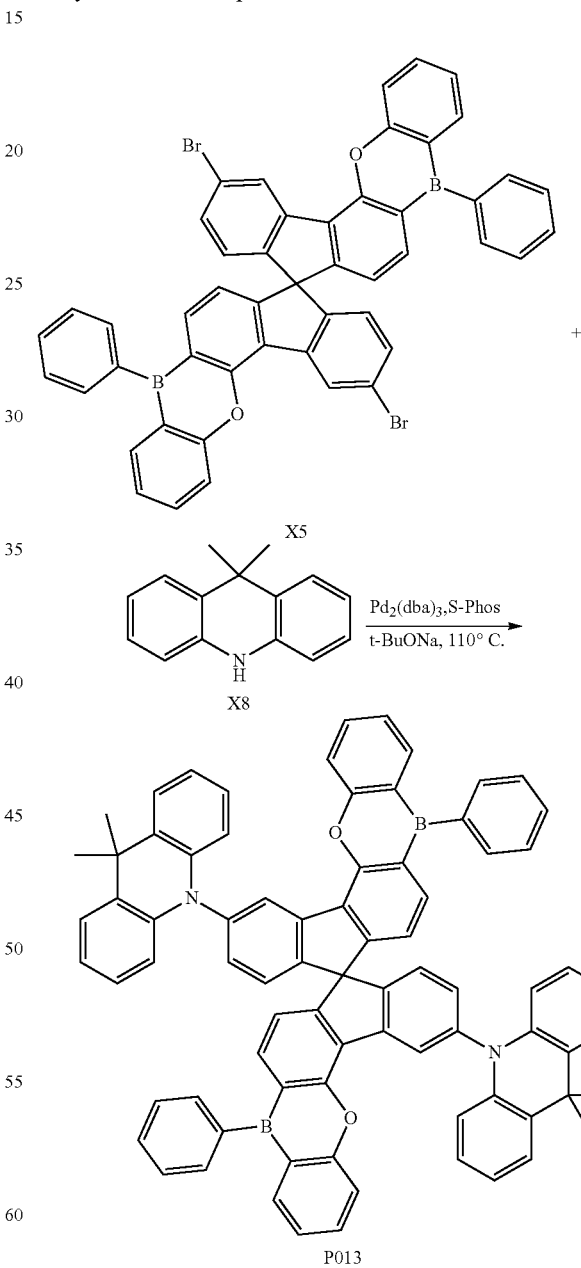

Under nitrogen atmosphere, intermediate reactants X5 (1 mol) and X8 (2.2 mmol), sodium tert-butoxide (2.5 mmol), Pd₂(dba)₃ (0.05 mmol), and S-Phos (0.15 mmol) were added 100 mL of anhydrous toluene solvent in sequence. The above mixture was heated to 110° C. and reacted overnight. After the reaction was finished, the above mixture was cooled to room temperature. DCM and H₂O were added for extraction. The collected organic phase was dried over anhydrous Na₂SO₄. The filtrate was collected by suction filtration, the solvent was removed by rotation and column chromatography purification was performed to give compound P013 (0.8 mmol, 80%).

LC-MS: m/z: calculation value: C79H % $B_2N_2O_2$: 1086.9, actual measured value: 1086.4.

¹H NMR (400 MHz, CDCl₃): δ=8.25 (d, 2H), 8.10-8.01 (m, 4H), 7.78-7.60 (m, 12H), 7.59-7.47 (m, 12H), 7.41-7.27 (m, 6H), 7.25-7.10 (m, 4H), 7.08-6.89 (m, 4H), 1.68-1.65 (m, 12H).

Results of elemental analysis of the compound: calculation value: $C_{79}H_{56}B_2N_2O_2$ (%): C 87.30, H 5.19, N 2.58; actual measured value: C 87.31, H 5.18, N 2.57.

Preparation Example 4

Synthesis of Compound P036

Preparation of intermediate X10: the difference with the preparation method of the intermediate X5 in the preparation example 1 is only that X1

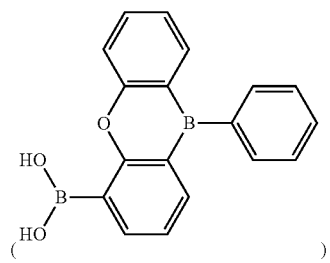

X1 in the preparation example 1 is replaced with an equalmolar amount of X9

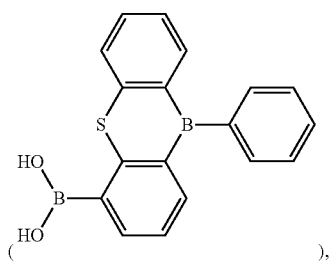

X9 and after the same intermediate synthesis steps as in the preparation example 1, the intermediate X10 is obtained.

The intermediate X10: LC-MS: m/z: calculation value: $C_{49}H_{28}B_2Br_2S_2$: 862.3, actual measured value: 861.9.

¹H NMR (400 MHz, CDCl₃) δ=8.12 (d, 2H), 7.73-7.62 (m, 8H), 7.63-7.50 (m, 6H), 7.45-7.28 (m, 8H), 7.24-7.15 (m, 4H).

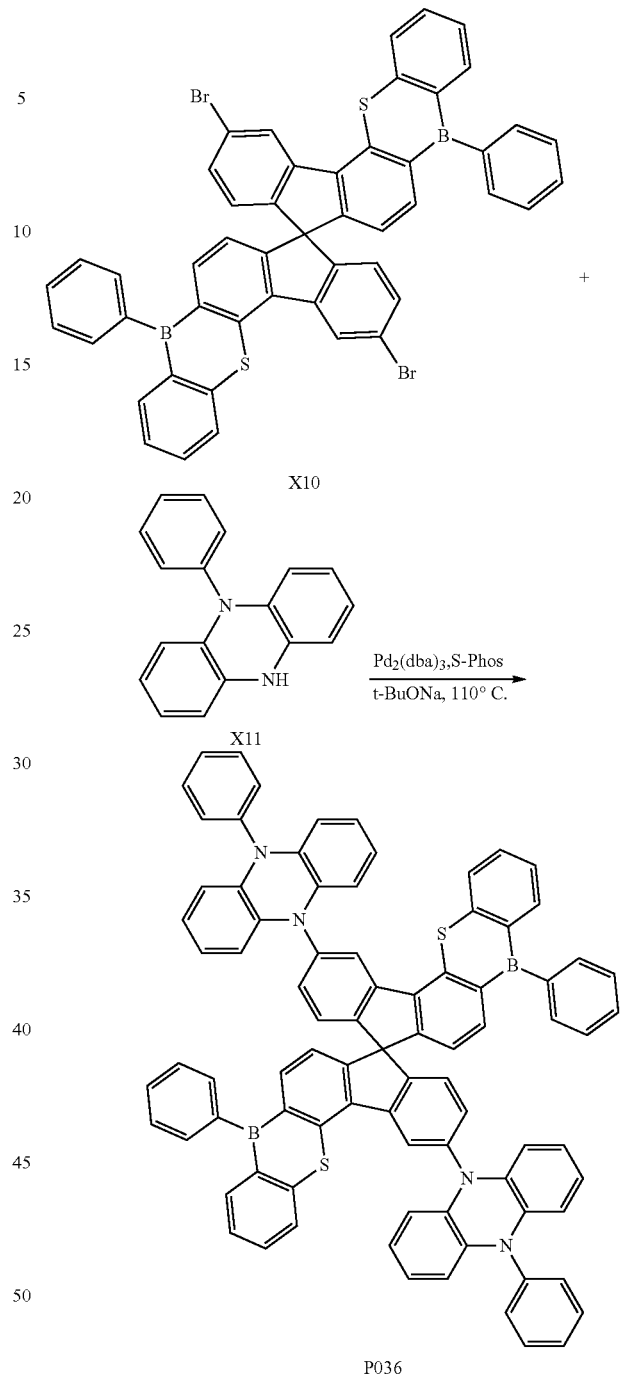

Under nitrogen atmosphere, the intermediate reactants X10 (1 mol) and X11 (2.2 mmol), sodium tert-butoxide (2.5 mmol), Pd₂(dba)₃ (0.05 mmol), and S-Phos (0.15 mmol) were added to 100 mL of anhydrous toluene solvent in sequence. The above mixture was heated to 110° C. and reacted overnight. After the reaction was finished, the above mixture was cooled to room temperature. DCM and H₂O were added for extraction. The collected organic phase was dried over anhydrous Na₂SO₄. The filtrate was collected by suction filtration, the solvent was removed by rotation and column chromatography purification was performed to give the compound P036 (0.75 mmol, 75%).

LC-MS: m/z: calculation value: $C_{85}H_{54}B_2N_4S_2$: 1217.1, actual measured value: 1216.8.

$^1$H NMR (400 MHz, CDCl$_3$) δ=8.27 (d, 2H), 8.13-8.03 (m, 4H), 7.80-7.62 (m, 12H), 7.57-7.45(m, 12H), 7.40-7.27 (m, 6H), 7.25-7.10 (m, 4H), 7.08-6.88 (m, 61H), 6.62-6.59 (m, 4H), 6.37-6.31 (m, 4H).

Results of elemental analysis of the compound: calculation value: $C_{85}H_{54}B_2N_4S_2$ (%): C 83.88, H 4.47, N 4.60; actual measured value: C 83.89, H4.46, N 4.61.

Preparation Example 5

Synthesis of Compound P060
Preparation of intermediate X13:
The difference with the preparation method of the intermediate X$_5$ in the preparation example 1 is only that X1

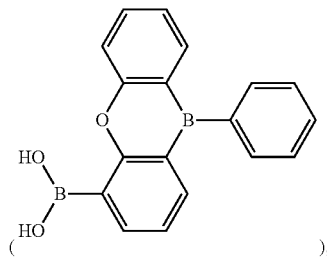

X1 in the preparation example 1 is replaced with an equalmolar amount of X12

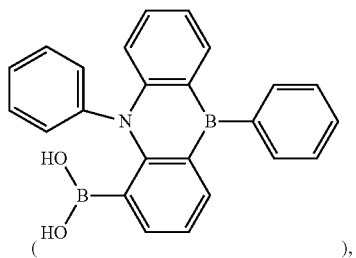

X12 and after the same intermediate synthesis steps as in the preparation example 1, the intermediate X13

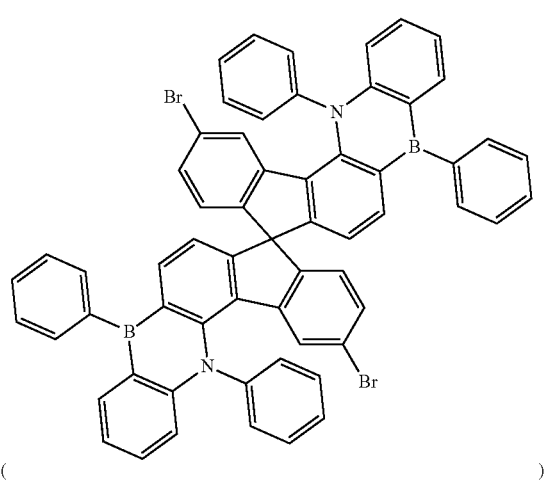

X13 is obtained.
The intermediate X13: LC-MS: m/z: calculation value: $C_{61}H_{38}B_2Br_2N_2$: 980.4, actual measured value: 980.1.

$^1$H NMR (400 MHz, CDCl$_3$) δ=8.12 (d, 2H), 7.73-7.62 (m, 8H), 7.63-7.50 (m, 6H), 7.45-7.28 (m, 8H), 7.24-7.10 (m, 8H), 6.72-6.59 (m, 6H).

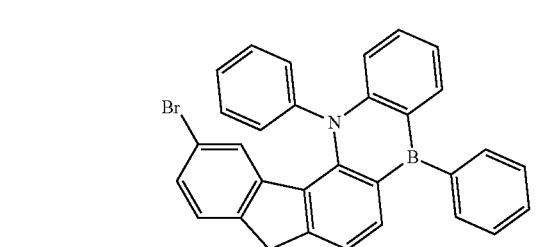

X13

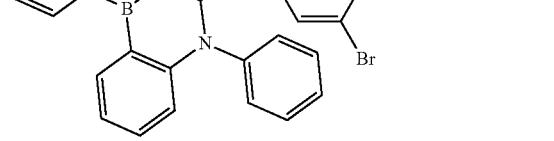

+

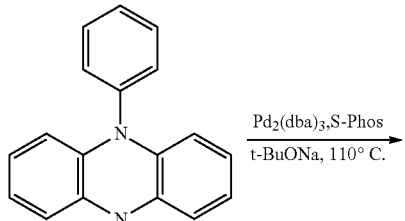

X11

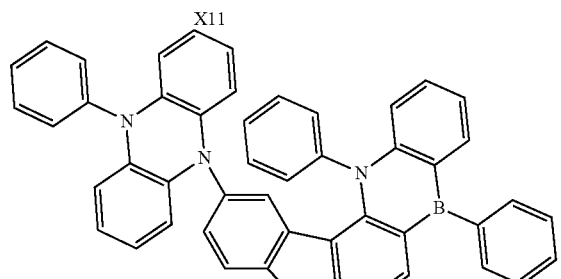

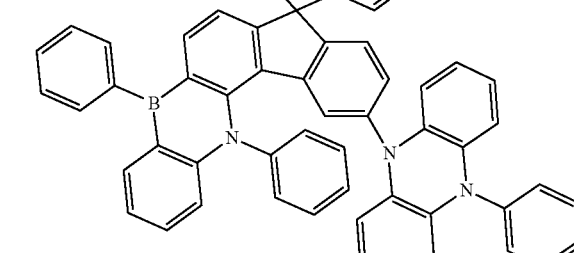

P060

Under nitrogen atmosphere, the intermediate reactants X13 (1 mmol) and X11 (1.2 mmol), sodium tert-butoxide (2.5 mmol), Pd$_2$(dba)$_3$ (0.05 mmol), and S-Phos (0.15 mmol) were added to 100 mL of anhydrous toluene solvent in sequence. The above mixture was heated to 110° C. and reacted overnight. After the reaction was finished, the above mixture was cooled to room temperature. DCM/H$_2$O were added for extraction. The collected organic phase was dried over anhydrous Na$_2$SO$_4$. The filtrate was collected by suction filtration, the solvent was removed by rotation and column chromatography purification was performed to give compound P060 (0.70 mmol, 70%).

LC-MS: m/z: calculation value: $C_{97}H_{64}B_2N_6$: 1335.2, actual measured value: 1334.8.

$^1$H NMR (400 MHz, CDCl$_3$) δ=8.26 (d, 2H), 8.14-7.96 (m, 6l), 7.83-7.62 (m, 14H), 7.60-7.42 (m, 16H), 7.38-7.27 (m, 8H), 7.24-7.17 (m, 6H), 7.12-6.80(m, 6l1), 6.69-6.59 (m, 6H).

Results of elemental analysis of the compound: calculation value: $C_{97}H_{64}B_2N_6$ (%): C 87.26, H 4.83, N 6.29; actual measured value: C 87.25, H 4.82, N 6.30.

Preparation Example 6

Synthesis of Compound P073
Synthesis of Intermediate X17:

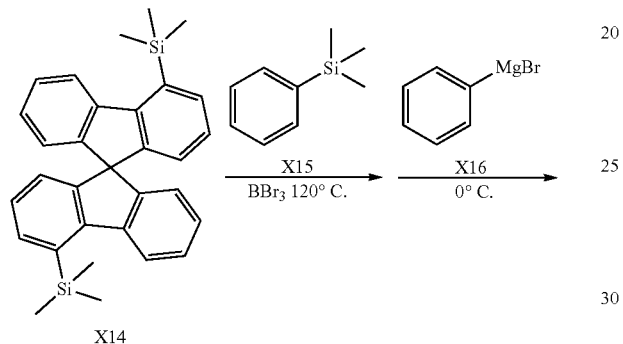

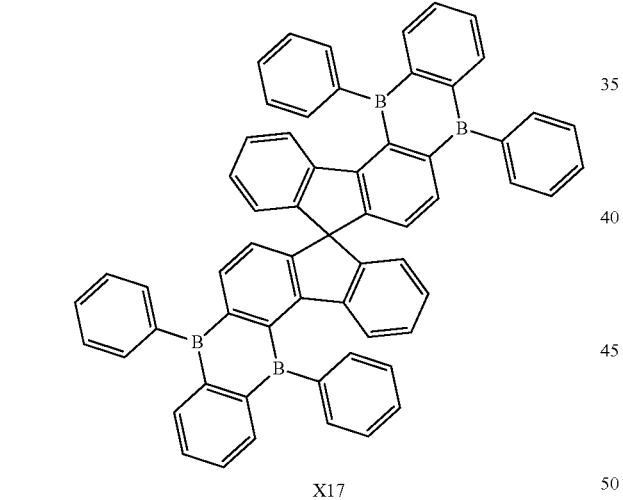

Under nitrogen atmosphere, the mixture of X14 (1 mmol), X15 (2 mmol) and BBr$_3$ (8 mmol) in dry toluene was stirred in a sealed glass tube and heated to 120° C. for 3 days. The reaction solution was cooled to the room temperature, and the solvent was evaporated in vacuum to give a solid crude product. Dry toluene was then added to the reaction flask and stirred to dissolve it. The solution was stirred at 0° C. for about 10 minutes, and X16 (1.8 M, 2 mmol) was slowly added dropwise into the solution. The reaction mixture was heated to room temperature overnight, and all volatiles were removed under reduced pressure. The residue was further purified by column chromatography to give solid product X17 (0.54 mmol, 54%).

X17: LC-MS: m/z: calculation value: $C_{61}H_{40}B_4$: 816.2, actual measured value: 815.9.

$^1$H NMR (400 MHz, CDCl$_3$): δ=8.01 (d, 2H), 7.67-7.53 (m, 16H), 7.47-7.29 (m, 16H), 7.24-7.17 (m, 6H).

Synthesis of intermediate X18:

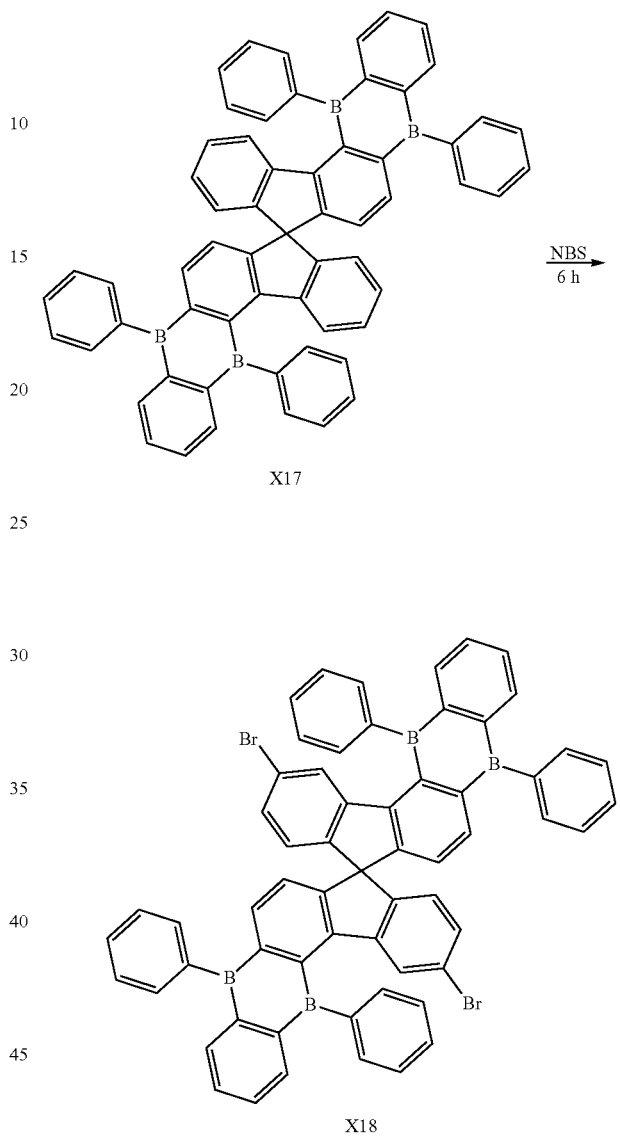

100 mL of chloroform solvent was added to a 250 mL reaction flask, and the intermediate X17 (1 mmol) was added. After the intermediate X17 was dissolved, NBS (2.2 mmol) was added and reacted at room temperature for 6 hours. After the reaction was finished, the above mixture was poured into H$_2$O for extraction. The collected organic phase was dried over anhydrous Na$_2$SO$_4$. The filtrate was collected by suction filtration, the solvent was removed by rotation and column chromatography purification was performed to give intermediate X18 (0.68 mmol, 68%). The intermediate X18 was dried in a vacuum oven for the next reaction.

X18: LC-MS: m/z: calculation value: $C_{61}H_{38}B_4Br_2$: 974.0, actual measured value: 973.8.

$^1$H NMR (400 MHz, CDCl$_3$) δ=8.10 (d, 2H), 7.86-7.65 (m, 12H), 7.60-7.45 (m, 10H), 7.43-7.27(m, 10H), 7.25-7.11 (m, 4H).

Synthesis of the compound P073

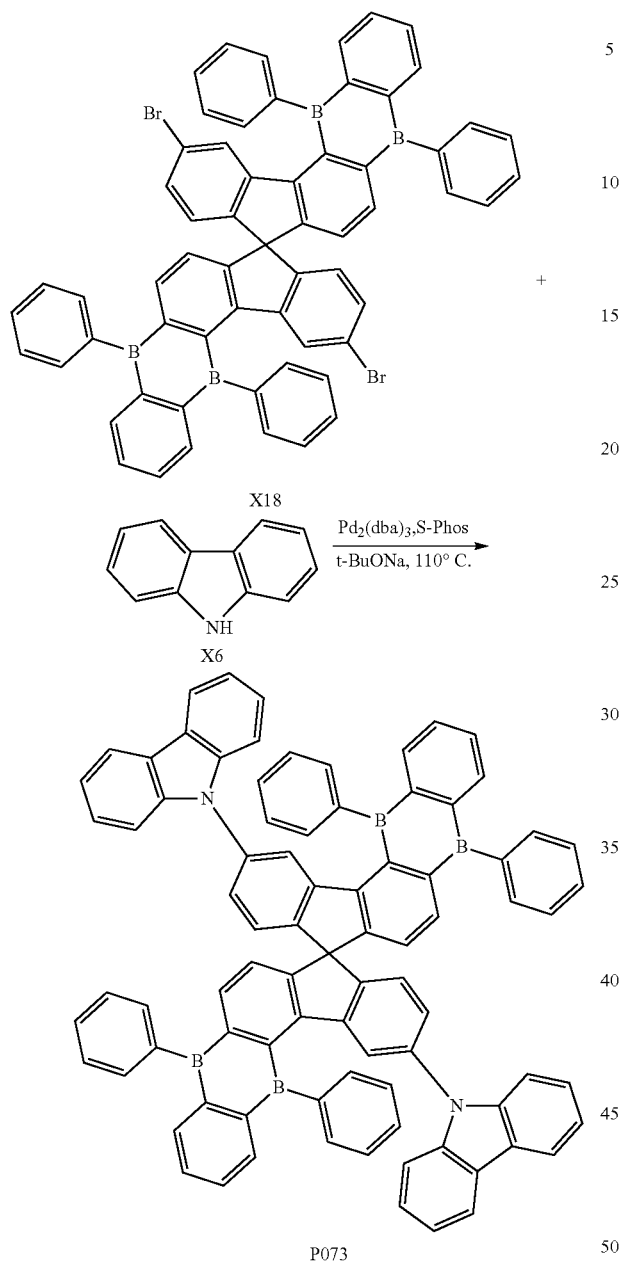

Under nitrogen atmosphere, the intermediate reactants X18 (I mmol) and X6 (1.2 mmol), sodium tert-butoxide (2.5 mmol), $Pd_2(dba)_3$ (0.05 mmol), and S-Phos (0.15 mmol) were added to 100 mL of anhydrous toluene solvent in sequence. The above mixture was heated to 110° C. and reacted overnight. After the reaction was finished, the above mixture was cooled to room temperature. Dichloromethane/$H_2O$ were added for extraction. The collected organic phase was dried over anhydrous $Na_2SO_4$. The filtrate was collected by suction filtration, the solvent was removed by rotation and column chromatography purification was performed to give final compound P073 (0.83 mmol, 83%).

LC-MS: m/z: calculation value: $C_{85}H_{54}B_4N_2$: 1146.6, actual measured value: 1146.2.

$^1$H NMR (400 MHz, $CDCl_3$): δ=8.21 (d, 2H), 8.10-7.98 (m, 6H), 7.80-7.62 (m, 14H), 7.58-7.43 (m, 16H), 7.35-7.27 (m, 8H), 7.21-7.10 (m, 4H), 7.06-6.89 (m, 4H).

Results of elemental analysis of the compound: calculation value: $C_{85}H_{54}B_4N_2$ (%): C 89.04, H 4.75, N 2.44; actual measured value: C 89.00, H 4.72, N 2.42.

Preparation Example 7

Synthesis of Compound P080

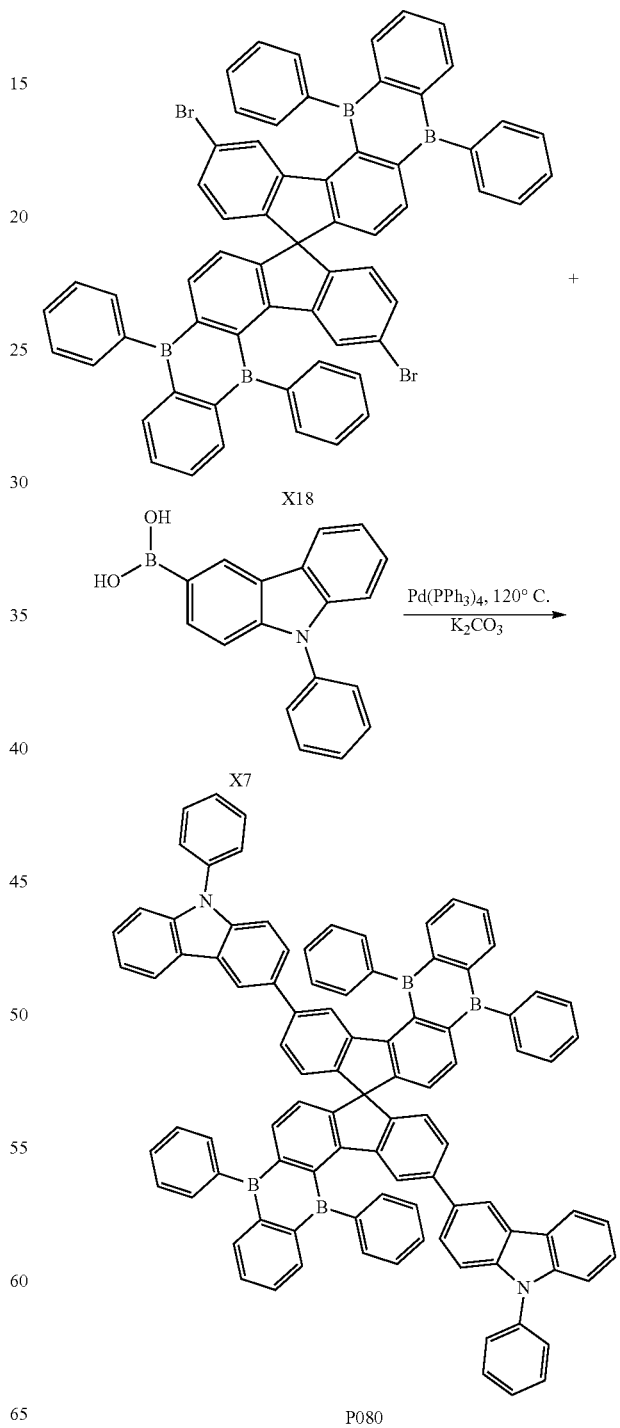

Under nitrogen atmosphere, 100 mL of 1,4-dioxane solvent was added to a 250 mL reaction flask, and K₂CO₃ (2.5 mmol), the intermediate reactants X18 (1 mmol) and X7 (2.2 mmol) and Pd(PPh₃)₄ (0.05 mmol) were added in sequence. The above mixture was heated to 120° C. and reacted overnight. After the reaction was finished, the above mixture was cooled to room temperature. Dichloromethane/H₂O were added for extraction. The collected organic phase was dried over anhydrous Na₂SO₄. The filtrate was collected by suction filtration, the solvent was removed by rotation and column chromatography purification was performed to give compound P080 (0.81 mmol, 81%).

LC-MS: m/z: calculation value: $C_{97}H_2B_4N_2$: 1298.8, actual measured value: 1298.3.

¹H NMR (400 MHz, CDCl₃) δ=8.26-8.21 (m, 2H), 8.14-8.04 (m, 6H), 7.9-7.68 (m, 18H), 7.65-7.44 (m, 18H), 7.44-7.27 (m, 101H), 7.25-7.15 (m, 4H), 7.10-6.91 (m, 4H).

Results of elemental analysis of the compound: calculation value: $C_{97}H_2B_4N_2$(%): C 89.70, H 4.81, N 2.16; actual measured value: C 89.69, H 4.80, N 2.17.

Preparation Example 8

Synthesis of Compound P084

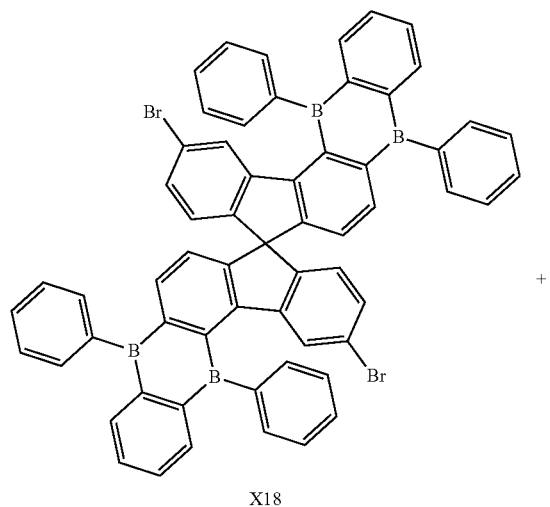

X18

+

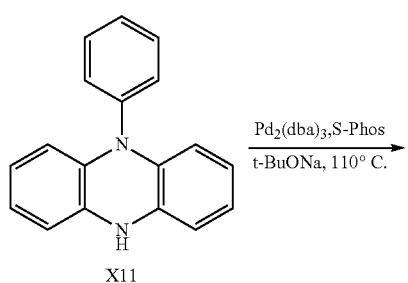

X11

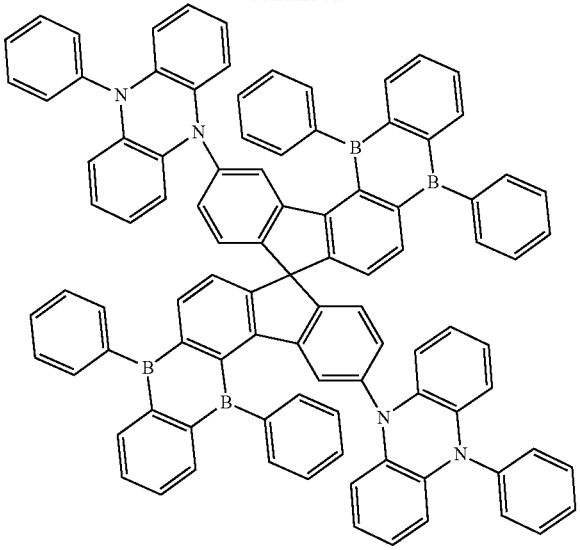

P084

Under nitrogen atmosphere, the intermediate reactant X18 (1 mmol), 5-phenyl-5,10-dihydrothiophene (X11, 1.2 mmol), sodium tert-butoxide (2.5 mmol), Pd₂(dba)₃ (0.05 mmol), and S-Phos (0.15 mmol) were added to 100 mL of anhydrous toluene solvent in sequence. The above mixture was heated to 110° C. and reacted overnight. After the reaction was finished, the above mixture was cooled to room temperature. DCM/H₂O were added for extraction. The collected organic phase was dried over anhydrous Na₂SO₄. The filtrate was collected by suction filtration, the solvent was removed by rotation and column chromatography purification was performed to give final compound P084 (0.74 mmol, 74%).

LC-MS: m/z: calculation value: $C_{97}H_{64}B_4N_4$: 1328.8, actual measured value: 1328.3.

¹H NMR (400 MHz, CDCl₃): δ=8.25 (d, 2H), 8.15-7.95 (m, 6H), 7.82-7.63 (m, 14H), 7.59-7.42 (m, 16H), 7.39-7.27 (m, 8H), 7.24-7.15 (m, 4H), 7.08-6.85(m, 6H), 6.63-6.59 (m, 4H), 6.39-6.33 (m, 4H).

Results of elemental analysis of the compound: calculation value: $C_{97}H_{64}B_4N_4$ (%): C 87.67, H 4.85, N 4.22; actual measured value: C 87.68, H 4.84, N 4.23.

The following are several application examples of the organic compound described in the present invention in the OLED device.

Application Example 1

This application example provides an OLED deice. The structure of the OLED deice is shown in FIG. 1. The OLED device includes in sequence a substrate 1, an ITO anode 2, a hole injection layer 3, a first hole transport layer 4, a second hole transport layer 5, a light-emitting layer 6, a first electron transport layer 7, a second electron transport layer 8, and a cathode 9. The arrow in FIG. 1 represents the light emission direction of the device.

The OLED device was prepared via steps described below.

1) A glass substrate was cut into 50 mm×50 mm×0.7 mm, sonicated in acetone, isopropyl alcohol and deionized water for 30 minutes separately, and cleaned under UV ozone for 30 minutes. The obtained glass substrate having the ITO anode was installed onto a vacuum deposition apparatus.

2) The hole injection layer material compound a was evaporated in vacuum on the ITO anode layer 2 as the hole injection layer 3 with a thickness of 10 nm.

3) The hole transport layer material compound b was evaporated in vacuum on the hole injection layer 3 as the first hole transport layer 4 with a thickness of 100 nm.

4) The hole transport material compound c was evaporated in vacuum on the first hole transport layer 4 as the second hole transport layer 5 with a thickness of 10 nm.

5) A light-emitting layer 6 with a thickness of 30 nm was evaporated in vacuum on the second hole transport layer 5, where the compound d (mCBP) was used as the host material and the compound P001 of the present invention was used as a doped material (guest material) with a doped ratio of 10% (mass ratio).

6) An electron transport material compound e was evaporated in vacuum on the light-emitting layer 6 as the first electron transport layer 7 with a thickness of 10 nm.

7) The electron transport material compound f and compound g (mass ratio 1:1) were evaporated in vacuum on the first electron transport layer 7 as the second electron transport layer 8 with a thickness of 30 nm.

(8) The silver electrode was evaporated in vacuum on the second electron transport layer 8 as the cathode 9 with a thickness of 15 nim.

Compound a

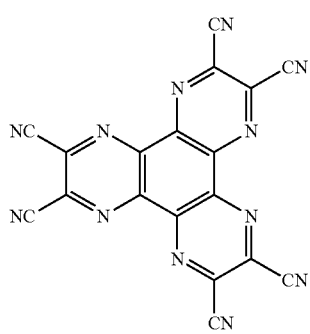

Compound b

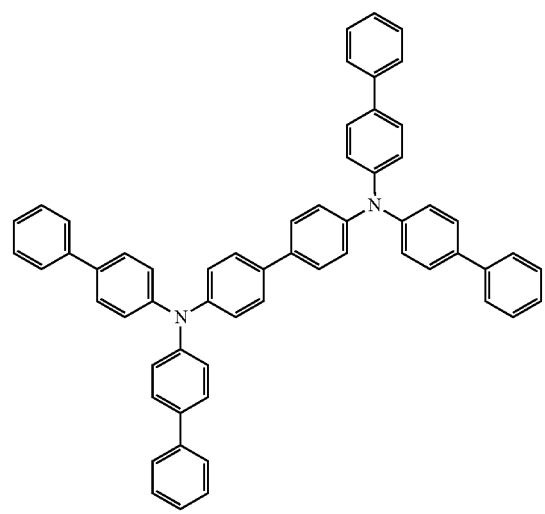

Compound c

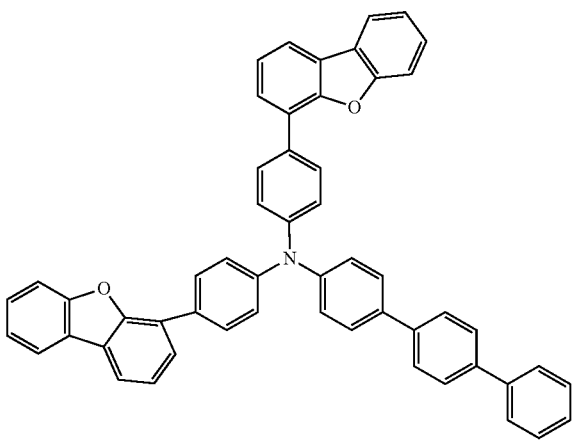

Compound d

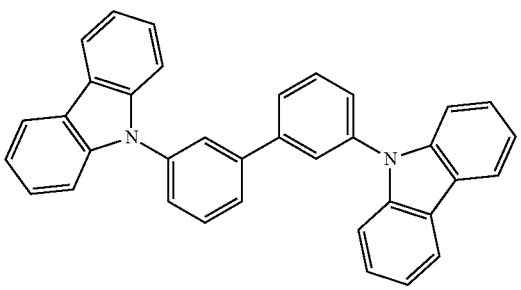

Compound e

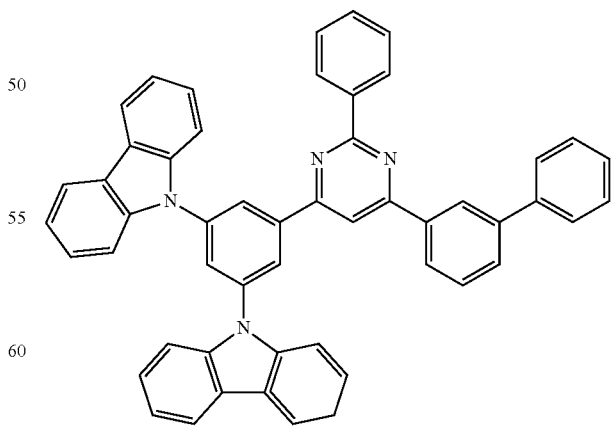

Compound f

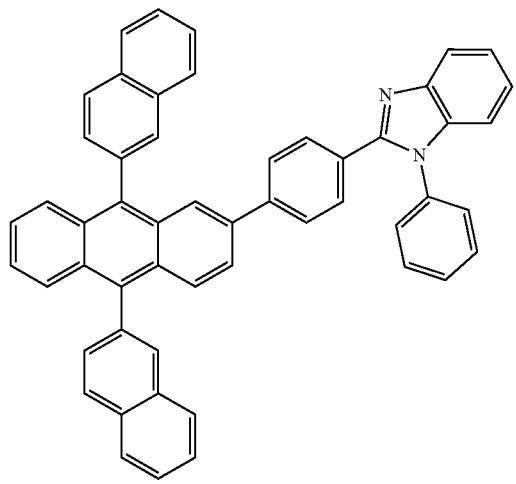

Compound g

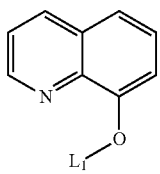

Comparative compound 1

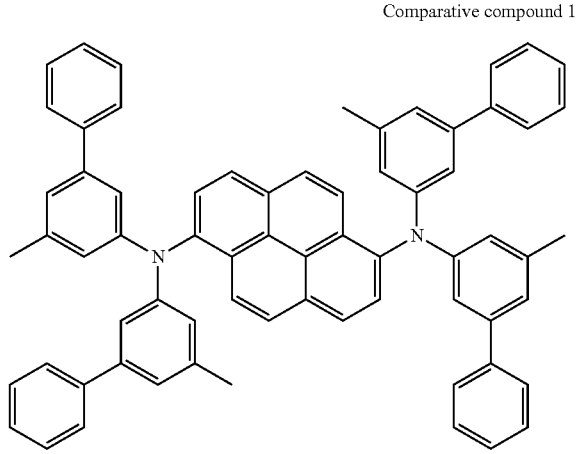

Comparative compound 2

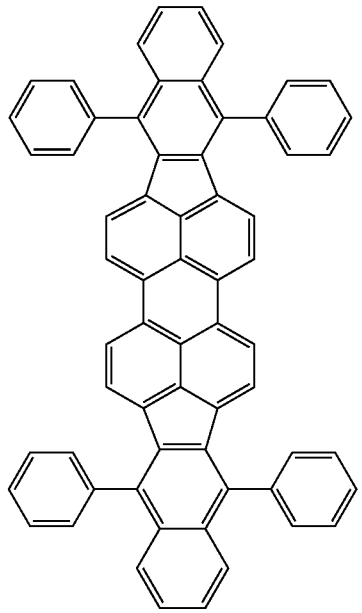

Application Example 2

This application example differs from the application example 1 in that the organic compound P001 in step (5) was replaced with an equal amount of the organic compound P005, but all other preparation steps were the same.

Application Example 3

This application example differs from the application example 1 in that the organic compound P001 in step (5) was replaced with an equal amount of the organic compound P008, but all other preparation steps were the same.

Application Example 4

This application example differs from the application example 1 in that the organic compound P001 in step (5) was replaced with an equal amount of the organic compound P012, but all other preparation steps were the same.

Application Example 5

This application example differs from the application example 1 in that the organic compound P001 in step (5) was replaced with an equal amount of the organic compound P013, but all other preparation steps were the same.

Application Example 6

This application example differs from the application example 1 in that the organic compound P001 in step (5) was replaced with an equal amount of the organic compound P036, but all other preparation steps were the same.

Application Example 7

This application example differs from the application example 1 in that the organic compound P001 in step (5) was replaced with an equal amount of the organic compound P037, but all other preparation steps were the same.

Application Example 8

This application example differs from the application example 1 in that the organic compound P001 in step (5) was replaced with an equal amount of the organic compound P058, but all other preparation steps were the same.

Application Example 9

This application example differs from the application example 1 in that the organic compound P001 in step (5) was replaced with an equal amount of the organic compound P060, but all other preparation steps were the same.

Application Example 10

This application example differs from the application example 1 in that the organic compound P001 in step (5) was replaced with an equal amount of the organic compound P073, but all other preparation steps were the same.

Application Example 11

This application example differs from the application example 1 in that the organic compound P001 in step (5) was replaced with an equal amount of the organic compound P080, but all other preparation steps were the same.

Application Example 12

This application example differs from the application example 1 in that the organic compound P001 in step (5) was replaced with an equal amount of the organic compound P084, but all other preparation steps were the same.

Application Example 13

This application example differs from the application example 1 in that mCBP in step (5) was replaced with an equal amount of the organic compound P001, the organic compound P001 in step (5) was replaced with Ir(ppy)$_3$ in a doped ratio of 5%, but all other preparation steps were the same.

Application Example 14

This application example differs from the application example 1 in that mCBP in step (5) was replaced with an equal amount of the organic compound P013, the organic compound P001 in step (5) was replaced with Ir(ppy)$_3$ in a doped ratio of 5%, but all other preparation steps were the same.

Application Example 15

This application example differs from the application example 1 in that mCBP in step (5) was replaced with an equal amount of the organic compound P058, the organic compound P001 in step (5) was replaced with Ir(ppy)$_3$ in a doped ratio of 5%, but all other preparation steps were the same.

Comparative Example 1

This comparative example differs from the application example 1 in that the organic compound P001 in step (5) was replaced with a comparative compound 1 in a doped ratio of 2%, but all other preparation steps were the same.

Comparative Example 2

This comparative example differs from the application example 1 in that the organic compound P001 in step (5) was replaced with a comparative compound 2 in a doped ratio of 2%, but all other preparation steps were the same.

Performance Test:

(1) Simulated Calculations of Compounds

Using density functional theory (DFT), distribution of molecular frontier orbitals was optimized and calculated for compounds in Table 1 using Gaussian 09 package at B3LYP/6-31G(d) calculation level. Meanwhile, based on time-dependent density functional theory (TD-DFT), singlet state energy level $S_1$ and triple state energy level Tt of a molecule were simulated and calculated, and the results were shown in Table 1, where $E_g$=HOMO-LUMO and the value of $E_g$ takes an absolute value.

TABLE 1

| Organic Compound | HOMO (eV) | LUMO (eV) | $E_g$(eV) | $S_1$(eV) | $T_1$(eV) | $\Delta E_{ST}$ (eV) |
|---|---|---|---|---|---|---|
| P001 | −5.30 | −1.92 | 3.38 | 3.02 | 2.73 | 0.29 |
| P005 | −5.38 | −1.79 | 3.59 | 3.05 | 2.77 | 0.28 |
| P008 | −5.16 | −1.72 | 3.44 | 3.02 | 2.75 | 0.27 |
| P012 | −4.07 | −1.87 | 2.20 | 2.283 | 2.280 | 0.003 |
| P013 | −4.96 | −1.76 | 3.20 | 2.91 | 2.73 | 0.18 |
| P036 | −4.23 | −1.75 | 2.48 | 2.22 | 2.21 | 0.01 |
| P037 | −5.04 | −1.80 | 3.24 | 2.77 | 2.67 | 0.10 |
| P058 | −4.67 | −1.78 | 2.89 | 2.76 | 2.61 | 0.15 |
| P060 | −4.13 | −1.68 | 2.45 | 2.32 | 2.31 | 0.01 |
| P073 | −5.28 | −2.48 | 2.80 | 2.48 | 2.43 | 0.05 |
| P080 | −5.13 | −2.13 | 3.00 | 2.64 | 2.57 | 0.07 |
| P084 | −4.07 | −2.42 | 1.65 | 1.657 | 1.654 | 0.003 |

As seen from Table 1, since $\Delta Es^{ST}$ of all compounds is less than 0.3 eV, a small difference between the singlet state energy level and the triple state energy level is achieved, a conversion from triplet state excitons to singlet state excitons can be efficiently achieved through reverse intersystem crossing, and utilization efficiency of excitons is improved. From results of Gaussian calculations, it is inferred that the compounds of the present invention can be used as TADF materials and can be used as a guest material for organic light-emitting layers.

(2) Performance Evaluation of OLED Devices

Current at different voltages of OLED devices fabricated according to application examples and comparative examples was tested using a Keithley 2365A digital nano-voltmeter.

Current density of OLED devices at different voltages was obtained by dividing current by luminous area. The brightness and radiation energy flux density at different voltages of OLED devices fabricated according to embodiments and comparative examples were tested using a Koni-caminolta CS-2000 spectrometer. According to current density and brightness of OLED devices at different voltages, operating voltage V. and current efficiency (CE, Cd/A) at the same current density (10 mA/cm$^2$) are obtained.

The test results were shown in Table 2.

TABLE 2

| | Host Material | Doped Material | $V_{on}$ (V) | $CE_{(10mA/cm^2)}$ (cd A$^{-1}$) | Color |
|---|---|---|---|---|---|
| Application Example 1 | mCBP | P001 | 4.03 | 13.6 | blue light |
| Application Example 2 | mCBP | P005 | 3.96 | 12.9 | blue light |
| Application Example 3 | mCBP | P008 | 4.05 | 14.2 | blue light |
| Application Example 4 | mCBP | P012 | 3.64 | 20.9 | red light |
| Application Example 5 | mCBP | P013 | 3.91 | 21.4 | blue light |
| Application Example 6 | mCBP | P036 | 3.68 | 21.4 | red light |
| Application Example 7 | mCBP | P037 | 3.95 | 19.6 | blue light |
| Application Example 8 | mCBP | P058 | 3.92 | 23.6 | blue light |
| Application Example 9 | mCBP | P060 | 3.56 | 26.5 | red light |
| Application Example 10 | mCBP | P073 | 3.83 | 36.5 | green light |
| Application Example 11 | mCBP | P080 | 3.86 | 34.8 | green light |
| Application Example 12 | mCBP | P084 | 3.65 | 15.6 | near-infrared light |
| Application Example 13 | P001 | Ir(ppy)$_3$ | 4.08 | 56.5 | green light |
| Application Example 14 | P013 | Ir(ppy)$_3$ | 4.13 | 58.7 | green light |
| Application Example 15 | P058 | Ir(ppy)$_3$ | 4.03 | 60.6 | green light |
| Comparative Example 1 | mCBP | comparative compound 1 | 4.16 | 6.8 | blue light |
| Comparative Example 2 | mCBP | comparative compound 2 | 4.09 | 10.2 | red light |

It can be learned from Table 2 that compared with the comparative devices with the classical blue light-emitting material comparative compound 1 and the red light-emitting material comparative compound 2 as fluorescent dopants, the current efficiency CE of the OLED device with P005, P008, P012, P036, P037, P060, P073, P080 and P084 as dopants is significantly higher than the current efficiency CE of the OLED device in the comparative examples. This is mainly due to the TADF characteristics of organic compounds P001, P005, P008, P012, P013, P036, P037, P058, P060, P073, P080 and P084, which can emit light by using the triple state excitons with the conventional forbidden transition of fluorescent molecules, thereby efficiency of OLED devices is improve and driving voltage is reduced.

For the OLED device with organic compounds P001, P013 and P058 of the present invention as host material and Ir(ppy)$_3$ as doped material, its current efficiency CE reaches 56.5-60.6 cd/A, and its luminescence performance is excellent, which indicates that the organic compounds of the present invention can be used as host material of phosphorescent material.

Another embodiment of the present invention provides an organic light-emitting display device which includes the above-mentioned organic light-emitting display panel.

Figure 2:
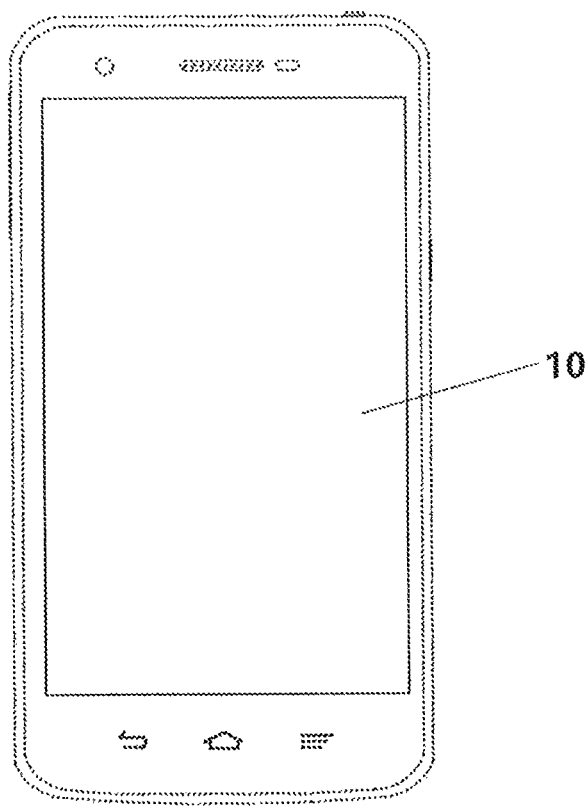
FIG. 2 illustrates a display device according to an embodiment of the present invention; wherein 10-mobile phone display.

In the present invention, OLED device may be applied in the organic light-emitting display device. The organic light-emitting display device may be a mobile phone display, computer display, television display, smart watch display, smart car display, VR or AR helmet display, various smart device displays, etc. FIG. 2 is a schematic diagram of an organic light-emitting display according to an embodiment of the present invention, where 10 is a mobile phone display.

The applicant has stated that although detailed process equipment and flows of the present invention are described through the embodiments described above, the present invention is not limited to the detailed process equipment and flows described above, which means that the implementation of the present invention does not necessarily depend on the detailed process equipment and flows described above. It should be apparent to those skilled in the art that any improvements made to the present invention, equivalent replacements of various raw materials of the product, the addition of adjuvant ingredients, and the selection of specific manners, etc. in the present invention all fall within the protection scope and the scope of disclosure of the present invention.

What is claimed is:

1. A compound, having a structure represented by Formula I:

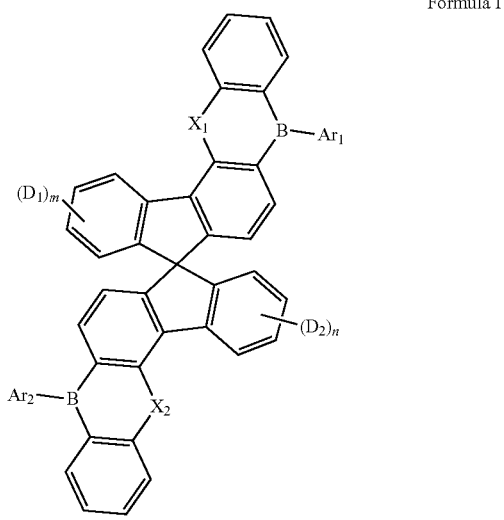

Formula I wherein m and n are each independently an integer selected from 1 to 4;
in Formula I, D$_1$ and D$_2$ are each independently selected from any one of a substituted or unsubstituted C12-C40 carbazole group, a substituted or unsubstituted C12-C40 acridine group, a substituted or unsubstituted C12-C40 arylamine group, a substituted or unsubstituted fluorenyl, or a substituted or unsubstituted spirofluorenyl;
in Formula I, Ar$_1$ and Ar$_2$ are each independently selected from a C1-C20 alkyl, a C1-C20 alkoxy, or a substituted or unsubstituted C6-C40 aryl;
in Formula I, X1 and X2 are each independently selected from any one of an oxygen atom, a sulfur atom,

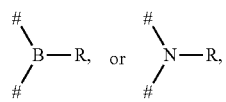

wherein #represents a linking bond;
R is selected from a C1-C20 alkyl, a C1-C20 alkoxy, or a substituted or unsubstituted C6-C40 aryl;
in D$_1$, D$_2$, Ar$_1$, Ar$_2$ and R, substituent is selected from any one or a combination of at least two of a cyano, a halogen, a phenoxy, a C1-C20 alkyl, a C1-C20 alkoxy, a C6-C40 aryl, a C4-C40 heteroaryl, or a C6-C40 arylamine group.

2. The compound according to claim 1, wherein the compound has a structure represented by Formula II:

Formula II

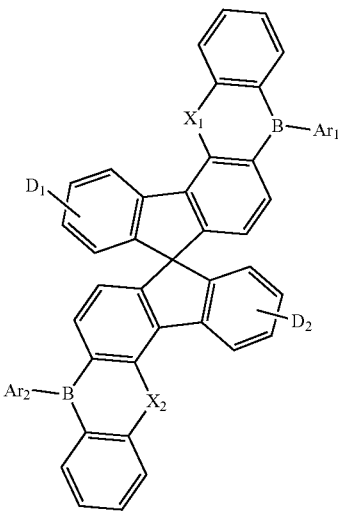

wherein $D_1$, $D_2$, $Ar_1$, $Ar_2$, $X_1$ and $X_2$ each has the same range as defined in claim 1.

3. The compound according to claim 1, wherein the compound has a structure represented by Formula III:

Formula III

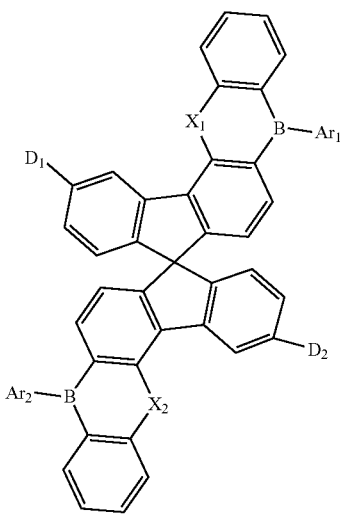

wherein $D_1$, $D_2$, $Ar_1$, $Ar_2$, $X_1$ and $X_2$ each has the same range as defined in claim 1.

4. The compound according to claim 1, wherein the substituted or unsubstituted C12-C40 carbazole group comprises any one of the following groups:

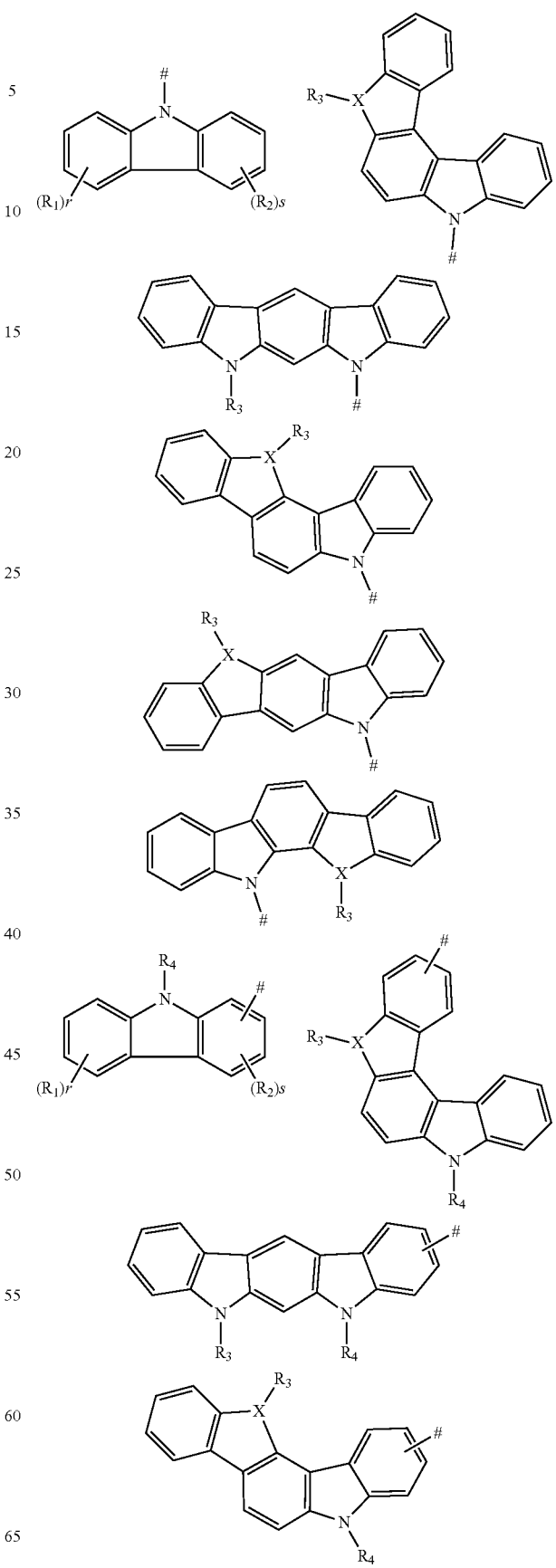

-continued

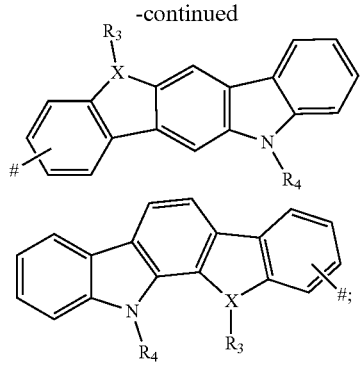

wherein X is selected from a carbon atom, a nitrogen atom, an oxygen atom, a sulfur atom or a silicon atom; r and s are each independently selected from 0, 1, 2 or 3; when X is an oxygen atom or a sulfur atom, $R_3$ does not exist;

$R_1$, $R_2$, $R_3$ and $R_4$ are each independently selected from any one of a hydrogen atom, a C1-C20 alkyl, a C1-C20 alkoxy or any one of groups represented be the following chemical formula:

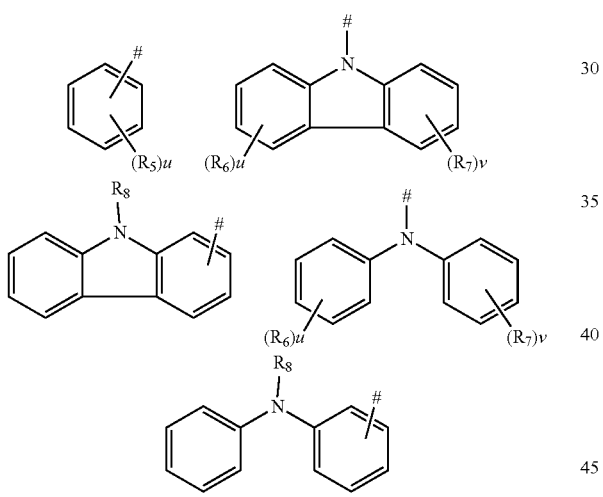

$R_5$, $R_6$, $R_7$ and $R_8$ are each independently selected from any one of a hydrogen atom, a C1-C20 alkyl, a C1-C20 alkoxy or a phenyl;

u and v are each independently selected from 0, 1, 2 or 3;

represents a linking bond.

5. The compound according to claim 1, wherein the substituted or unsubstituted C12-C40 carbazole group comprises any one of the following substituted or unsubstituted groups:

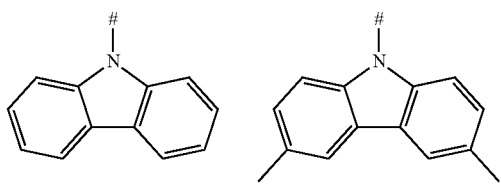

-continued

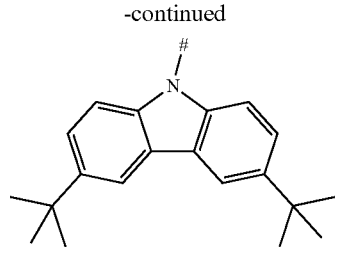

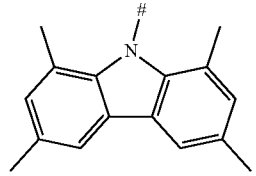

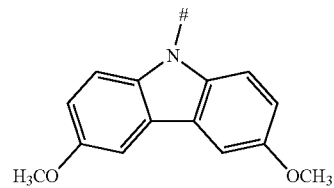

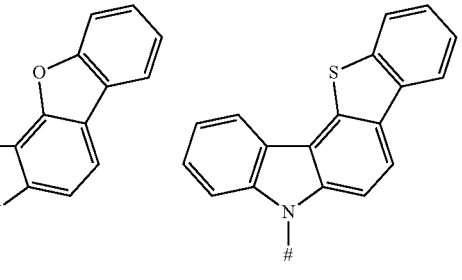

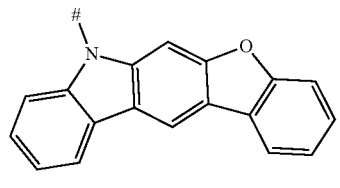

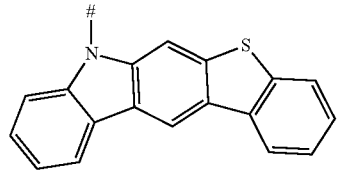

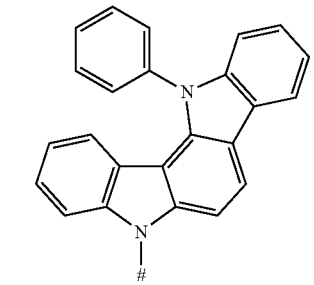

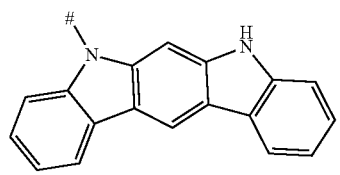

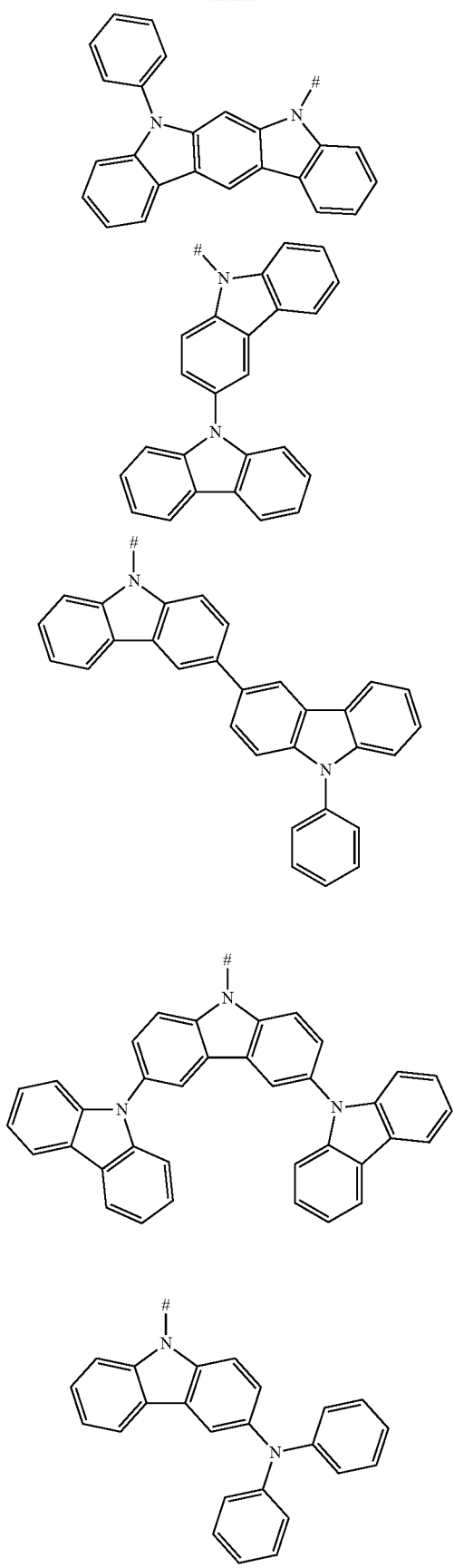

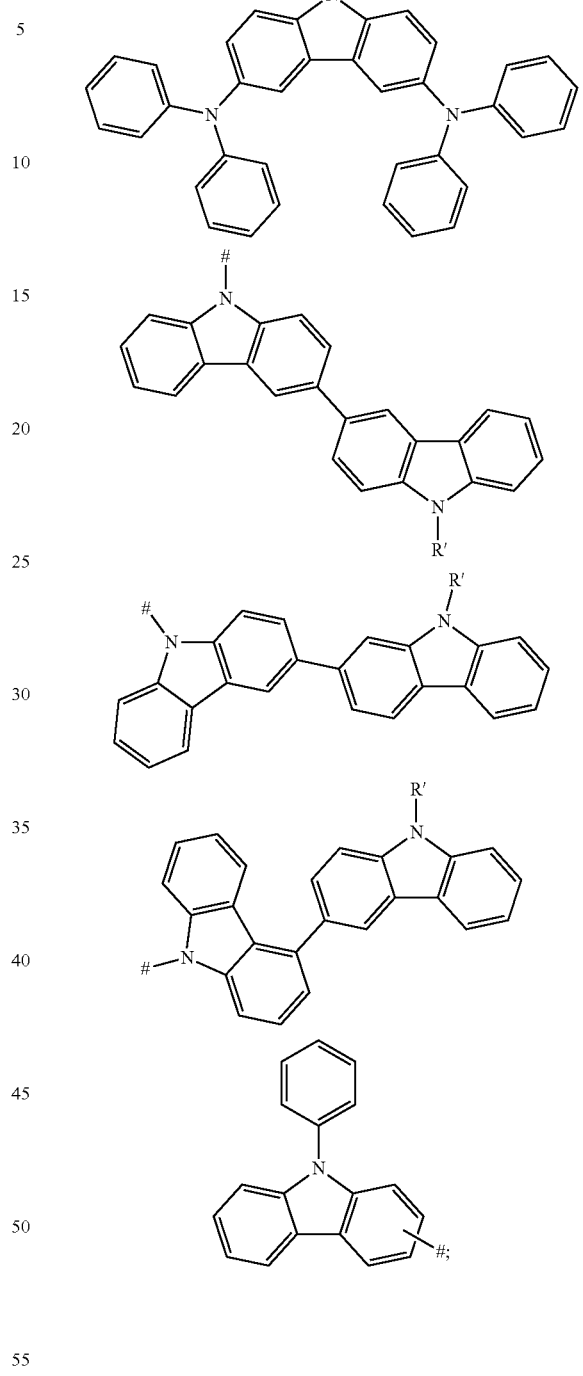

R' is selected from any one of a hydrogen atom, a substituted or unsubstituted C1-C20 alkyl, a substituted or unsubstituted C1-C20 alkoxy, a substituted or unsubstituted C6-C30 aryl, or a substituted or unsubstituted C3-C30 heteroaryl;

represents a linking bond.

6. The compound according to claim 1, wherein the substituted or unsubstituted C12-C40 acridine group comprises any one of the following groups:

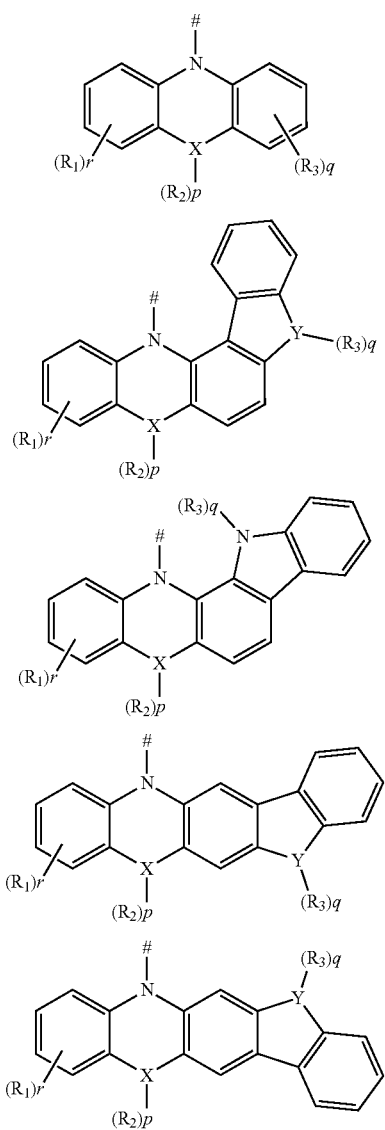

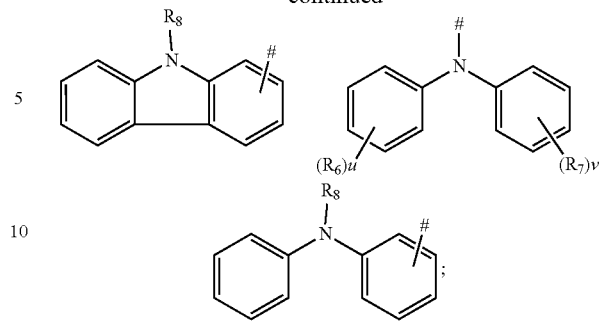

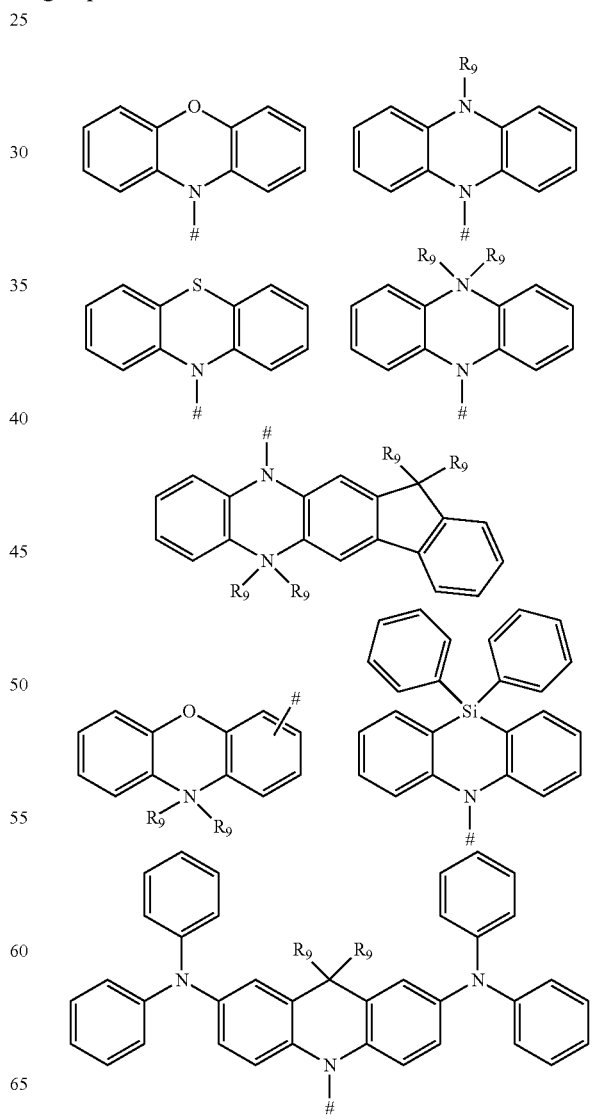

wherein X and Y are each independently selected from a carbon atom, a nitrogen atom, an oxygen atom, a sulfur atom or a silicon atom; r, p and q are each independently selected from 0, 1, 2 or 3; when X is an oxygen atom or a sulfur atom, p is 0; and when Y is an oxygen atom or a sulfur atom, q is 0;

$R_1$, $R_2$ and $R_3$ are each independently selected from any one of a hydrogen atom, a C1-C20 alkyl, a C1-C20 alkoxy or any one of groups represented by the following chemical formula:

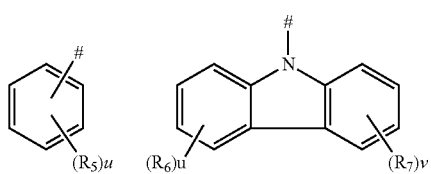

$R_5$, $R_6$, $R_7$ and $R_8$ are each independently selected from any one of a hydrogen atom, a C1-C20 alkyl, a C1-C20 alkoxy or phenyl;

u and v are each independently selected from 0, 1, 2 or 3;

represents a linking bond.

7. The compound according to claim 1, wherein the substituted or unsubstituted C12-C40 acridine group comprises any one of the following substituted or unsubstituted groups:

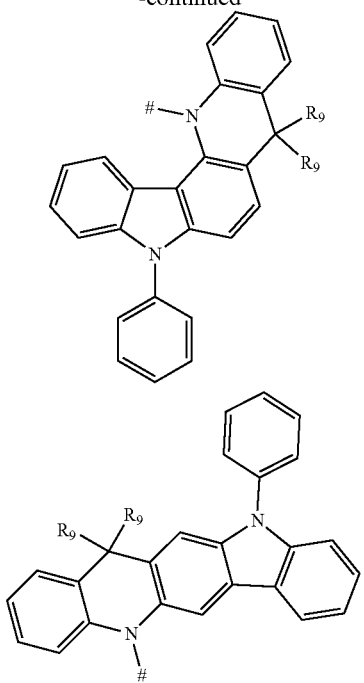

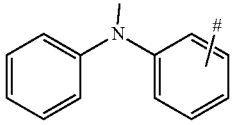

$R_5$, $R_6$, $R_7$ and $R_8$ are each independently selected from any one of a hydrogen atom, a C1-C20 alkyl, a C1-C20 alkoxy or a phenyl;

u and v are each independently selected from 0, 1, 2 or 3;

represents a linking bond.

9. The compound according to claim 1, wherein the substituted or unsubstituted C6-C40 arylamine group comprises any one of the following substituted or unsubstituted groups:

$R_9$ is independently selected from any one of a hydrogen atom, a C1-C20 alkyl, a C1-C20 alkoxy or a phenyl;

represents a linking bond.

8. The compound according to claim 1, wherein the substituted or unsubstituted C12-C40 arylamine group comprises the following group:

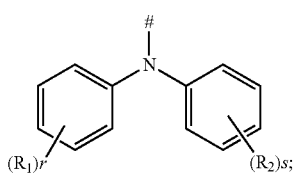

wherein r and s are each independently selected from 0, 1, 2 or 3;

$R_1$ and $R_2$ are each independently selected from any one of a hydrogen atom, a C1-C20 alkyl, a C1-C20 alkoxy or any one of groups represented by the following chemical formula:

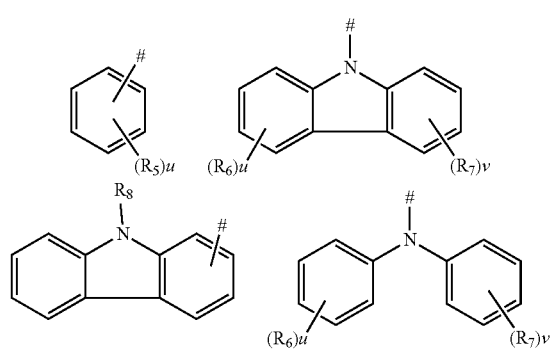

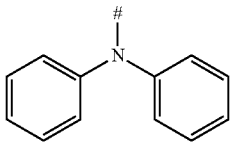

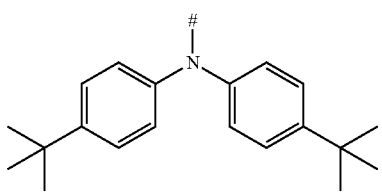

wherein #represents a linking bond.

10. The compound according to claim 1, wherein $Ar_1$ and $Ar_2$ are each independently selected from any one of a C1-C12 alkyl, a C1-C12 alkoxy, a phenyl, a biphenyl, a naphthyl, an anthracenyl, phenanthryl or a pyrenyl.

11. The compound according to claim 1, wherein R is selected from any one of a C1-C12 alkyl, a C1-C12 alkoxy, a phenyl, a biphenyl, a naphthyl, an anthracenyl, phenanthryl or a pyrenyl.

12. The compound according to claim 1, wherein the compound has any one of the following structures represented by P001 to P096:

101  102
P009
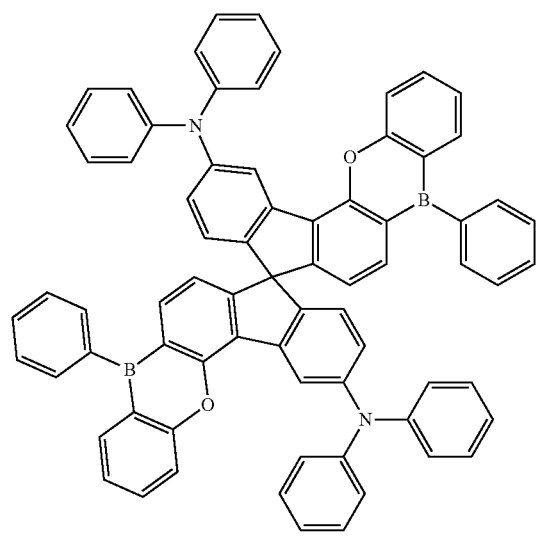
P010
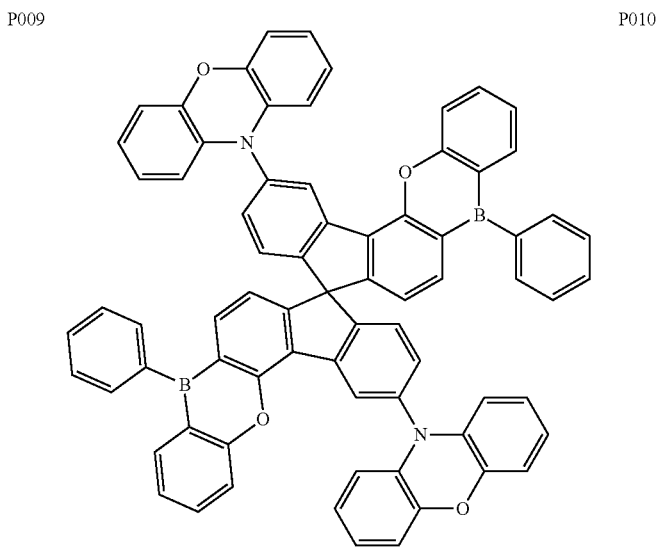
P011
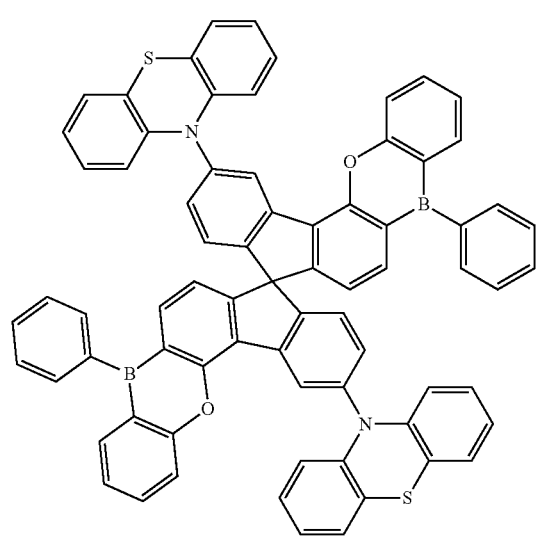
P012
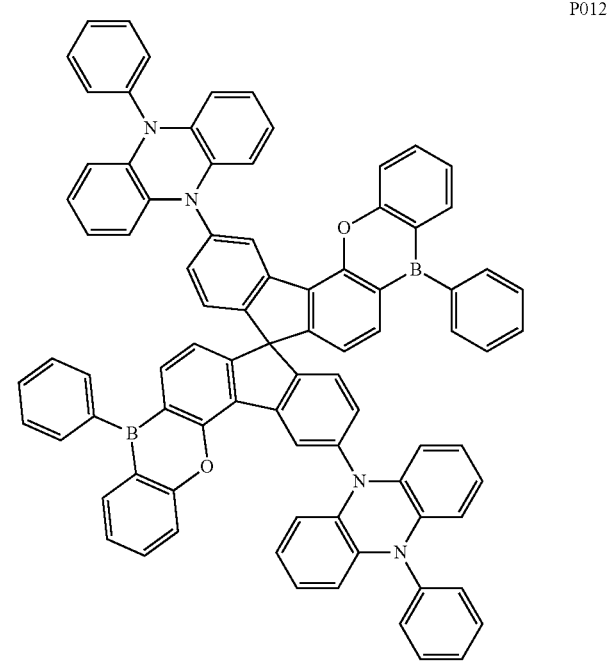

-continued
P013
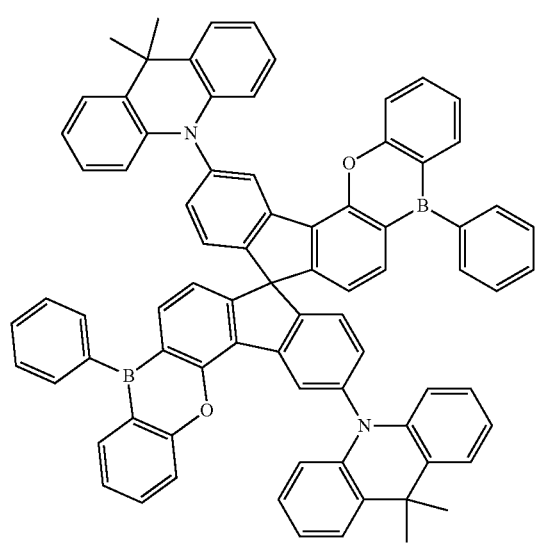
P014
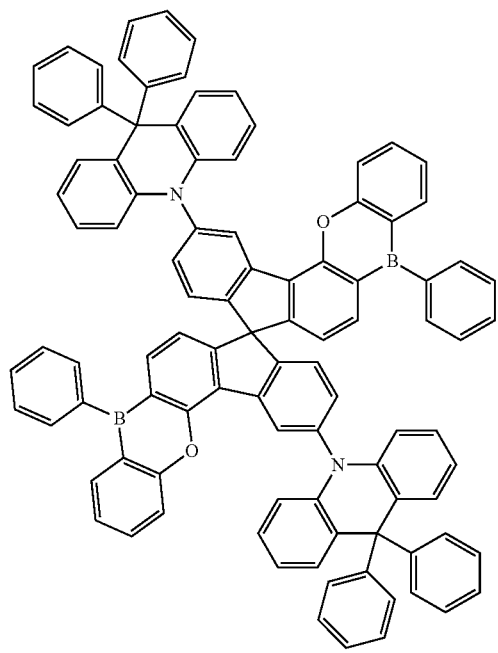
P015
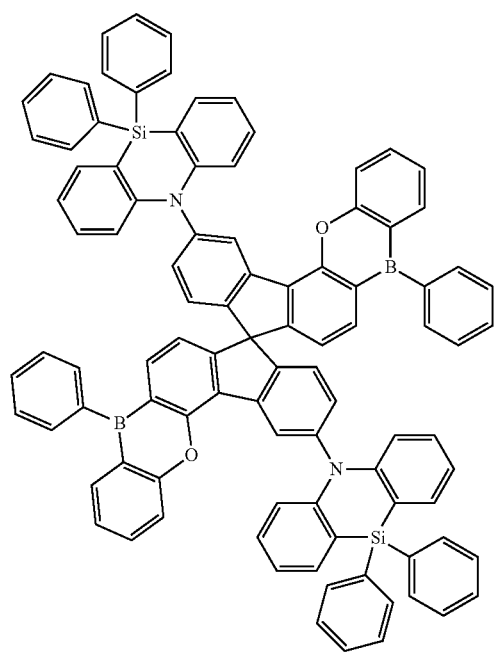
P016
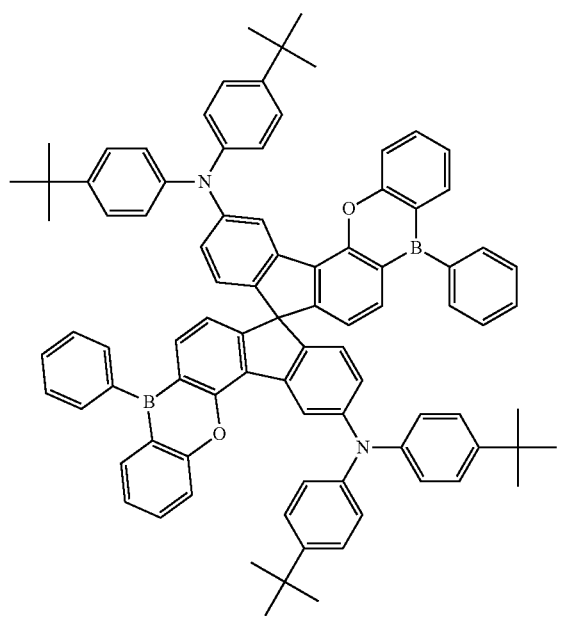

-continued
P001
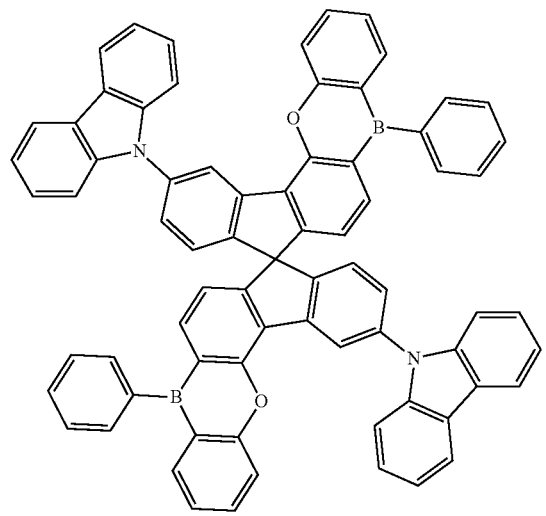
P002
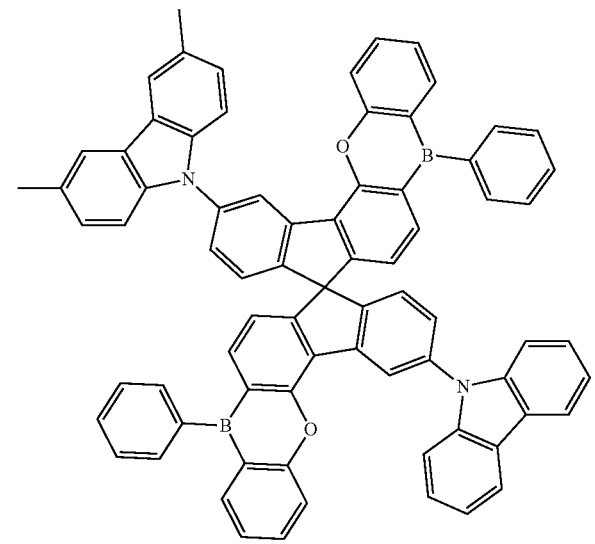
P004
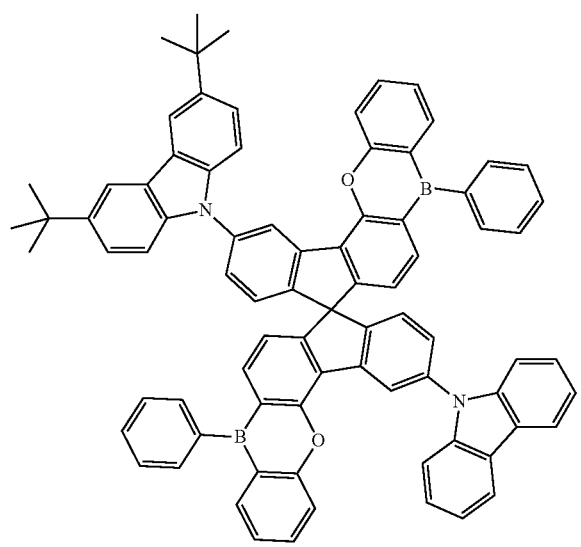
P003
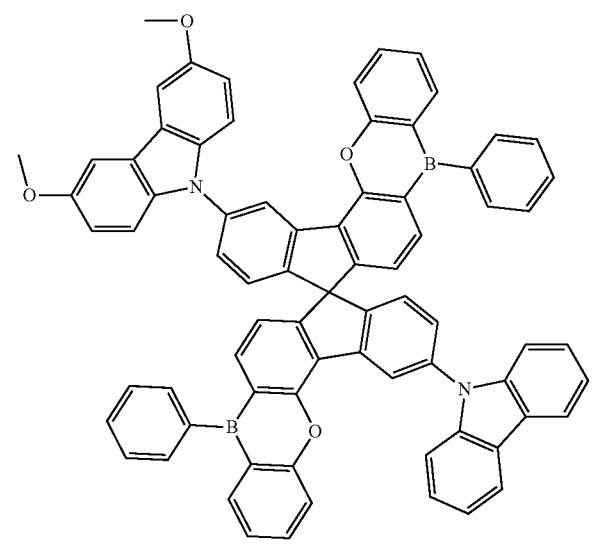
P005
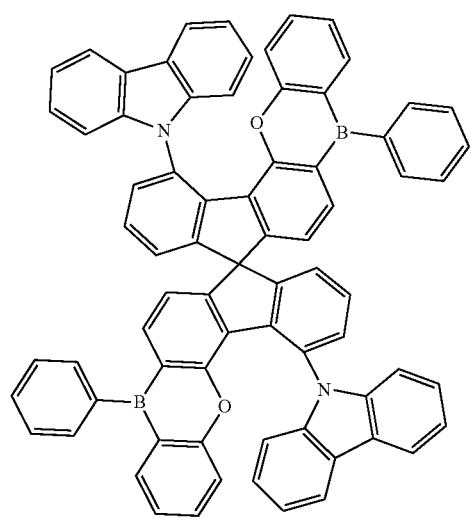
P006
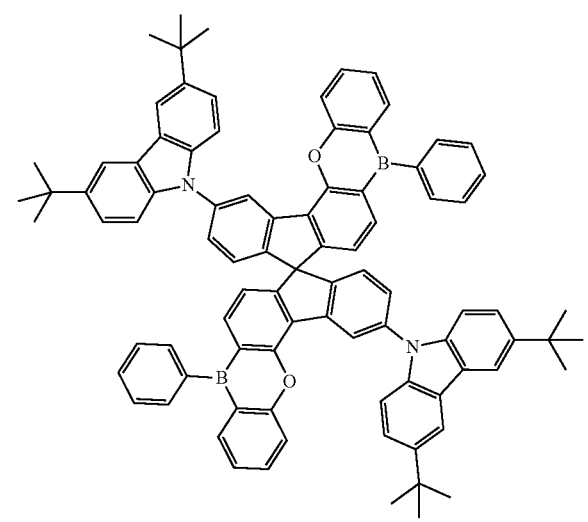

-continued
P007
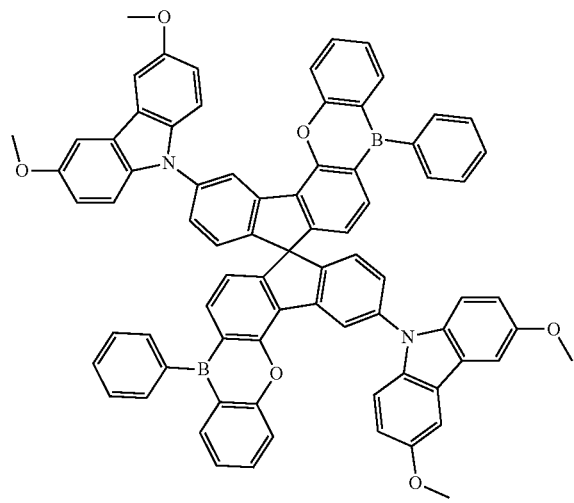
P008
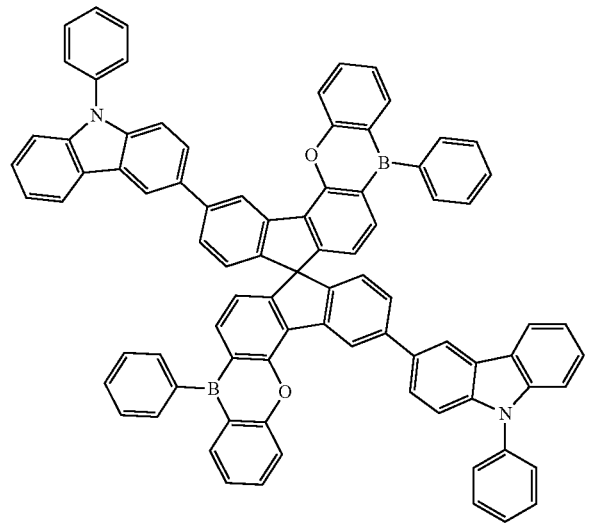
P017
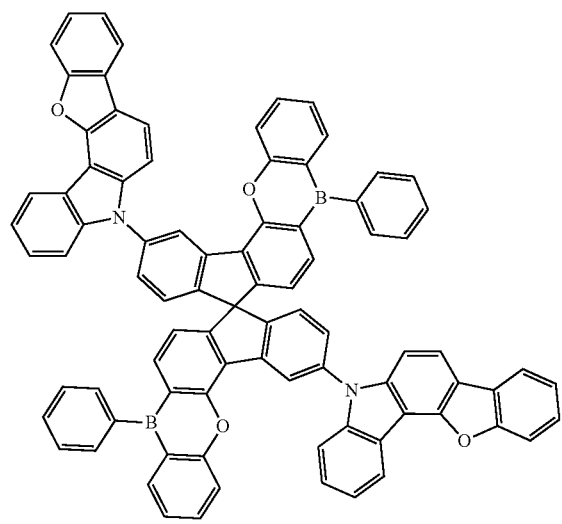
P018
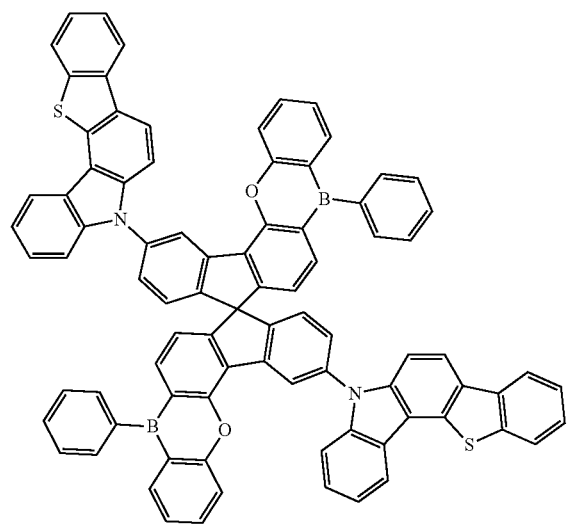
P019
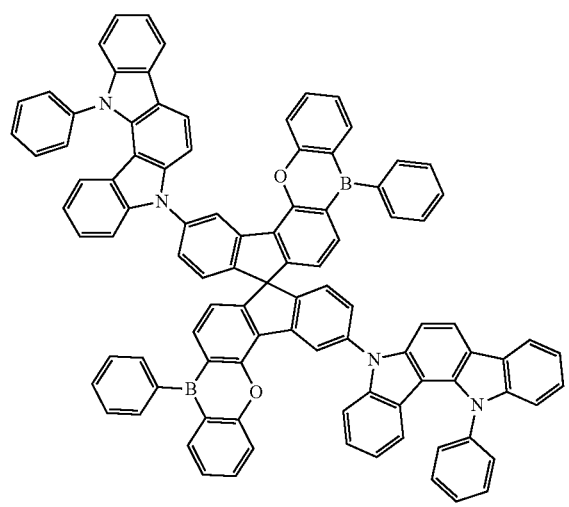
P020
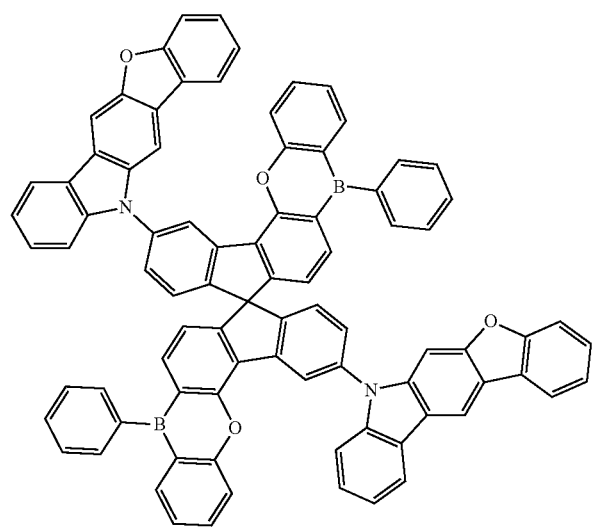

P021
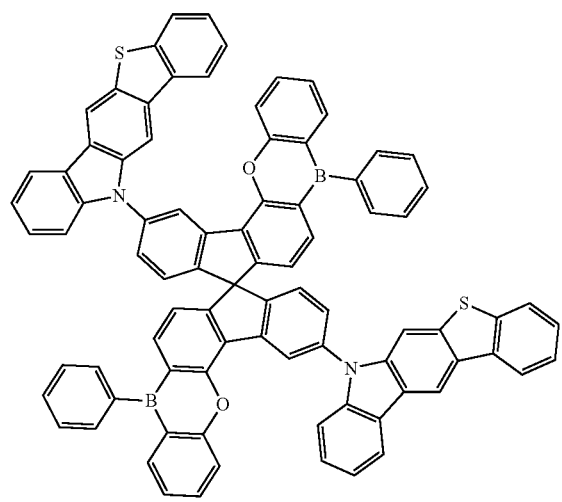
P022
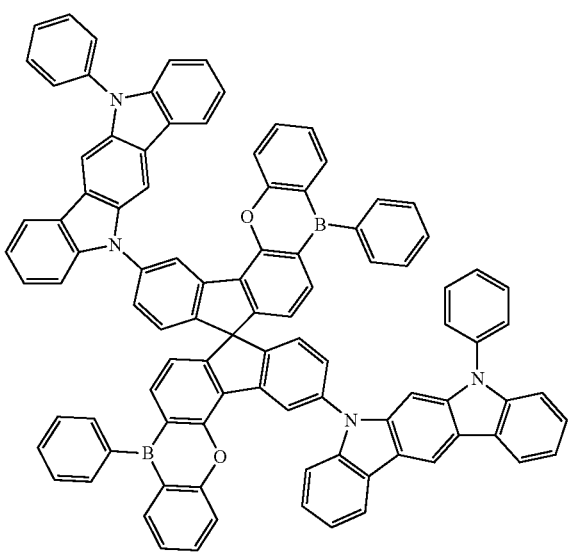
P023
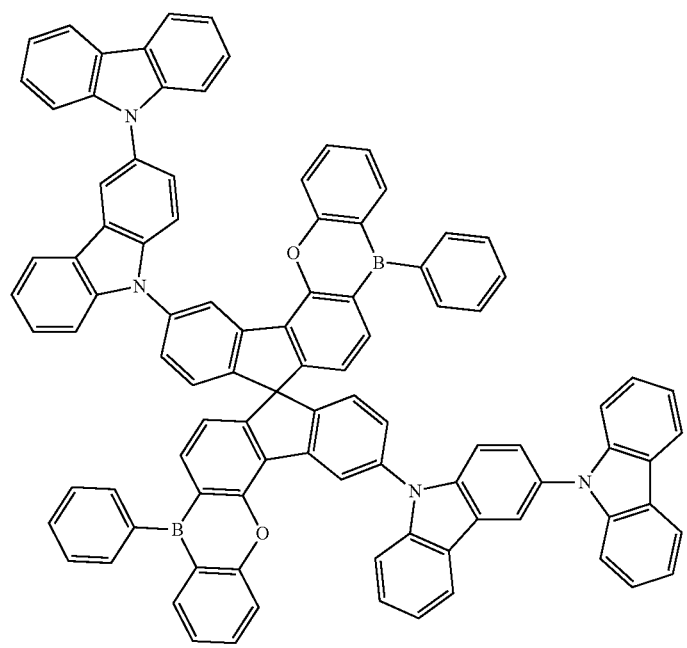

-continued
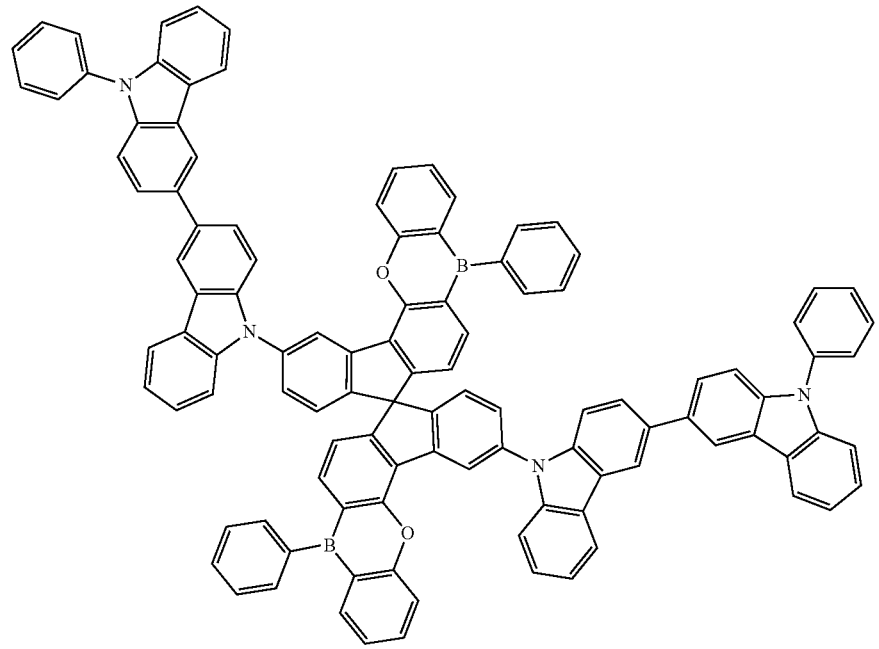
P024
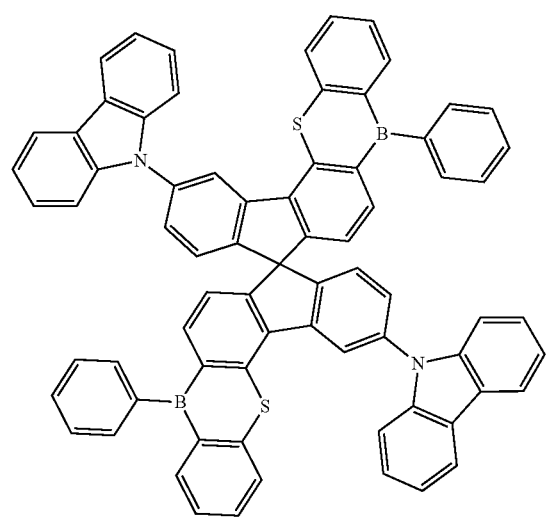
P025
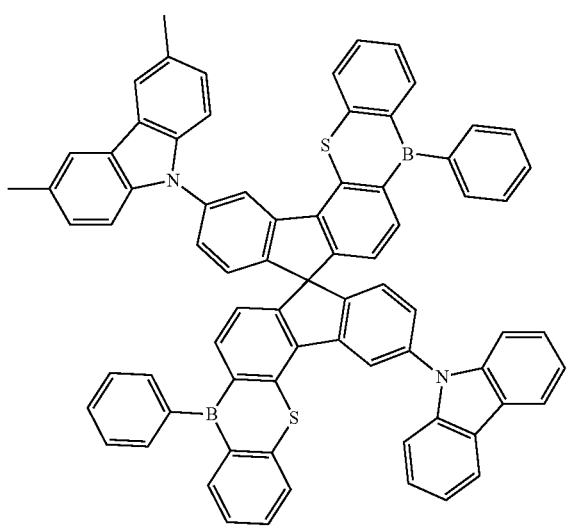
P026

-continued
P027
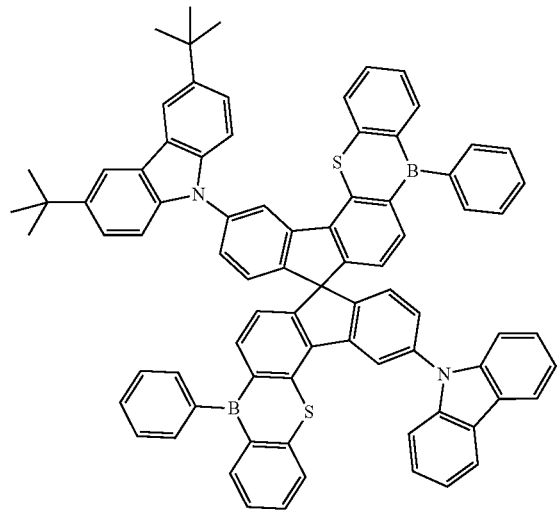
P028
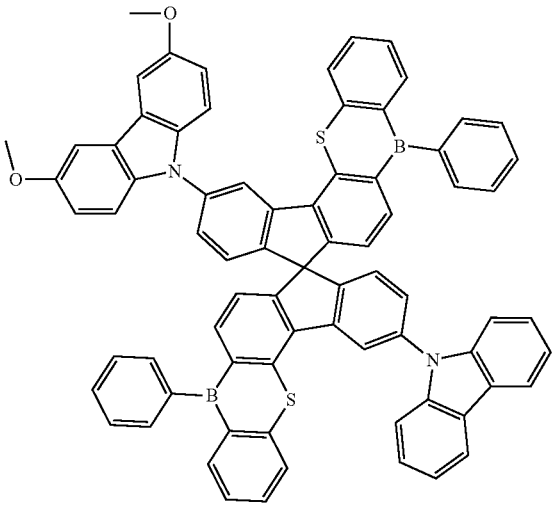
P029
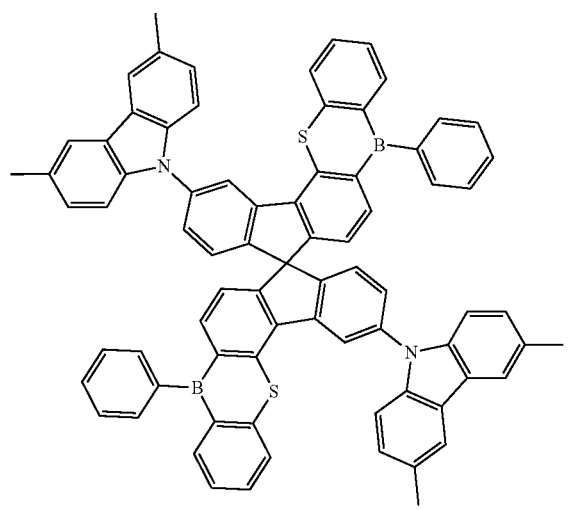
P030
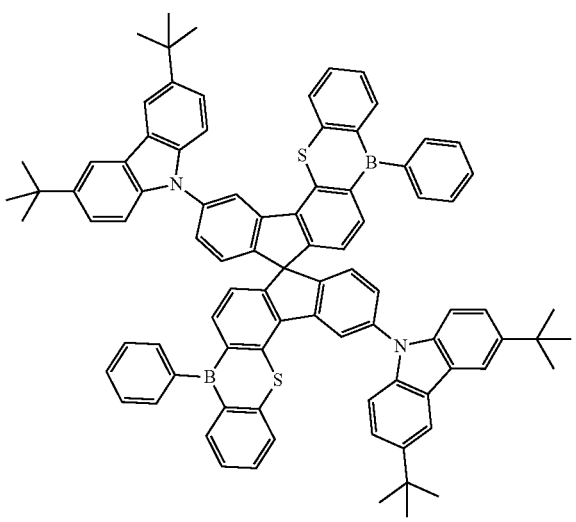
P031
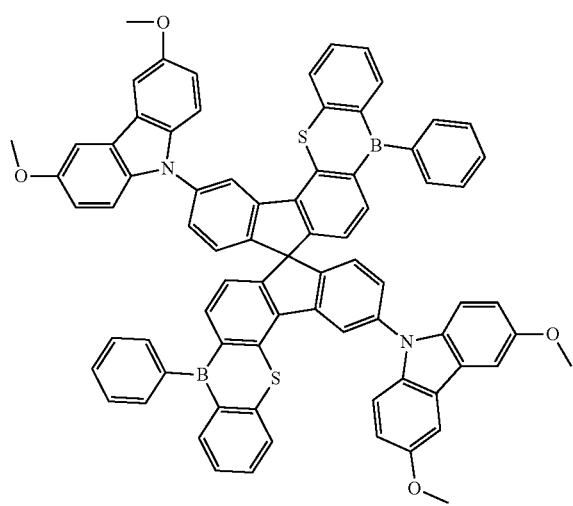
P032
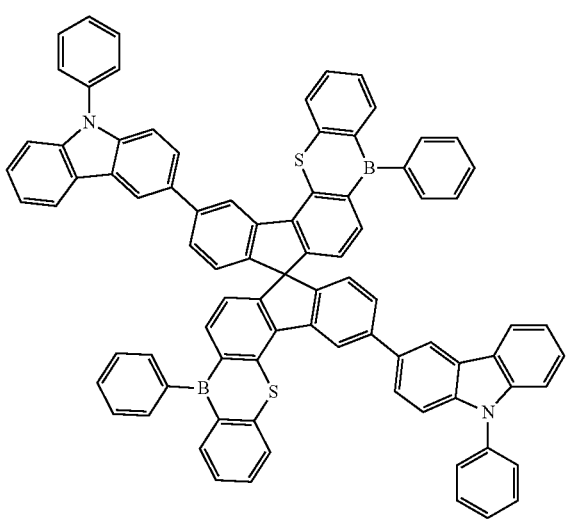

-continued
P033
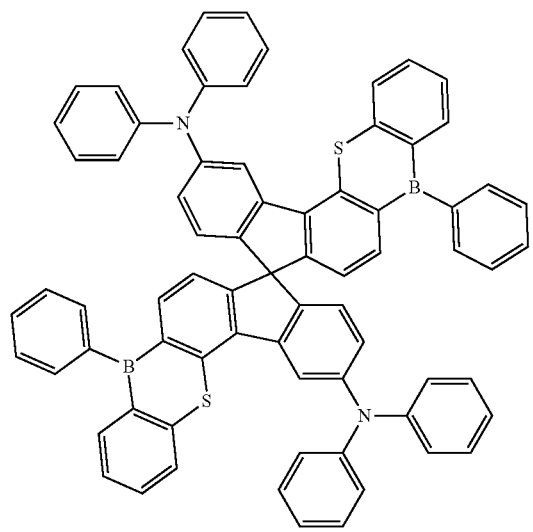
P034
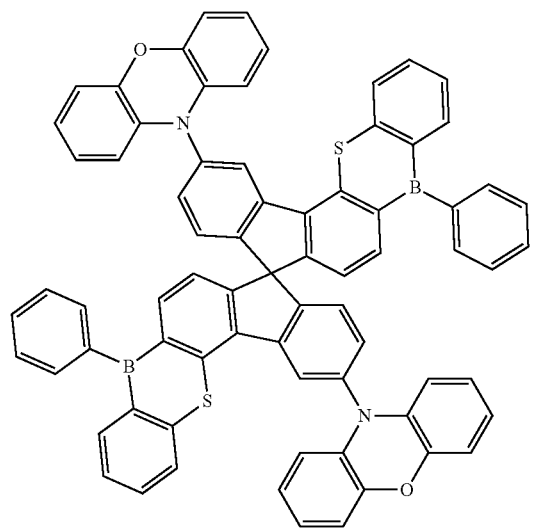
P035
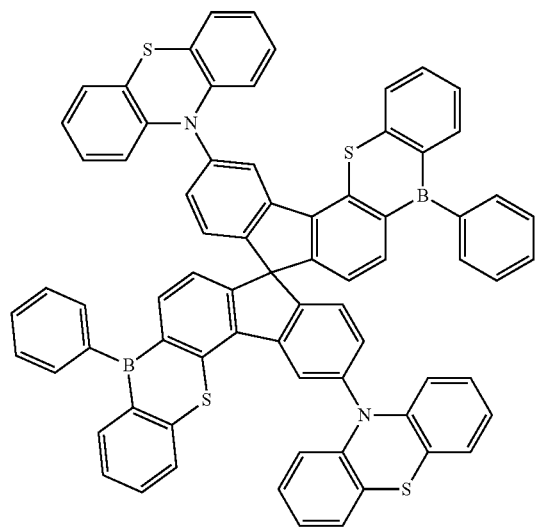
P036
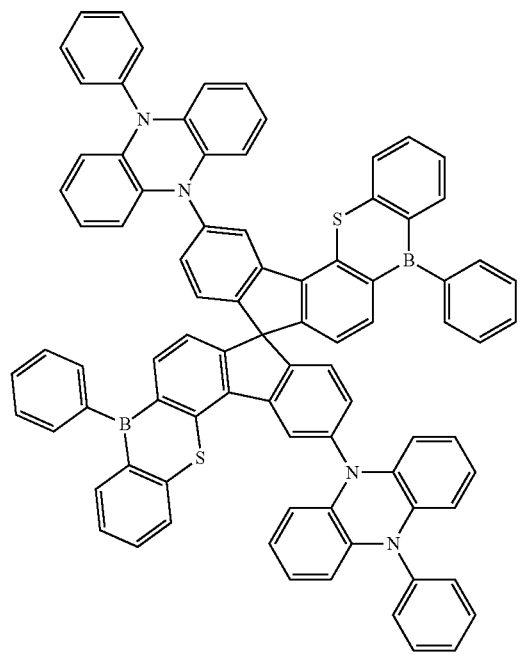

-continued
P037
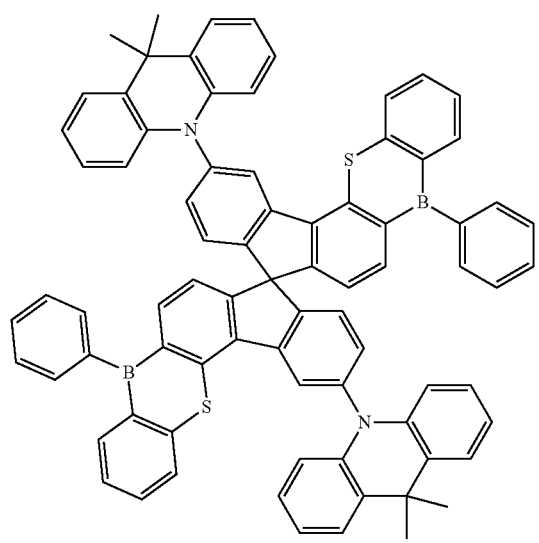
P038
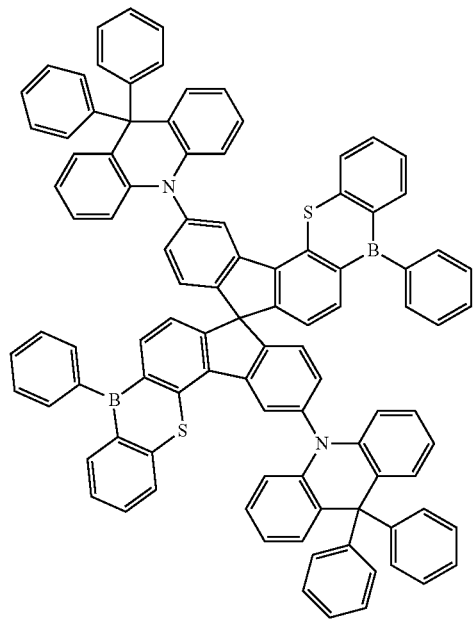
P039
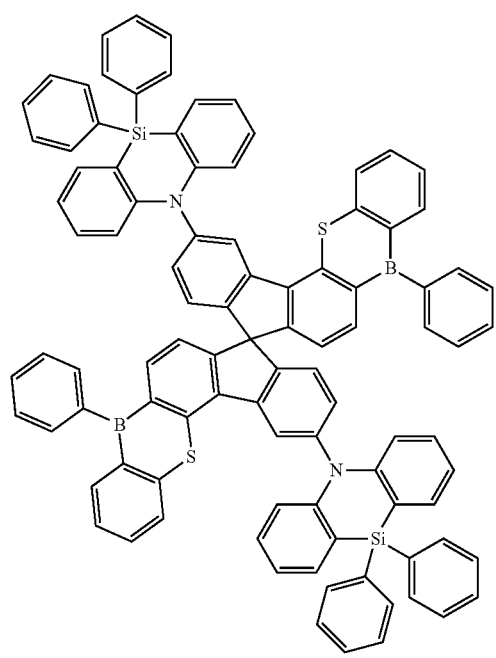
P040
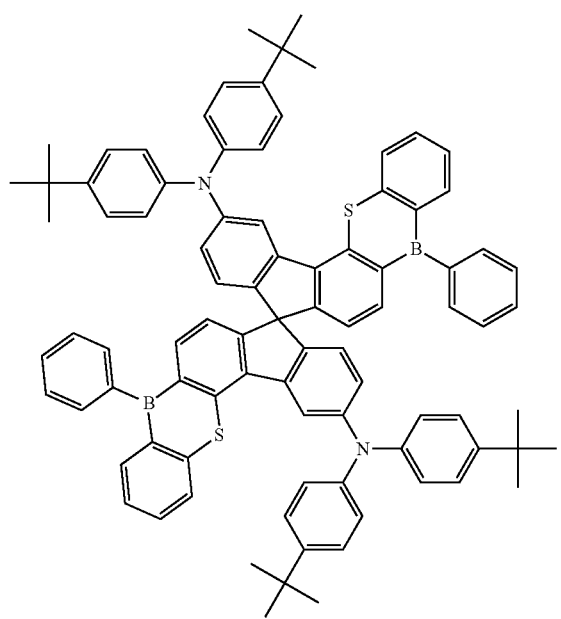

-continued
P041
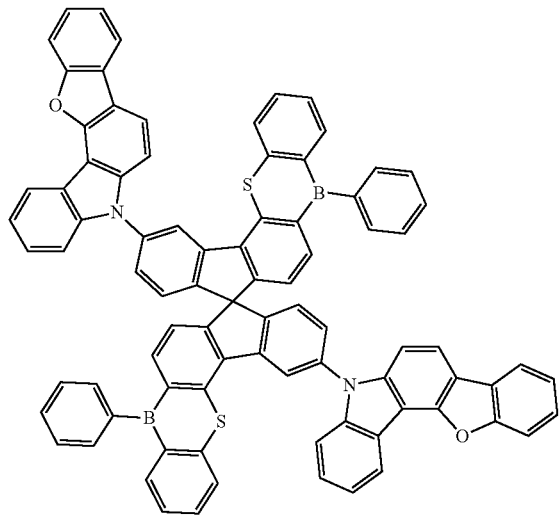
P042
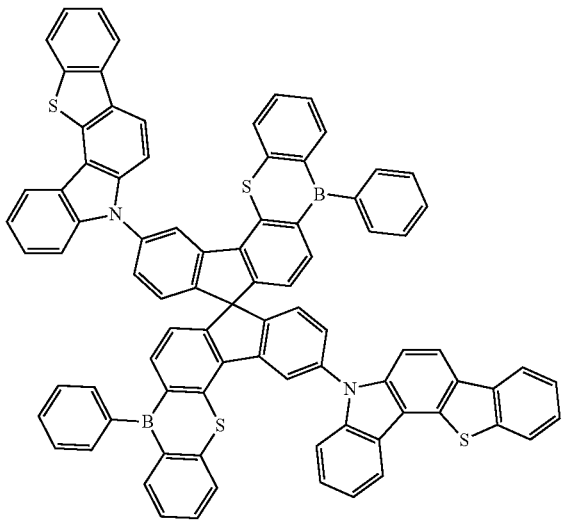
P043
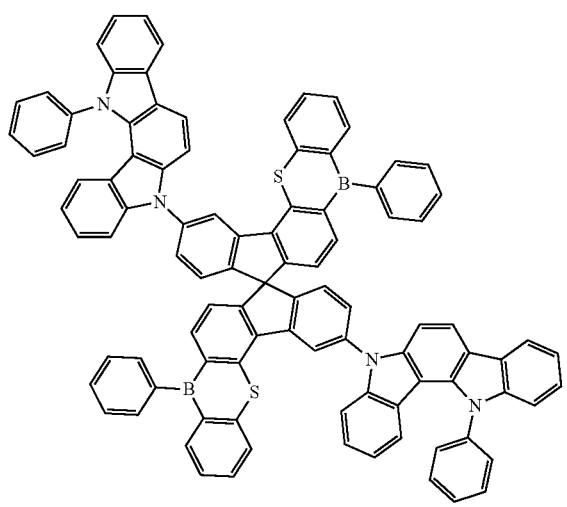
P044
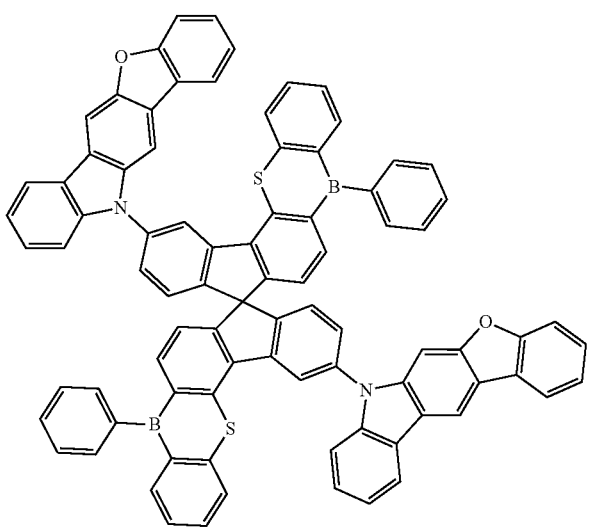
P045
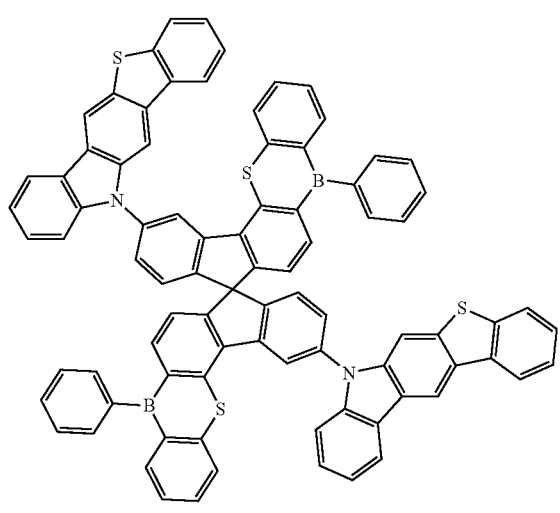
P046
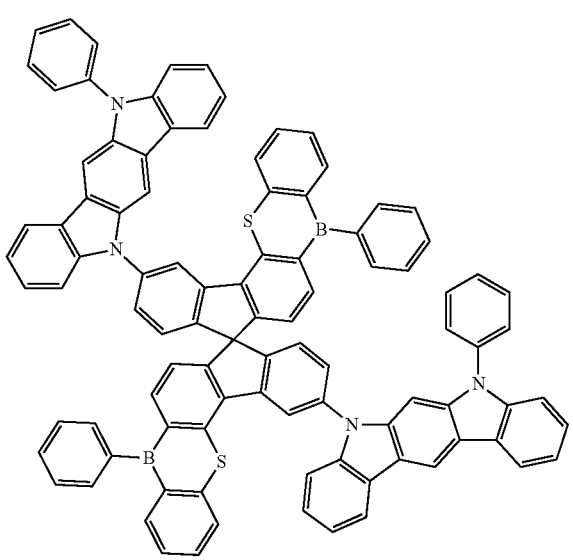

-continued
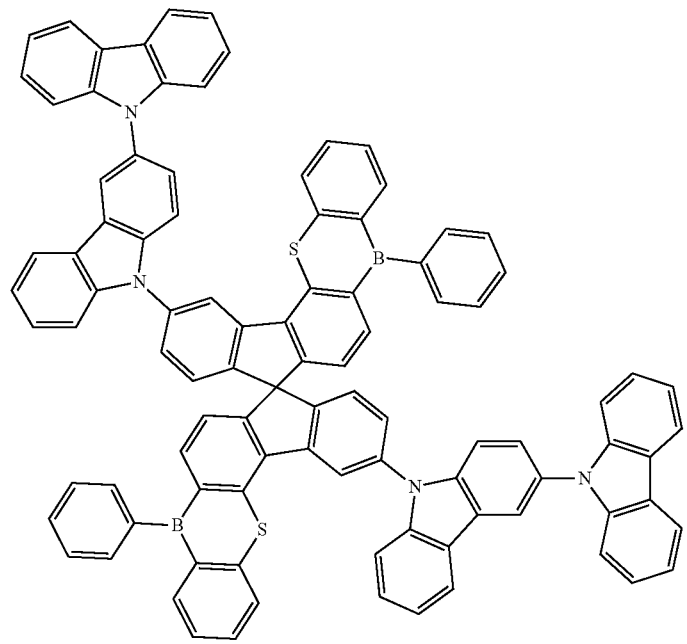
P047
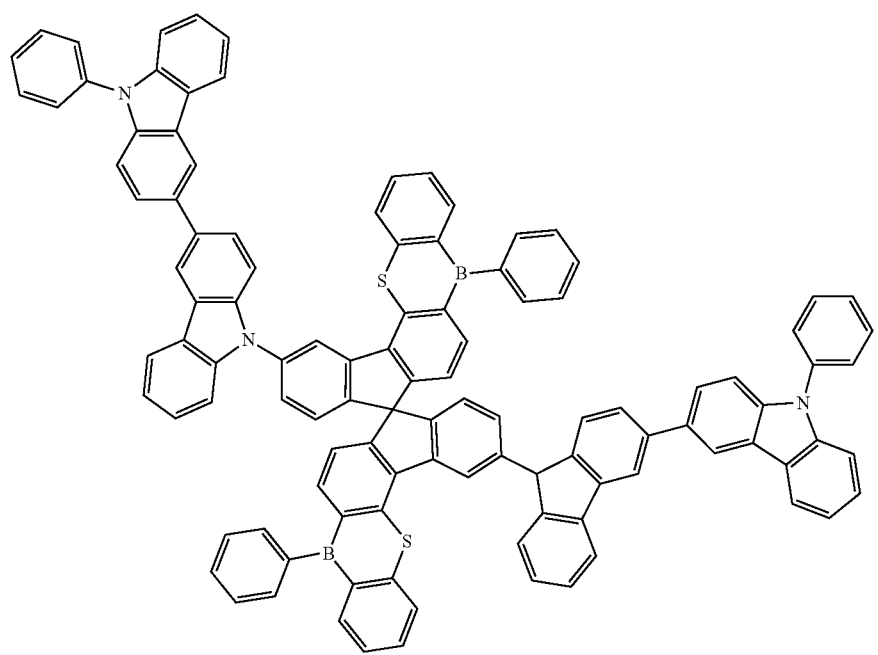
P048

-continued
P049
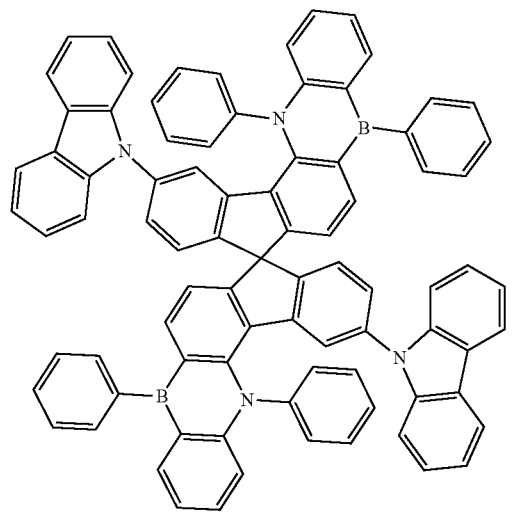
P050
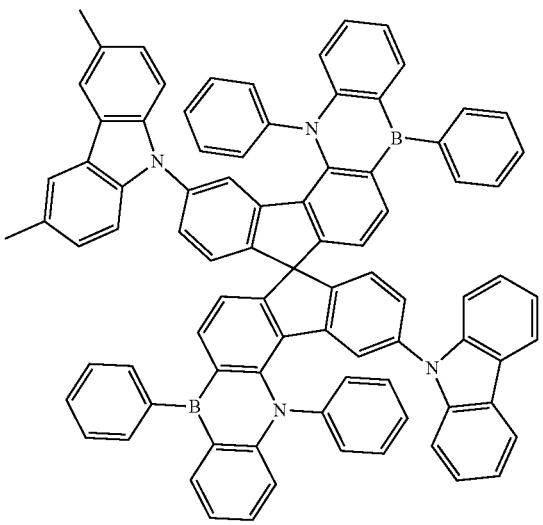
P051
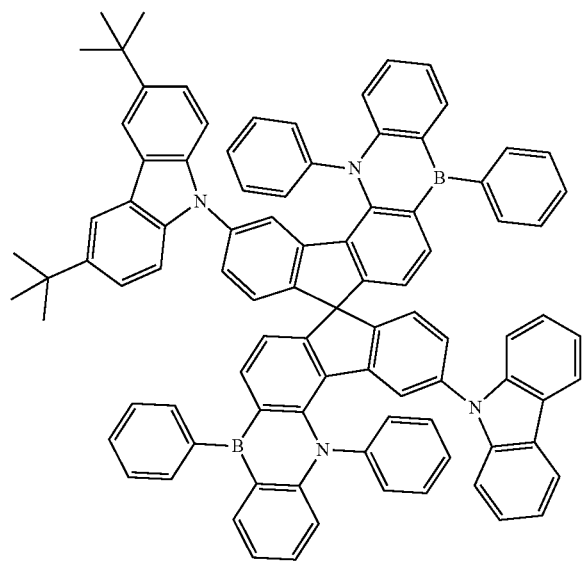
P052
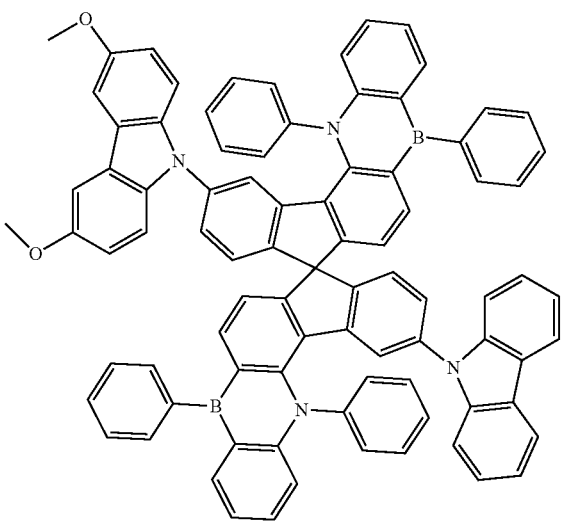
P053
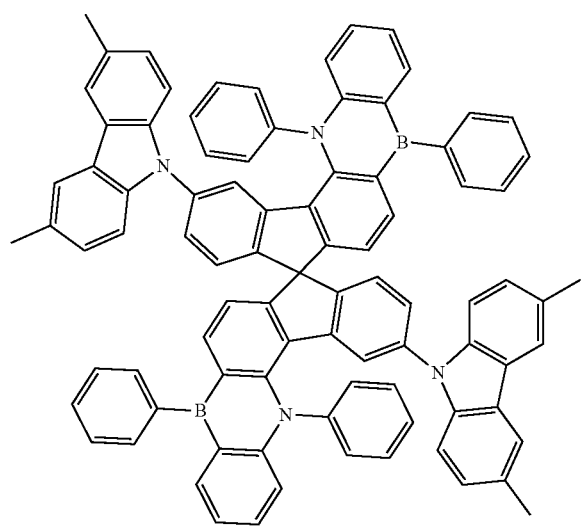
P054
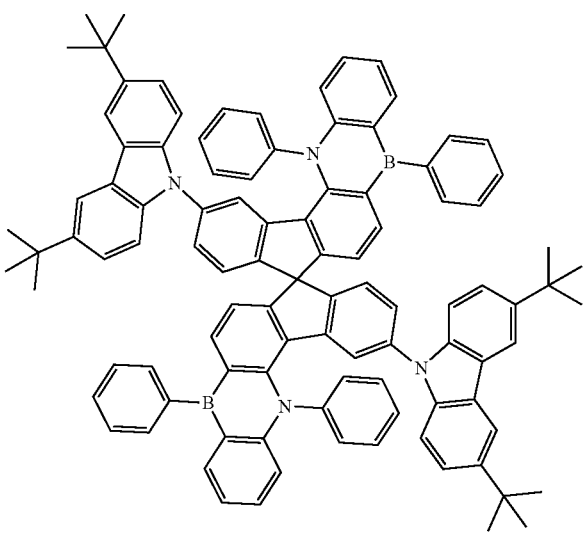

-continued
P055
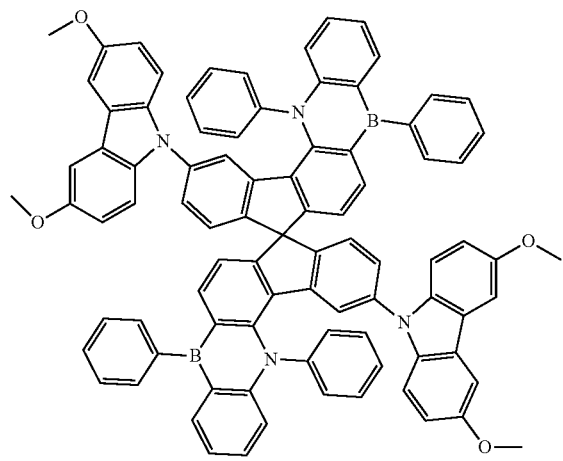
P056
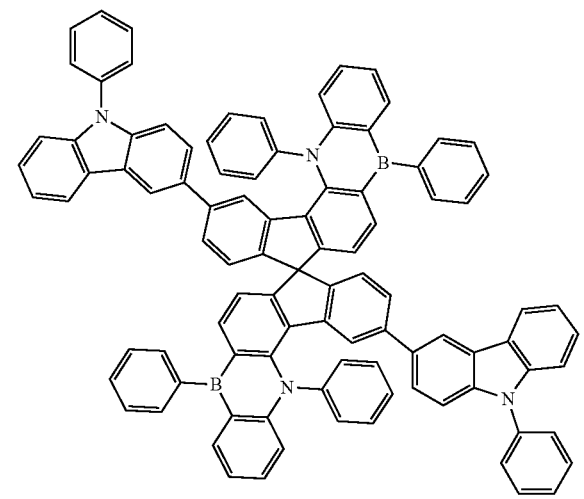
P057
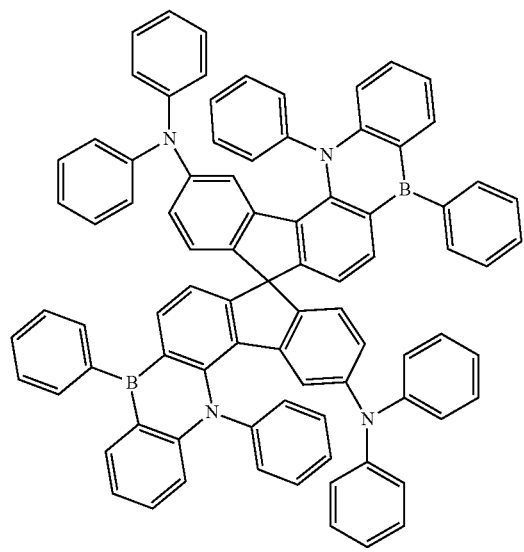
P058
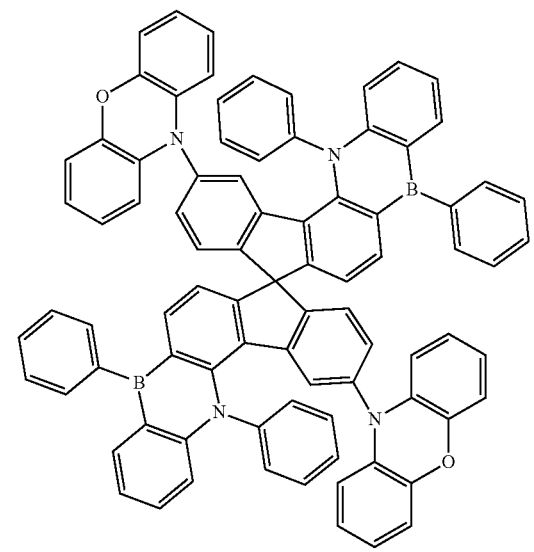
P059
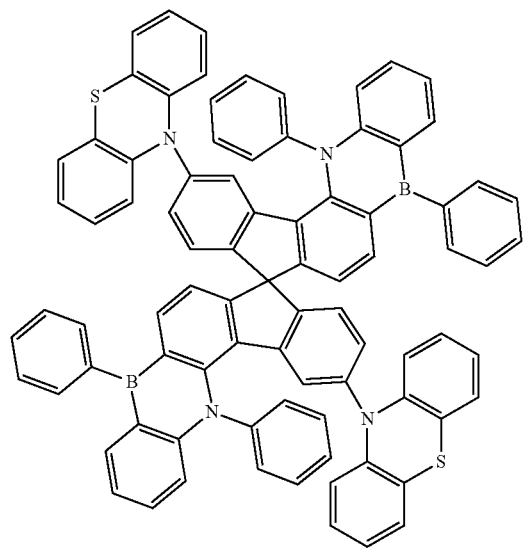
P060
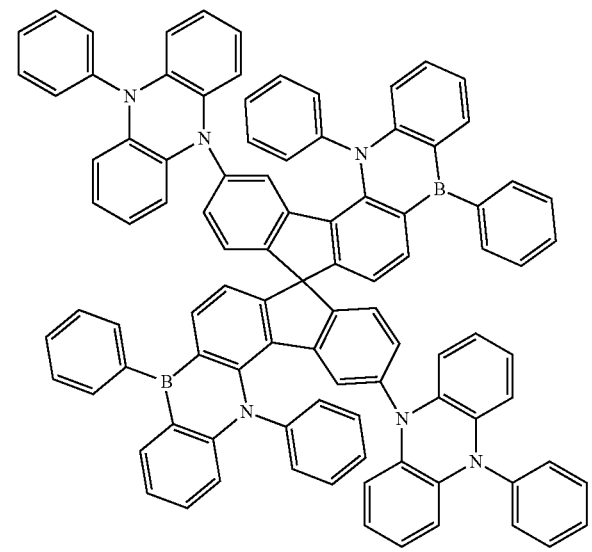

-continued
P061
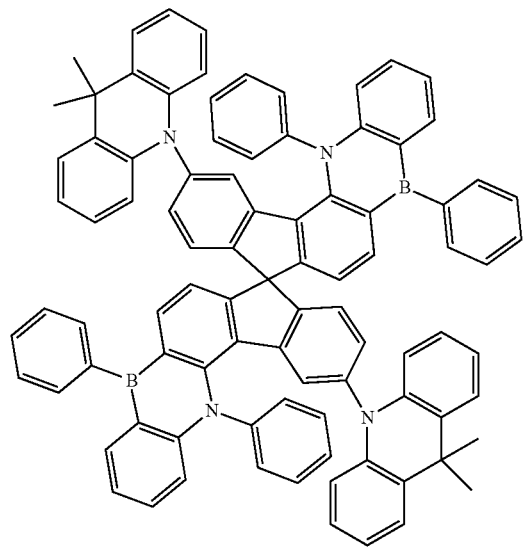
P062
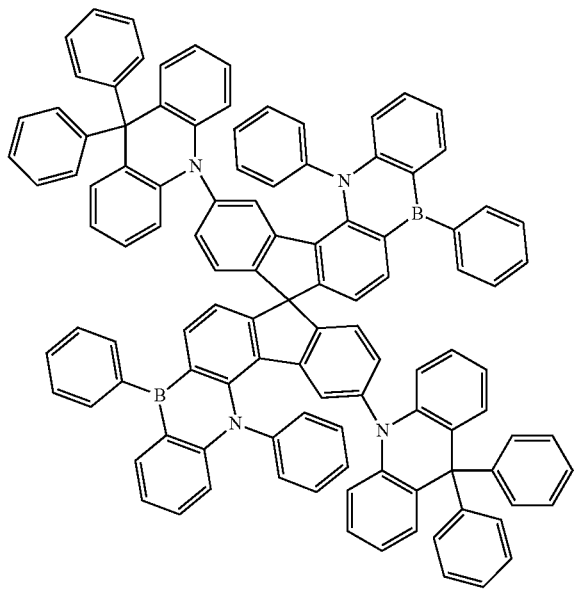
P063
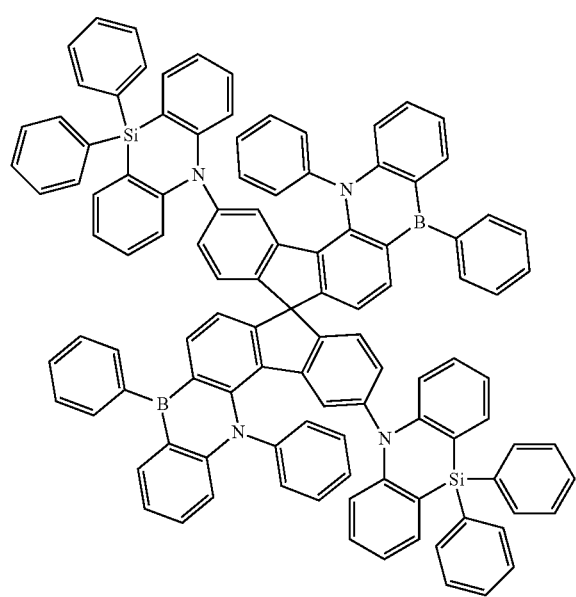

-continued
P064
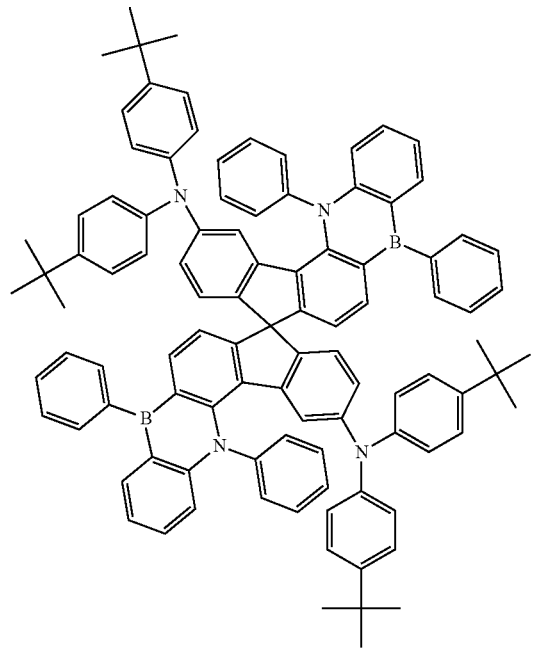
P065
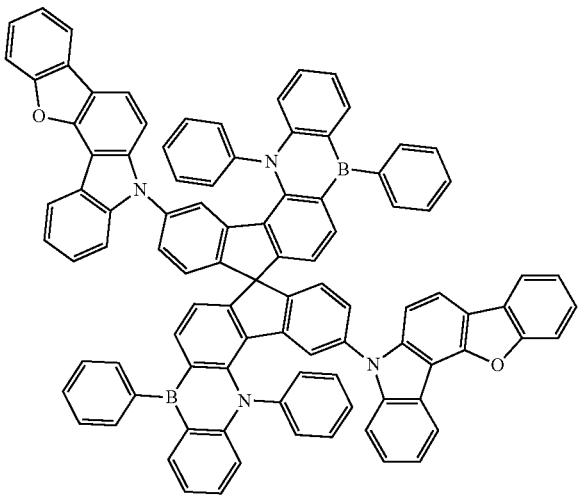
P066
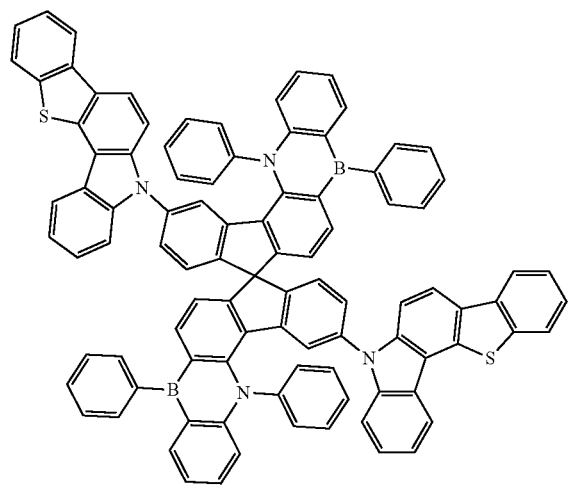
P067
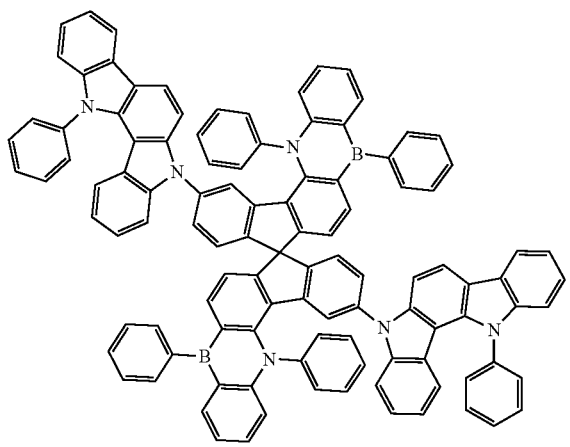

P068
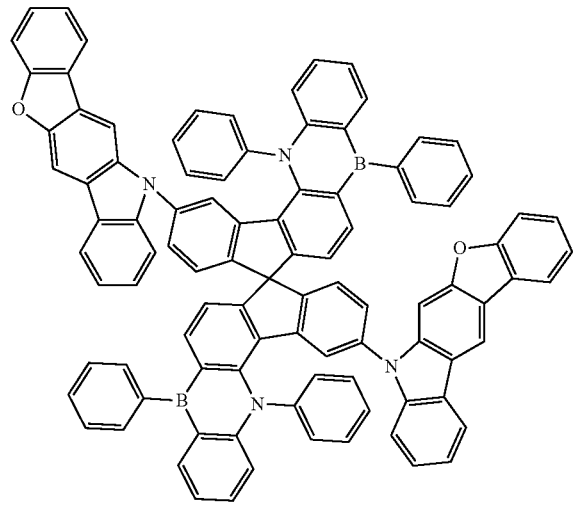
P069
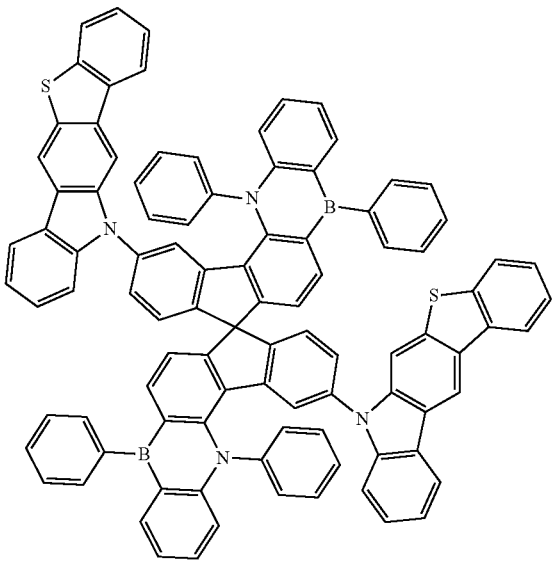
P070
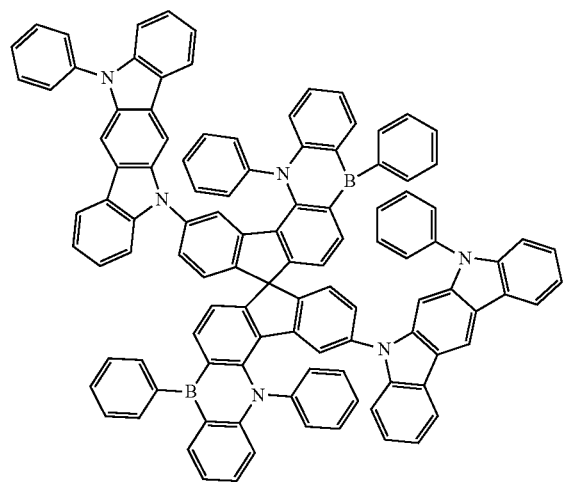
P071
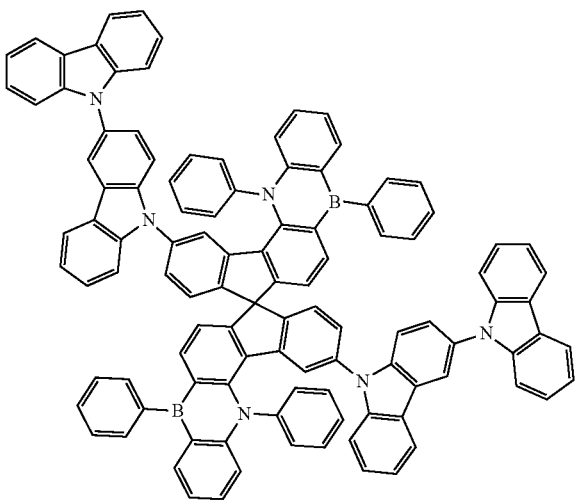

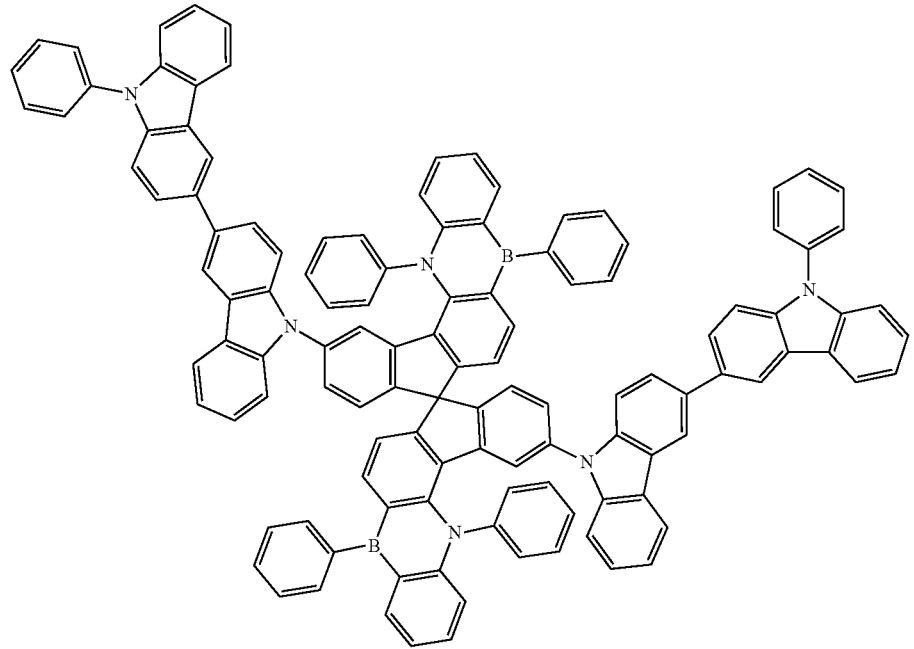
P072
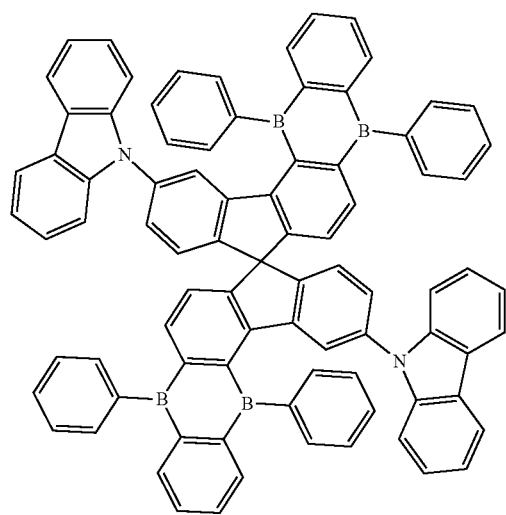
P073
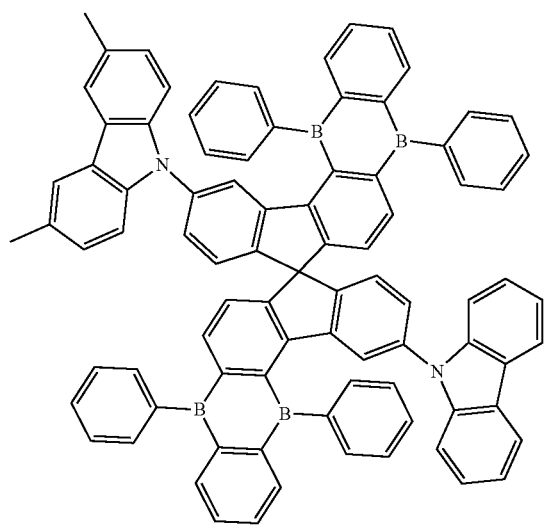
P074

-continued
P075
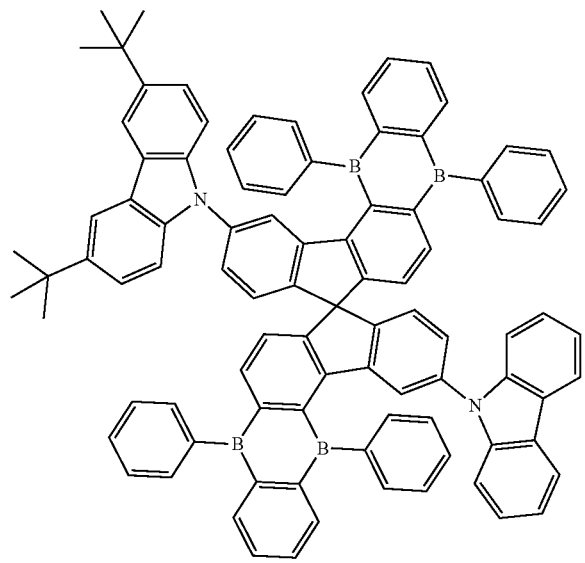
P076
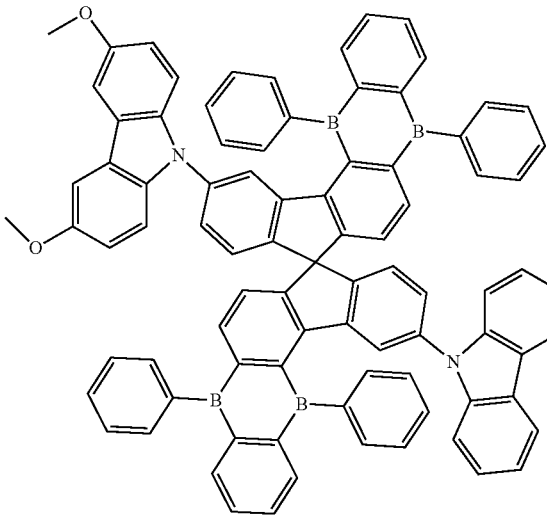
P077
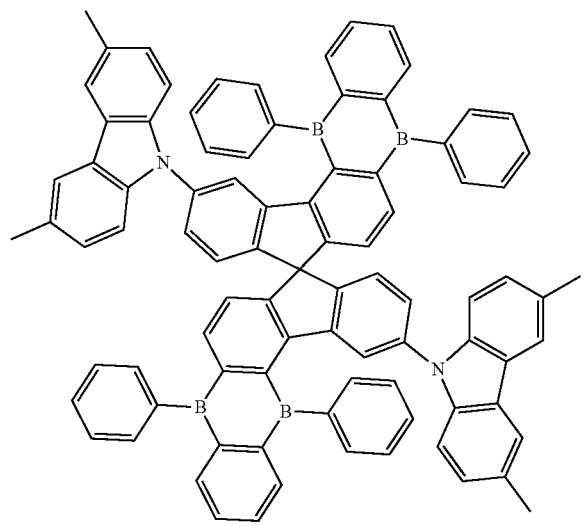
P078
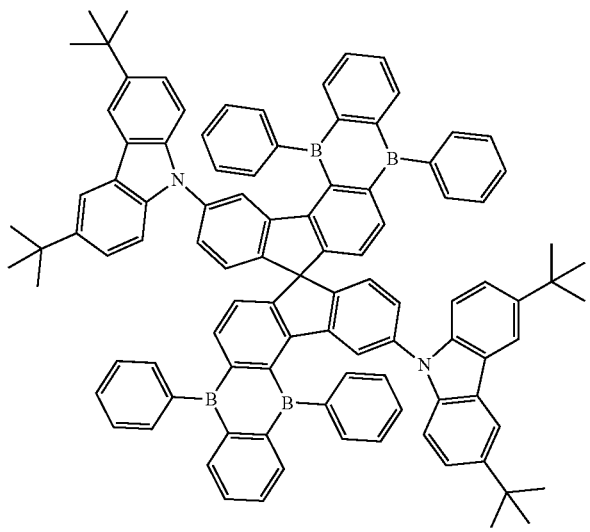
P079
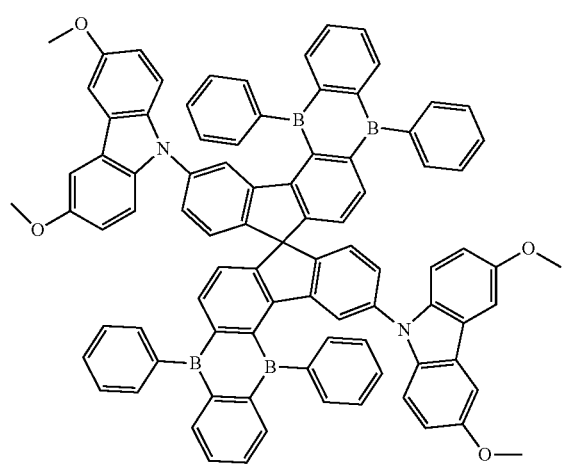
P080
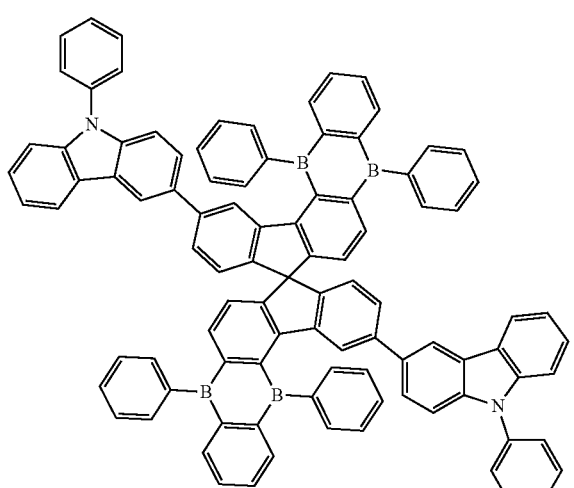

-continued
P081
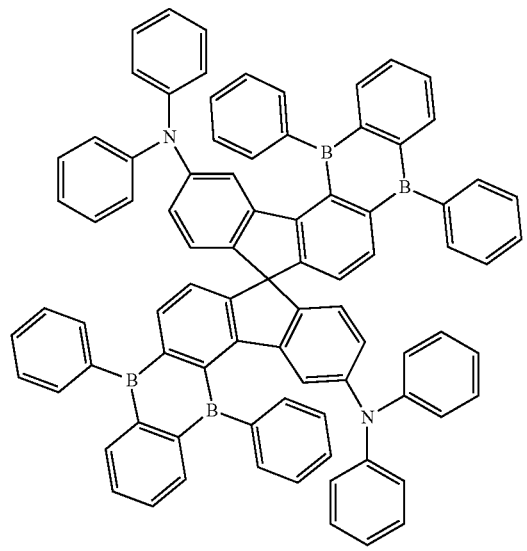
P082
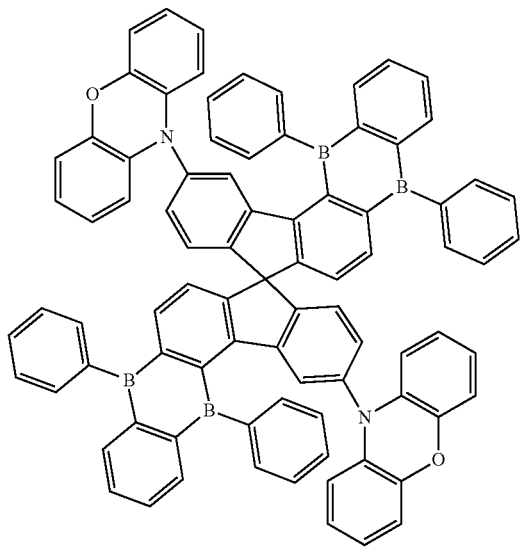
P083
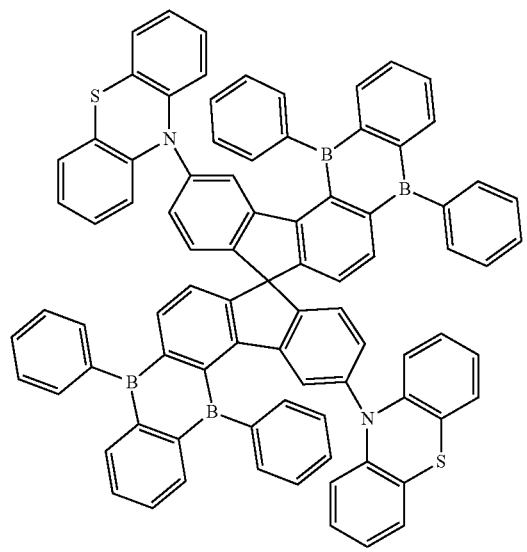
P084
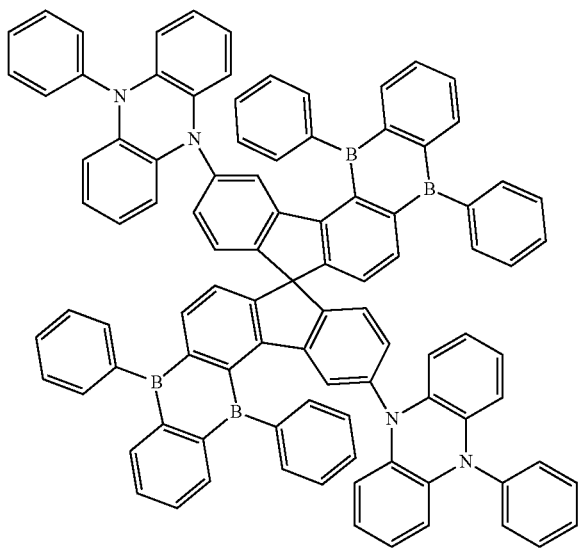

-continued
P085
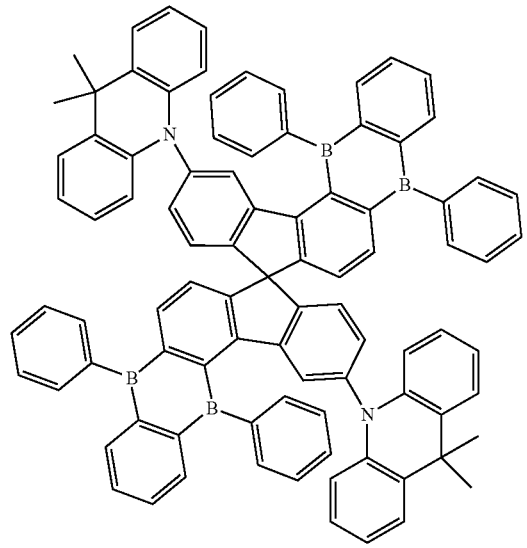
P086
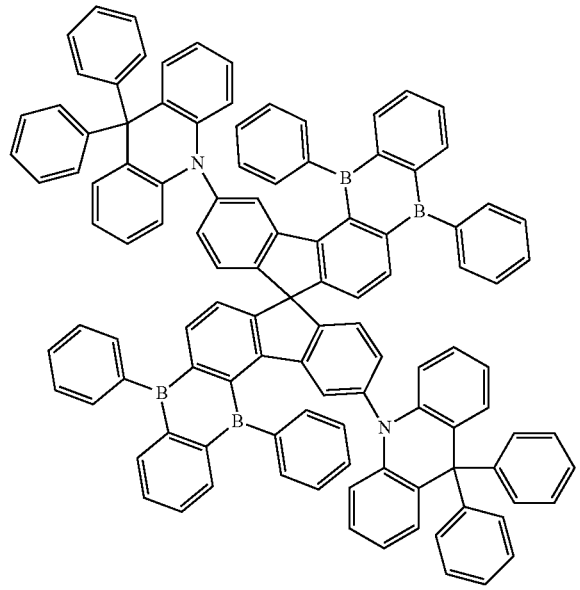
P087
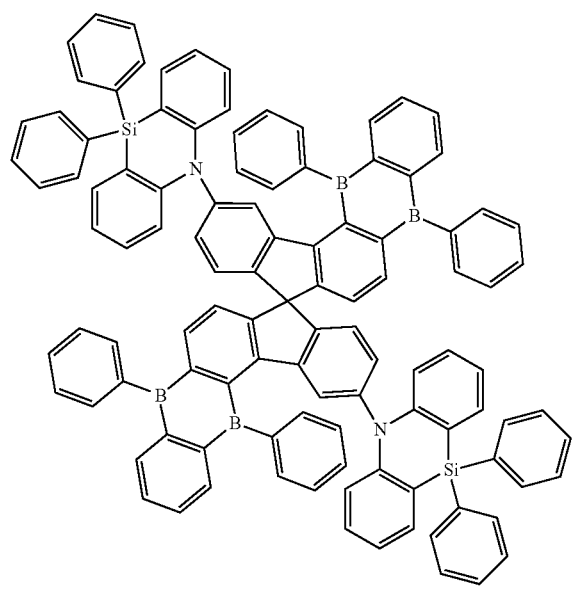
P088
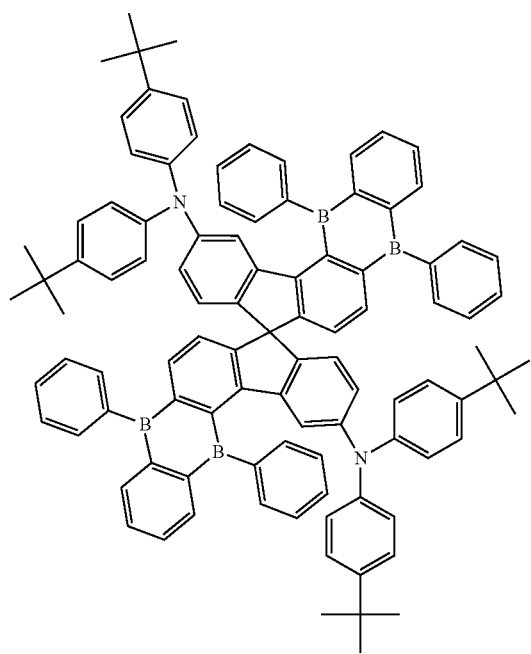

-continued
P089
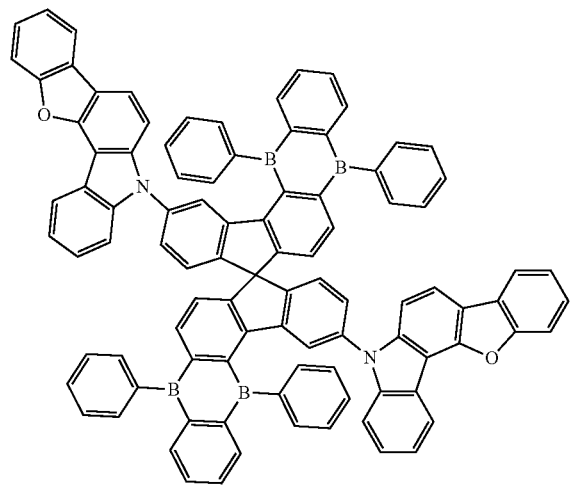
P090
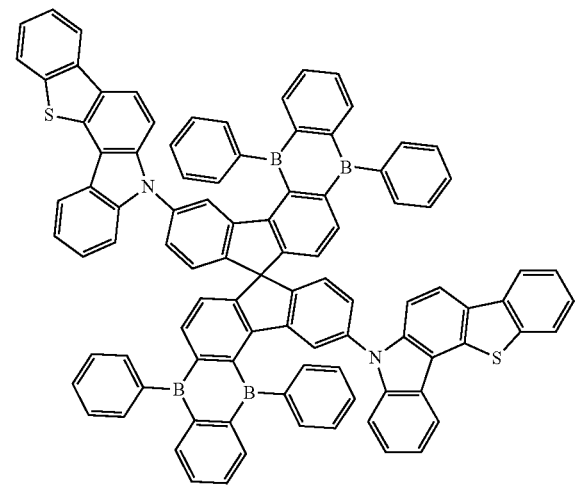
P091
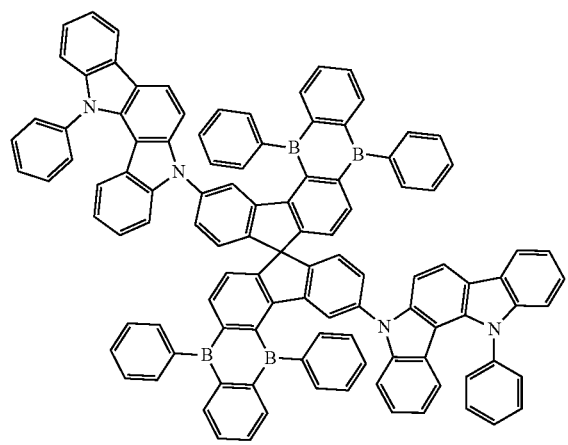
P092
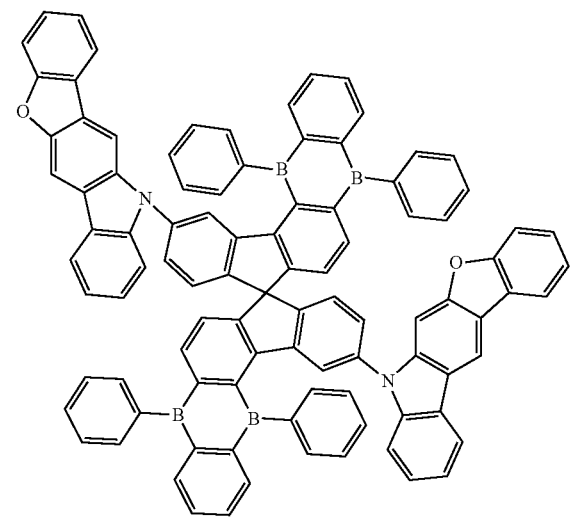
P093
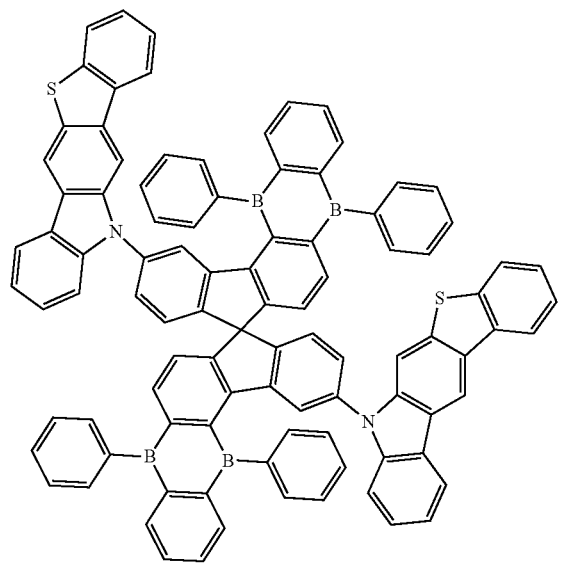
P094
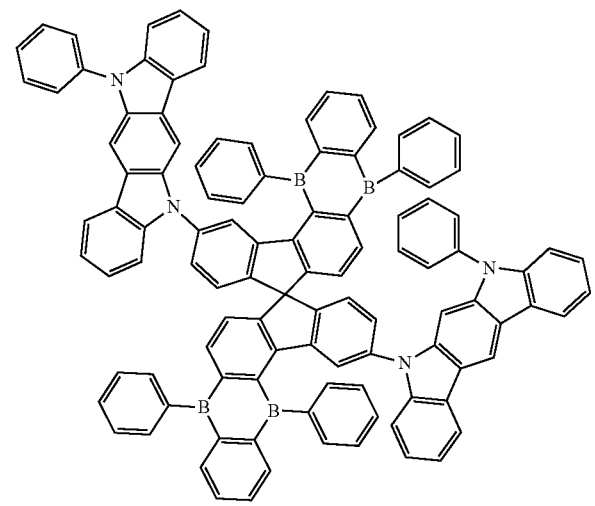

-continued

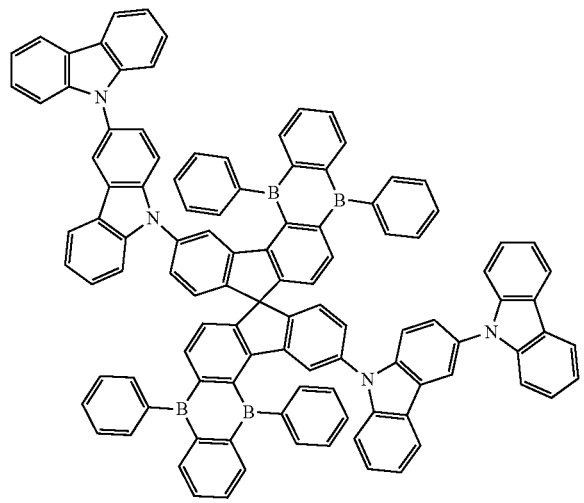

P095

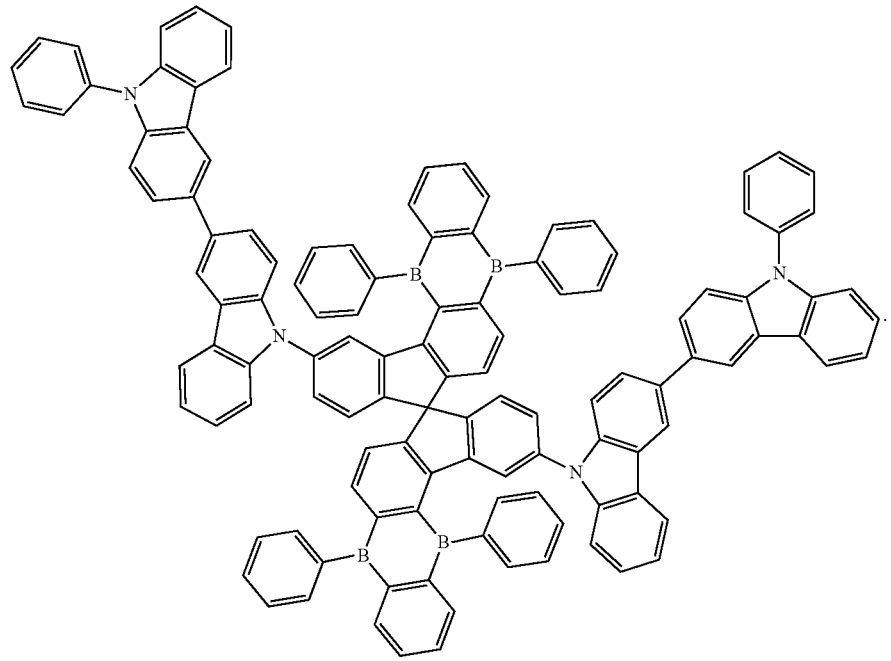

P096

13. A display panel, comprising an organic light emitting diode (OLED) device, wherein the OLED device comprises an anode, a cathode and an organic thin film layer disposed between the anode and the cathode, wherein the organic thin film layer comprises a light-emitting layer;
wherein the light-emitting layer comprises the compound of claim 1.

14. A display panel comprising an organic light emitting diode (OLED) device, wherein the OLED device comprises an anode, a cathode and an organic thin film layer disposed between the anode and the cathode, wherein the organic thin file layer comprises a light-emitting layer; and wherein the light emitting layer comprises the compound of claim 2.

15. A display panel comprising an organic light emitting diode (OLED) device, wherein the OLED device comprises an anode, a cathode and an organic thin film layer disposed between the anode and the cathode, wherein the organic thin file layer comprises a light-emitting layer; and wherein the light-emitting layer comprises the compound of claim 3.

16. The display panel according to claim 13, wherein the compound of claim 1 is used as any one of a host material, a doped material or a co-doped material of the light-emitting layer.

17. A display device, comprising the display panel of claim 13.

* * * * *